(12) United States Patent
Ishizu et al.

(10) Patent No.: US 11,868,877 B2
(45) Date of Patent: *Jan. 9, 2024

(54) ARITHMETIC DEVICE AND ELECTRONIC DEVICE

(71) Applicant: Semiconductor Energy Laboratory Co., Ltd., Atsugi (JP)

(72) Inventors: Takahiko Ishizu, Sagamihara (JP); Takayuki Ikeda, Atsugi (JP); Atsuo Isobe, Isehara (JP); Atsushi Miyaguchi, Hadano (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/588,613

(22) Filed: Jan. 31, 2022

(65) Prior Publication Data
US 2022/0164641 A1 May 26, 2022

Related U.S. Application Data

(63) Continuation of application No. 16/641,821, filed as application No. PCT/IB2018/056531 on Aug. 28, 2018, now Pat. No. 11,275,993.

(30) Foreign Application Priority Data

Sep. 6, 2017 (JP) ................. 2017-171509
Sep. 6, 2017 (JP) ................. 2017-171511
Sep. 6, 2017 (JP) ................. 2017-171524

(51) Int. Cl.
*G06T 1/20* (2006.01)
*G06F 1/3234* (2019.01)
(Continued)

(52) U.S. Cl.
CPC .......... *G06N 3/065* (2023.01); *G06F 1/3243* (2013.01); *G06F 7/5443* (2013.01); *G06T 1/20* (2013.01)

(58) Field of Classification Search
CPC . G06T 1/20; G06G 7/60; G06N 3/065; H10B 12/00; Y02D 10/00; G06F 1/3243; G06F 1/3287; G06F 7/5443
(Continued)

(56) References Cited

U.S. PATENT DOCUMENTS 5,726,934 A * 3/1998 Tran .................... G11C 27/005
365/45
8,786,130 B1 7/2014 Mori et al.
(Continued)

FOREIGN PATENT DOCUMENTS

CN 104346164 A 2/2015
CN 105988400 A 10/2016
(Continued)

OTHER PUBLICATIONS

International Search Report (Application No. PCT/IB2018/056531) dated Dec. 4, 2018.
(Continued)

*Primary Examiner* — Jacinta M Crawford
(74) *Attorney, Agent, or Firm* — ROBINSON INTELLECTUAL PROPERTY LAW OFFICE; Eric J. Robinson

(57) ABSTRACT

An arithmetic device and an electronic device having small power consumption is provided. An arithmetic device and an electronic device capable of high-speed operation is provided. An arithmetic device and an electronic device capable of suppressing heat generation is provided. The arithmetic device includes a first arithmetic portion and a second arithmetic portion. The first arithmetic portion includes a
(Continued)

first CPU core and a second CPU core. The second arithmetic portion includes a first GPU core and a second GPU core. The CPU cores each have a power gating function and each include a first data retention circuit electrically connected to a flip-flop. The first GPU core includes a second data retention circuit capable of retaining an analog value and reading out the analog value as digital data of two or more bits. The second GPU core includes a third data retention circuit capable of retaining a digital value and reading out the digital value as digital data of one bit. The first to third data retention circuits each include a transistor including an oxide semiconductor and a capacitor.

10 Claims, 32 Drawing Sheets

(51) Int. Cl.
  *G06N 3/065* (2023.01)
  *G06F 7/544* (2006.01)
(58) Field of Classification Search
  USPC .................................................. 345/501, 503
  See application file for complete search history.

(56) References Cited

U.S. PATENT DOCUMENTS

| | | |
|---|---|---|
| 8,788,866 B2 | 7/2014 | Anderson et al. |
| 9,443,564 B2 | 9/2016 | Ishizu et al. |
| 10,090,023 B2 | 10/2018 | Ohmaru et al. |
| 10,177,767 B2 | 1/2019 | Kozuma |
| 10,571,993 B2 | 2/2020 | Yamazaki et al. |
| 2011/0252200 A1 | 10/2011 | Hendry et al. |
| 2013/0166815 A1 | 6/2013 | Sarin et al. |
| 2014/0304474 A1 | 10/2014 | Reinhardt et al. |
| 2015/0046729 A1 | 2/2015 | Fukuoka et al. |
| 2015/0070962 A1 | 3/2015 | Ohmaru et al. |
| 2015/0370313 A1 | 12/2015 | Tamura |
| 2016/0006433 A1 | 1/2016 | Ishizu et al. |
| 2016/0054782 A1 | 2/2016 | Kaburlasos et al. |
| 2016/0226490 A1 | 8/2016 | Kozuma et al. |
| 2017/0053764 A1 | 2/2017 | Mori et al. |
| 2017/0068309 A1* | 3/2017 | Toosizadeh ........... G06F 1/3296 |
| 2018/0122605 A1 | 5/2018 | Mori et al. |

FOREIGN PATENT DOCUMENTS

| | | |
|---|---|---|
| CN | 106537447 A | 3/2017 |
| CN | 108352837 A | 7/2018 |
| EP | 3183711 A | 6/2017 |
| JP | 2014-516446 | 7/2014 |
| JP | 2015-035073 A | 2/2015 |
| JP | 2015-195331 A | 11/2015 |
| JP | 2017-526055 | 9/2017 |
| KR | 2015-0018415 A | 2/2015 |
| KR | 2015-0030177 A | 3/2015 |
| KR | 2015-0050135 A | 5/2015 |
| KR | 2017-0012019 A | 2/2017 |
| KR | 2017-0021312 A | 2/2017 |
| TW | 201508642 | 3/2015 |
| TW | 201523626 | 6/2015 |
| WO | WO-2016/028373 | 2/2016 |
| WO | WO-2017/081591 | 5/2017 |

OTHER PUBLICATIONS

Written Opinion (Application No. PCT/IB2018/056531) dated Dec. 4, 2018.
Chinese Office Action (Application No. 201880054259.0) dated Mar. 21, 2023.

* cited by examiner

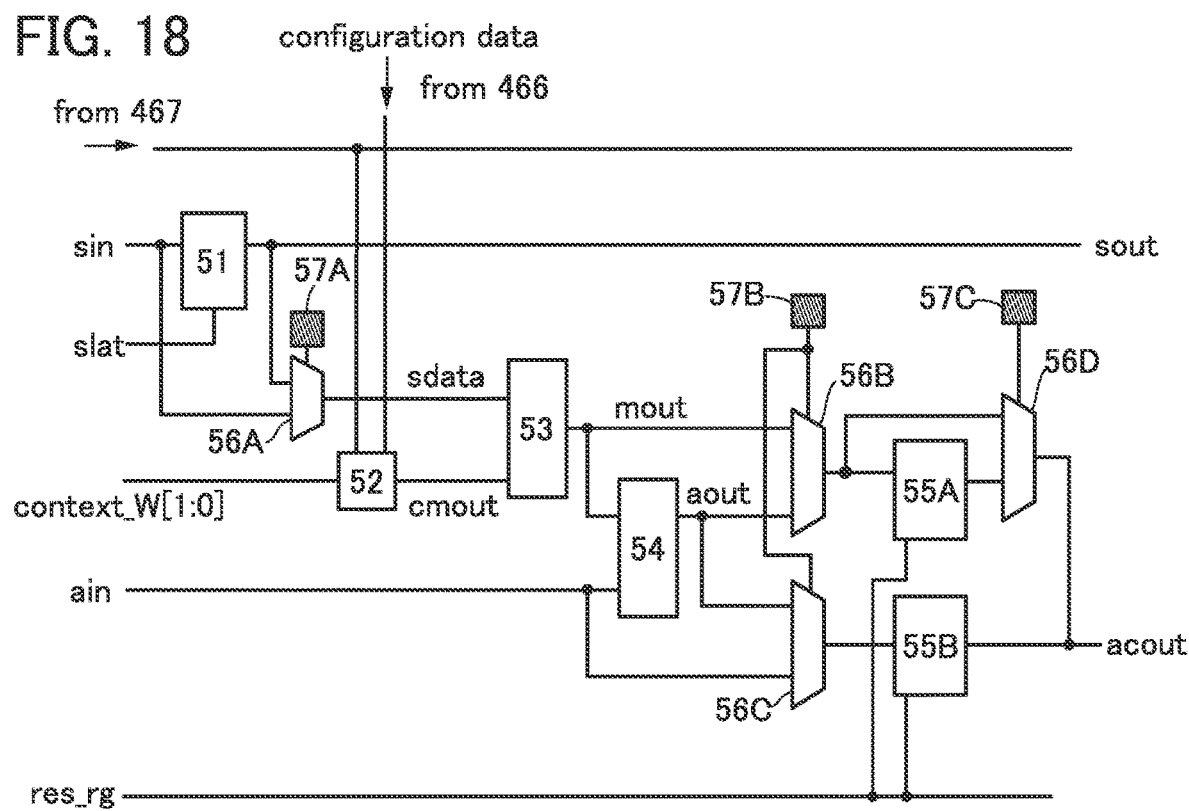

US 11,868,877 B2

ARITHMETIC DEVICE AND ELECTRONIC DEVICE

TECHNICAL FIELD

One embodiment of the present invention relates to an arithmetic device and an electronic device.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a memory device, a display system, an electronic device, a lighting device, an input device, an input/output device, a driving method thereof, and a manufacturing method thereof.

The semiconductor device in this specification and the like means every device which can function by utilizing semiconductor characteristics. A transistor, a semiconductor circuit, an arithmetic device, a memory device, and the like are each an embodiment of the semiconductor device. In addition, a display device, an imaging device, an electro-optical device, a power generation device (including a thin film solar cell, an organic thin film solar cell, and the like), and an electronic device includes a semiconductor device in some cases.

BACKGROUND ART

Electronic devices including an arithmetic device such as a CPU (Central Processing Unit) have been widely used. In such electronic devices, techniques for improving the performance of the arithmetic devices have been actively developed to process a large volume of data at high speed. As a technique for achieving higher performance, there are a multi-core technology and a DVFS (Dynamic Voltage and Frequency Scaling) technology.

In addition, the performance of arithmetic processing of the arithmetic device has been improved by what is called a SoC (System on Chip) in which an accelerator such as a GPU (Graphics Processing Unit) and a CPU are tightly coupled. In the arithmetic device having higher performance by adopting a SoC, heat generation and an increase in power consumption become problems. Therefore, Patent Document 1 discloses an invention relating to a method and a system for reducing heat load by monitoring and controlling the current of a computer including the arithmetic device.

[Patent Document 1] Japanese Translation of PCT International Application No. 2014-516446

SUMMARY OF THE INVENTION

Problems to be Solved by the Invention

A multi-core technology and a DVFS technology are effective in enhancing the performance of the arithmetic device. However, in the case of employing the multi-core technology and the DVFS technology in the arithmetic device which is made by adopting a SoC, power gating for each core is difficult and leakage current flows, which increases power consumption.

Thus, an object of one embodiment of the present invention is to provide a novel arithmetic device and electronic device. Alternatively, an object of one embodiment of the present invention is to provide an arithmetic device and an electronic device having small power consumption. Alternatively, an object of one embodiment of the present invention is to provide an arithmetic device and an electronic device capable of high-speed operation. Alternatively, an object of one embodiment of the present invention is to provide an arithmetic device and an electronic device capable of suppressing heat generation.

One embodiment of the present invention does not necessarily achieve all the above objects and only needs to achieve at least one of the objects. The descriptions of the above objects do not preclude the existence of other objects. Objects other than these will be apparent from and can be derived from the descriptions of the specification, the claims, the drawings, and the like.

Means for Solving the Problems

One embodiment of the present invention is an arithmetic device including a first arithmetic portion and a second arithmetic portion. The first arithmetic portion includes a first CPU core and a second CPU core, the second arithmetic portion includes a first GPU core and a second GPU core, the first CPU core and the second CPU core each have a function of performing power gating, the first CPU core and the second CPU core each include a first data retention circuit electrically connected to a flip-flop, the first GPU core includes a second data retention circuit capable of retaining an analog value and reading out the analog value as digital data of two or more bits, the second GPU core includes a third data retention circuit capable of retaining a digital value and reading out the digital value as digital data of one bit, the first to third data retention circuits each include a first transistor and a capacitor, the first transistor has a function of controlling writing of data into the capacitor and a function of retaining electric charge corresponding to written data by bringing a source and a drain of the first transistor into a non-conduction state, and a channel formation region of the first transistor includes an oxide semiconductor.

One embodiment of the present invention is an arithmetic device including a first arithmetic portion and a plurality of second arithmetic portions. The first arithmetic portion includes a first CPU core and a second CPU core, the plurality of second arithmetic portions each include a first GPU core and a second GPU core, the first CPU core and the second CPU core each have a function of performing power gating, the first CPU core and the second CPU core each include a first data retention circuit electrically connected to a flip-flop, the first GPU core includes a second data retention circuit capable of retaining an analog value and reading out the analog value as digital data of two or more bits, the second GPU core includes a third data retention circuit capable of retaining a digital value and reading out the digital value as digital data of one bit, the first to third data retention circuits each include a first transistor and a capacitor, the first transistor has a function of controlling writing of data into the capacitor and a function of retaining electric charge corresponding to written data by bringing a source and a drain of the first transistor into a non-conduction state, and a channel formation region of the first transistor includes an oxide semiconductor.

One embodiment of the present invention is preferably the arithmetic device in which each of the second data retention circuit and the third data retention circuit include a second transistor and a function of retaining a potential corresponding to the analog value or the digital value in a node to which one of a source and a drain of the first transistor, one electrode of the capacitor, and a gate of the second transistor are electrically connected one another.

One embodiment of the present invention is preferably the arithmetic device in which switching of either one of the first CPU core and the second CPU core to a state of executing arithmetic processing and switching of the other to a state of performing power gating are performed, and the switching is controlled in response to a temperature of a region provided with the first CPU core or the second CPU core.

One embodiment of the present invention is preferably the arithmetic device in which switching of either one of the first GPU core and the second GPU core to a state of executing arithmetic processing and switching of the other to a state of performing power gating are performed, and the switching is controlled in response to whether the arithmetic processing is arithmetic processing on the basis of scientific computation or arithmetic processing on the basis of inference using a neutral network.

Note that other embodiments of the present invention will be shown in the following embodiments and the drawings.

Effect of the Invention

According to one embodiment of the present invention, a novel arithmetic device and electronic device can be provided. Alternatively, according to one embodiment of the present invention, an arithmetic device and an electronic device having small power consumption can be provided. Alternatively, according to one embodiment of the present invention, an arithmetic device and an electronic device capable of high-speed operation can be provided. Alternatively, according to one embodiment of the present invention, an arithmetic device and an electronic device capable of suppressing heat generation can be provided.

Note that the descriptions of the effects do not disturb the existence of other effects. One embodiment of the present invention does not necessarily have all of these effects. Effects other than these will be apparent from and can be derived from the descriptions of the specification, the claims, the drawings, and the like.

BRIEF DESCRIPTION OF THE DRAWINGS

FIG. 18 A circuit diagram showing a configuration example of an arithmetic circuit.

MODE FOR CARRYING OUT THE INVENTION

Figure 1:
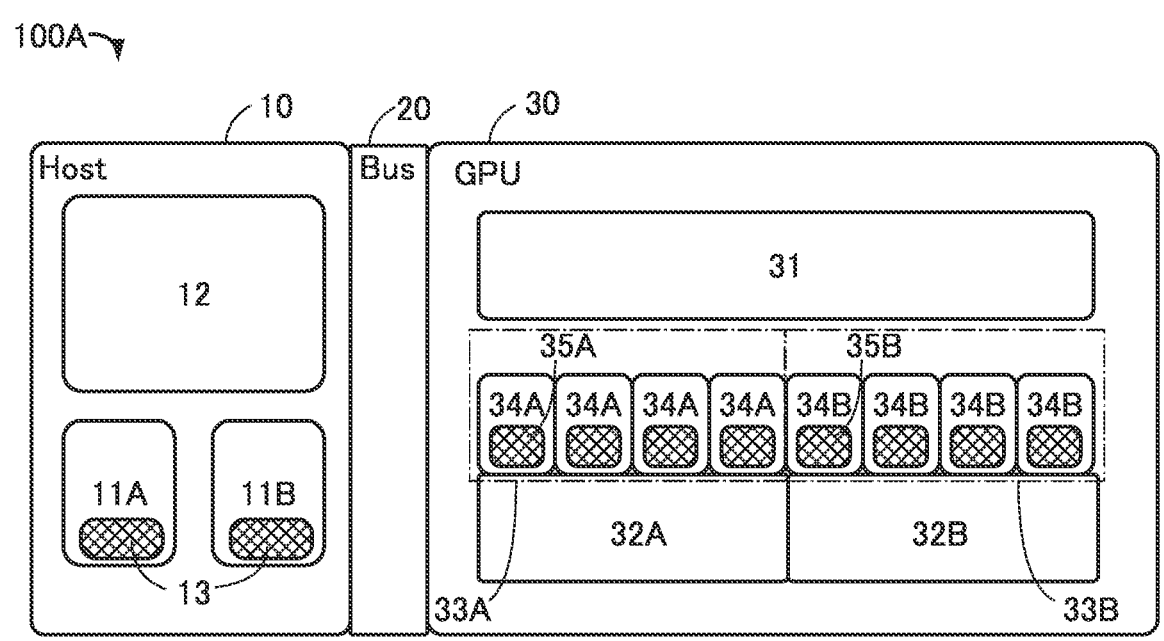
FIG. 1 A block diagram illustrating a configuration of one embodiment of the present invention.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the following description of the embodiments.

A plurality of embodiments described below can be combined as appropriate. In addition, in the case where a plurality of configuration examples (including a manufacturing method example, an operating method example, a usage example, and the like) are given in one embodiment, some of the configuration examples can also be combined as appropriate, and any of the configuration examples can also be combined with one or more configuration examples described in the other embodiments.

In the drawings, the size, the layer thickness, or the region is exaggerated for clarity in some cases. Thus, embodiments of the present invention are not limited to such scales. The drawings are schematic views showing ideal examples, and embodiments of the present invention are not limited to shapes or values shown in the drawings. For example, the following can be included: variation in signal, voltage, or current due to noise or difference in timing.

In this specification and the like, a metal oxide means an oxide of metal in a broad sense. Metal oxides are classified into an oxide insulator, an oxide conductor (including a transparent oxide conductor), an oxide semiconductor, and the like. For example, in the case where a metal oxide is used in a channel formation region of a transistor, the metal oxide is called an oxide semiconductor in some cases. That is to say, in the case where a metal oxide has at least one of an amplifying function, a rectifying function, and a switching function, the metal oxide can be called a metal oxide semiconductor. A transistor including a metal oxide in a channel formation region is also referred to as an os transistor below.

Embodiment 1

Configurations, operations, and the like of arithmetic devices of one embodiment of the present invention will be described.

FIG. 1 is a block diagram of an arithmetic device 100A. The arithmetic device 100A illustrated in FIG. 1 includes a host 10 (Host in the figure), a bus 20 (Bus in the figure), and a GPU 30. The host 10 and the GPU 30 each have a function of performing an arithmetic operation for executing a program.

The host 10 has a function of performing general-purpose processing such as execution of OS (Operating System), control of data, and execution of various arithmetic operations and programs. The host 10 includes a plurality of CPU cores. FIG. 1 illustrates two CPU cores, a CPU core 11A and a CPU core 11B, as an example. The host 10 includes a memory 12. The memory 12 has a function of a main memory or a function of a data cache.

The CPU core 11A and the CPU core 11B each have a function of executing processing performed by the host 10. The CPU core 11A and the CPU core 11B preferably differ in processing performance. For example, a configuration in which the CPU core 11A is a core which has lower processing performance and smaller power consumption than the CPU core 11B, and the CPU core 11B is a core which has higher processing performance and larger power consumption than the CPU core 11A, is preferable. With such a configuration, both or either one of the CPU core 11A and the CPU core 11B can be selected to execute the processing efficiently in response to the amount and kinds of processing performed by the host 10.

Note that the CPU core 11A and the CPU core 11B can each have a configuration with different processing capacity and power consumption with a different circuit design. Alternatively, a configuration in which the processing capacity and power consumption are different is enabled by preparing the same two CPU cores and employing a DFVS technology for both or either one of the CPU cores. As a specific example, the above configuration with different processing capacity and power consumption can be achieved by enhancing the processing performance by voltage and frequency increases in one of the CPU cores, and reducing power consumption by voltage and frequency decreases in the other CPU core.

The CPU core 11A and the CPU core 11B each include a data retention circuit 13. The data retention circuit 13 is a circuit that can retain data even when the supply of a power supply voltage is stopped. Note that the supply of a power supply voltage can be controlled by an electric isolation by a power switch or the like from a power domain. Note that a power supply voltage is referred to as a drive voltage in some cases. As the data retention circuit 13, for example, a memory including a transistor (an os transistor) including an oxide semiconductor in a channel formation region (hereinafter also referred to as an os memory) is suitable.

A metal oxide has a band gap of 2.5 eV or more; thus, an os transistor has an extremely small off-state current. For example, the off-state current per micrometer in channel width at a source-drain voltage of 3.5 V and room temperature (25° C.) can be lower than $1\times10^{-20}$ A, lower than $1\times10^{-22}$ A, or lower than $1\times10^{-24}$ A. That is, the on/off ratio of drain current can be greater than or equal to 20 digits and less than or equal to 150 digits. Therefore, in an os memory, the amount of electric charges that leak from a retention node through the os transistor is extremely small. Accordingly, the os memory can function as a nonvolatile memory circuit; thus, power gating of the arithmetic device is enabled.

Examples of a metal oxide that is applied to an os transistor include a Zn oxide, a Zn—Sn oxide, a Ga—Sn oxide, an In—Ga oxide, an In—Zn oxide, an In-M-Zn oxide (M is Ti, Ga, Y, Zr, La, Ce, Nd, Sn, or Hf), and the like. In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve reliability and electrical characteristics of the os transistor, a metal oxide used for a semiconductor layer is preferably a metal oxide including a crystal part, such as a CAAC-OS, a CAC-OS, or an nc-OS. CAAC-OS is an abbreviation of a c-axis-aligned crystalline oxide semiconductor. CAC-OS is an abbreviation of a Cloud-Aligned Composite oxide semiconductor. nc-OS is an abbreviation of a nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function that allows electrons (or holes) serving as carriers to flow and a function that does not allow electrons serving as carriers to flow. Separation between the function that allows electrons to flow and the function that does not allow electrons to flow can maximize each function. That is, the use of the CAC-OS for the os transistor enables both a high on-state current and an extremely low off-state current.

Avalanche breakdown or the like is less likely to occur in some cases in an os transistor than in a general Si transistor because, for example, a metal oxide has a wide band gap and thus electrons are less likely to be excited, and the effective mass of a hole is large. Therefore, for example, it may be possible to inhibit hot-carrier degradation or the like that is caused by avalanche breakdown. Since hot-carrier degradation can be inhibited, an os transistor can be driven with a high drain voltage.

An os transistor is an accumulation transistor in which electrons are majority carriers. Therefore, DIBL (Drain-Induced Barrier Lowering), which is one of short-channel effects, affects an os transistor less than an inversion transistor having a pn junction (typically a Si transistor). In other words, an os transistor has higher resistance against a short channel effect than a Si transistor.

Owing to its high resistance against short channel effects, an os transistor can have a reduced channel length without deterioration in reliability, which means that the use of an os transistor can increase the degree of integration in a circuit. Although a reduction in channel length enhances a drain electric field, avalanche breakdown is less likely to occur in an os transistor than in a Si transistor as described above.

Since an os transistor has a high resistance against short-channel effects, a gate insulating film can be made thicker than that of a Si transistor. For example, even in a minute OS transistor whose channel length and channel width are less than or equal to 50 nm, a gate insulating film as thick as approximately 10 nm can be provided in some cases. When the gate insulating film is made thick, parasitic capacitance can be reduced and thus the operating speed of a circuit can be improved. In addition, when the gate insulating film is made thick, leakage current through the gate insulating film is reduced, resulting in a reduction in static current consumption.

As described above, by including the data retention circuit 13 which is an os memory, the CPU core 11A and the CPU core 11B can retain data even when the supply of a power supply voltage is stopped. Thus, power gating of the CPU core 11A and the CPU core 11B is enabled, so that power consumption can be reduced significantly.

The memory 12 has a function of storing data necessary in processing performed by the CPU core 11A and the CPU core 11B. The memory 12 can have a configuration including a volatile memory such as a RAM (Random Access Memory) or a nonvolatile memory. Specifically, an SRAM (Static Random Access Memory), a DRAM (Dynamic Random Access Memory), a flash memory, or the like can be used. Alternatively, a NOSRAM or a DOSRAM can be used.

"NOSRAM (registered trademark)" is an abbreviation of a "Nonvolatile Oxide Semiconductor RAM". A NOSRAM is a memory in which its memory cell is a 2-transistor (2T) or 3-transistor (3T) gain cell, and its access transistor is an os transistor. "DOSRAM (registered trademark)" is an abbreviation of a "Dynamic Oxide Semiconductor RAM". A DOSRAM is a memory in which its memory cell is a 1-transistor-1-capacitor (1T1C) type composed of an os transistor and a capacitor, and its access transistor is an os transistor. The access transistors of the NOSRAM and the DOSRAM are each an os transistor. An os transistor has an extremely small current that flows between a source and a drain in an off state, that is, leakage current. The NOSRAM and the DOSRAM can each be used as a nonvolatile memory by retaining electric charge corresponding to data, using characteristics of an extremely small leakage current.

The memory 12 is electrically connected to the CPU core 11A and the CPU core 11B through a memory bus (not illustrated). Note that the arithmetic device 100A is a heterogeneous system in which the CPU and the GPU are integrated and therefore the memory 12 is referred to as a host memory in some cases.

The host 10 is electrically connected to the GPU 30 through the bus 20. That is, data transmission can be performed between the host 10 and the GPU 30 through the bus 20.

The GPU 30 includes a device memory 31, a shared memory 32A, a shared memory 32B, a GPU core 33A, and a GPU core 33B. The device memory 31, the shared memory 32A, and the shared memory 32B are each referred to as an on-site memory in some cases.

The GPU 30 has a function of executing a program called from the host program. The GPU 30 can perform parallel processing of a matrix operation in graphics processing, parallel processing of a product-sum operation of a neural network, and parallel processing of a floating-point operation in a scientific computation, for example.

The device memory 31 stores a program (also referred to as kernel or a kernel program) executed by the GPU 30 and data processed by the GPU 30. The device memory 31 is electrically connected to the shared memory 32A and the shared memory 32B through a memory bus (not illustrated). Note that data transfer between the device memory 31 and the memory 12 is performed through the bus 20.

The shared memory 32A is electrically connected to the GPU core 33A and has a function of retaining a digital value. The memory 32B is electrically connected to the GPU core 33B and has a function of retaining an analog value. Note that a digital value is binary, that is, 1-bit digital data. An analog value is data of four or more levels and can be treated as digital data of two or more bits by quantization. Therefore, the shared memory 32B can have a larger memory capacity per unit area than the shared memory 32A.

The GPU core 33A has a function of performing arithmetic processing using a digital value. The digital value is less likely to be affected by noise. Therefore, the GPU core 33A is suitable for performing arithmetic processing that requires an arithmetic operation result with high accuracy. The GPU core 33A includes a plurality of arithmetic units 34A.

The arithmetic unit 34A includes a data retention portion 35A that retains a digital value. Each of the arithmetic units 34A has a function of performing any one of an integer arithmetic operation, a single precision floating-point arithmetic operation, a double precision floating-point arithmetic operation, and the like using the digital value retained in the data retention portion 35A. Basically, the plurality of arithmetic units 34A integrated in the GPU core 33A execute the same instruction.

The GPU core 33B has a function of performing arithmetic processing using an analog value. With the use of the quantized analog value for the arithmetic processing as digital data, performing enormous amounts of arithmetic processing becomes unnecessary, which enables a reduction in the circuit scale. Therefore, the GPU core 33B can suppress heat generation while reducing power consumption. The GPU core 33B includes a plurality of arithmetic units 34B.

The arithmetic unit 34B includes a data retention portion 35B that retains an analog value. Each of the arithmetic units 34B has a function of performing any one of an integer arithmetic operation, a single precision floating-point arithmetic operation, a double precision floating-point arithmetic operation, and the like using digital data obtained by quantization of the analog value retained in the data retention portion 35B. Basically, the plurality of arithmetic units 34B integrated in the GPU core 33B execute the same instruction.

The host 10 and the GPU 30 are elements that involve consumption of power in the arithmetic device 100A illustrated in FIG. 1. The proportions of the host 10 and the GPU 30 to the total power consumption of the arithmetic device 100A are relatively large. Particularly when the GPU 30 perform the enormous amount of arithmetic processing such as learning of a deep neural network (deep learning), a scientific computation that performs a floating-point arithmetic operation, or the like, the power consumption of the arithmetic device 100A is significantly increased. Therefore, the power consumption of the GPU 30 is preferably made as small as possible.

The arithmetic device 100A illustrated in FIG. 1 can perform arithmetic processing at high speed while suppressing power consumption and heat generation by switching between the arithmetic operations using the quantized analog values and the arithmetic operations using digital values in the GPU, and switching between the CPU core 11A and the CPU core 11B. This configuration is particularly effective in SoC on which a plurality of CPU cores and a plurality of GPU cores are mounted.

Figure 2:
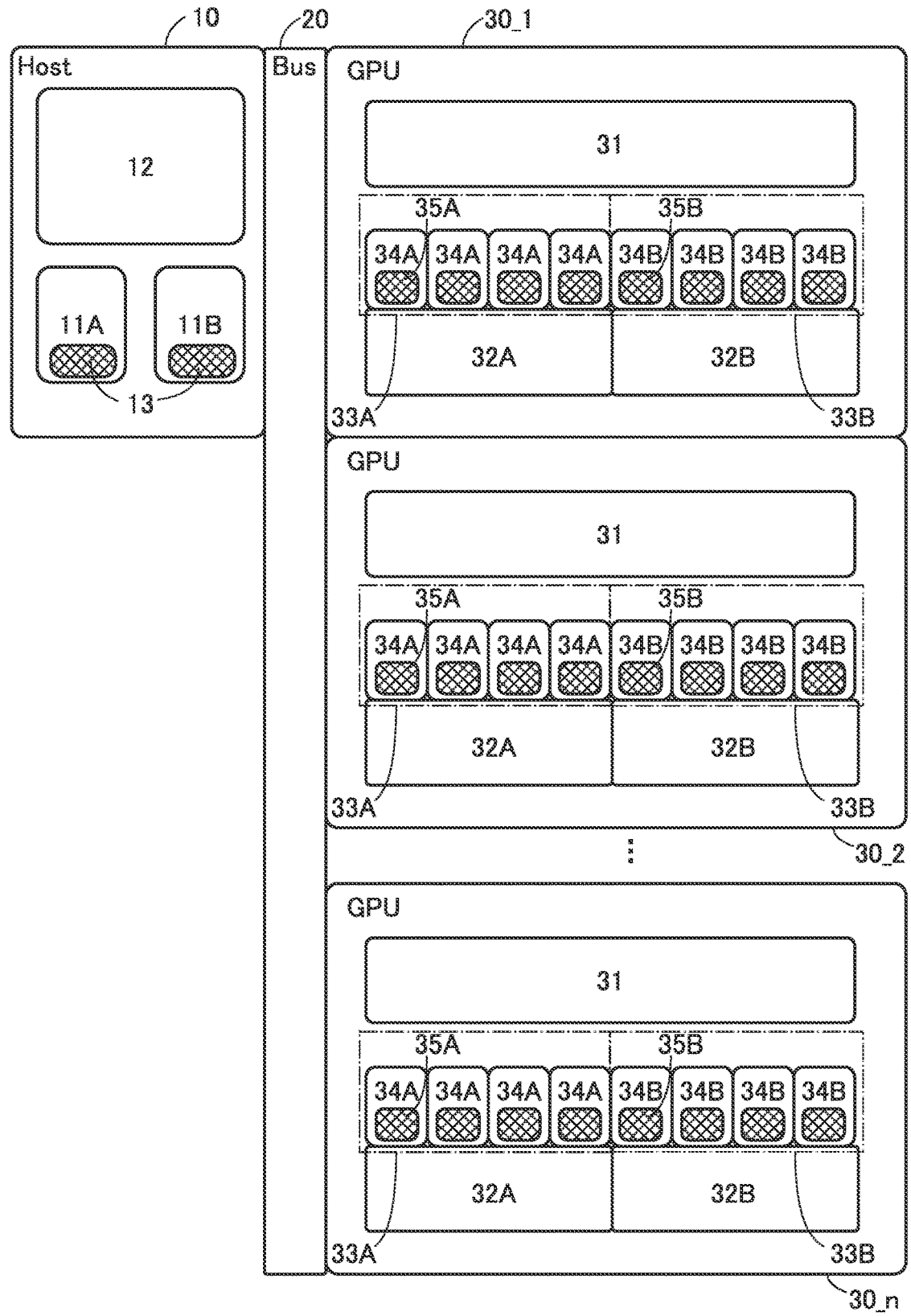
FIG. 2 A block diagram illustrating a configuration of one embodiment of the present invention.

FIG. 2 is a block diagram of a modification example of the arithmetic device 100A illustrated in FIG. 1. An arithmetic device 100B illustrated in FIG. 2 is different from the arithmetic device 100A illustrated in FIG. 1 in that two or more GPUs (a GPU 30_1 to a GPU 30_$n$ ($n$ is a natural number of 2 or more)) are included.

The bus 20 is electrically connected to the host 10 and the GPU 30_1 to the GPU 30_$n$. Data transmission can be performed between the host 10 and the GPU 30_1 to the GPU 30_$n$ through the bus 20. For the other components, the configuration of the arithmetic device 100A is referred to.

Having the plurality of GPUs, the arithmetic device 100B can execute processing at higher speed than the arithmetic device 100A. In addition, appropriate switching of the GPU to perform the processing suppresses an increase in the temperature of the arithmetic device 100B.

Figure 3:
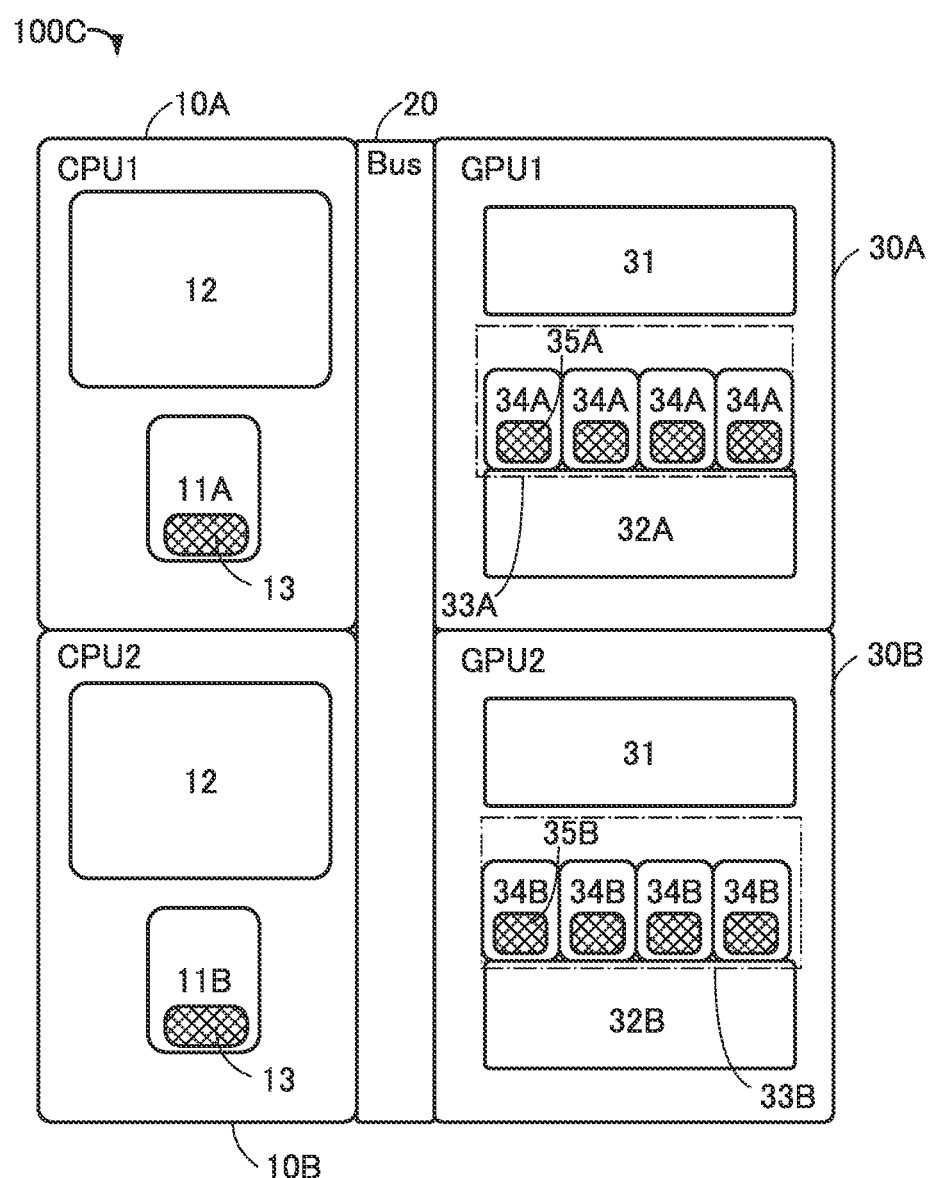
FIG. 3 A block diagram illustrating a configuration of one embodiment of the present invention.

FIG. 3 is a block diagram of a modification example of the arithmetic device 100A illustrated in FIG. 1. An arithmetic device 100C illustrated in FIG. 3 is different from the arithmetic device 100A illustrated in FIG. 1 in that a CPU 10A (CPU1), a CPU 10B (CPU2), the bus 20, a GPU 30A (GPU1), and a GPU 30B (GPU2) are included.

The CPU 10A includes the CPU core 11A and the memory 12, and the CPU 10B includes the CPU core 11B and the memory 12. The GPU 30A also includes the device memory 31, the shared memory 32A, and the GPU core 33A, and the GPU 30B includes the device memory 31, the shared memory 32B, and the GPU core 33B.

The bus 20 is electrically connected to the CPU 10A, the CPU 10B, the GPU 30A, and the GPU 30B. Data transmission can be performed between the CPU 10A and the CPU 10B, and the GPU 30A and the GPU 30B through the bus 20. For the other components, the configuration of the arithmetic device 100A is referred to.

Figure 4:
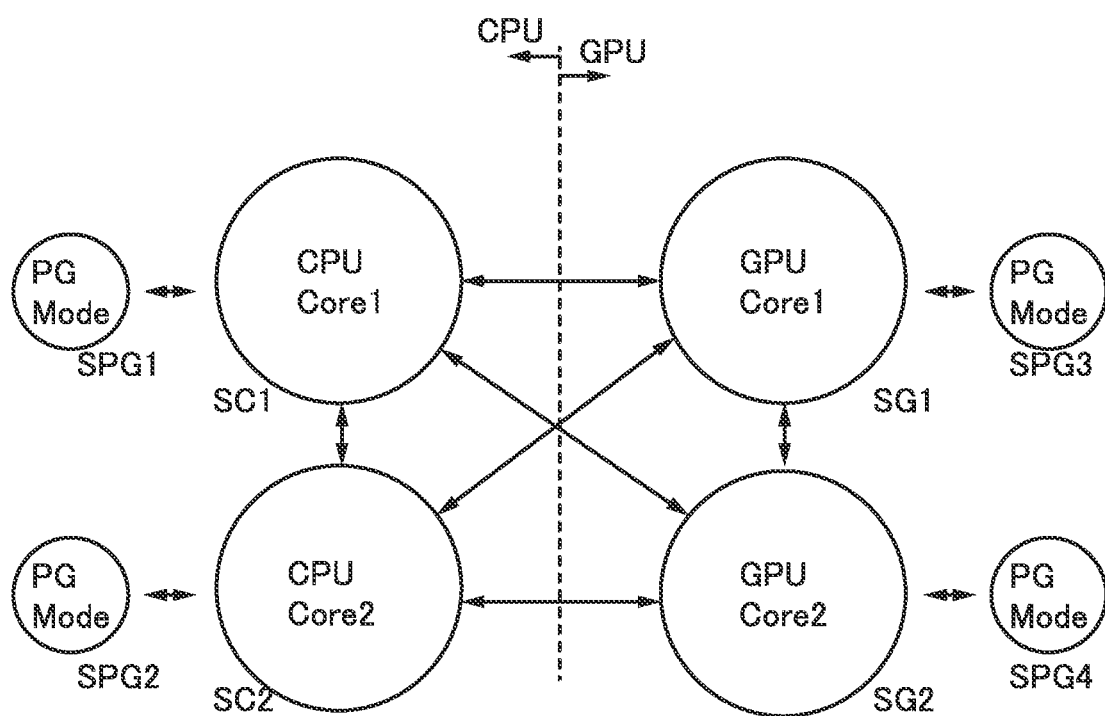
FIG. 4 A state transition diagram illustrating a configuration of one embodiment of the present invention.

FIG. 4 is a state transition diagram for illustrating a plurality of possible states of the arithmetic device 100A illustrated in FIG. 1. The arithmetic device 100A illustrated in FIG. 4 includes a state SC1, a state SC2, a state SG1, a state SG2, and states SPG1 to SPG4.

The state SC1 illustrated in FIG. 4 corresponds to a state of executing processing using the CPU core 11A (illustrated as a CPU Core1 in the figure). The state SC2 corresponds to a state of executing processing using the CPU core 11B (illustrated as a CPU Core2 in the figure). The state SG1 corresponds to a state of executing processing using the GPU core 33B (illustrated as a GPU Core1 in the figure). The state SG2 corresponds to a state of executing processing using the GPU core 33A (illustrated as a GPU Core2 in the figure).

The states SPG1 to SPG4 illustrated in FIG. 4 have a function of bringing the cores in the states of the state SC1, the state SC2, the state SG1, and the state SG2 each into a power gating state (a PG state, illustrated as PG Mode in the drawing). Power gating is a technique for controlling the supply of a power supply voltage to a circuit so as to stop the supply of the power supply voltage to, for example, a circuit which is not in use.

For example, in the case of bringing only the CPU core 11A into a PG state, the CPU core 11A transitions from the state SC1 to the state SPG1, and the CPU core 11B, the GPU core 33A, and the GPU core 33B which are the other components remain in the state SC2, the state SG2, and the state SG1 to which a power supply voltage is supplied. As another example, in the case of bringing the CPU core 11A and the GPU core 33B each into a PG state, the CPU core 11A transitions from the state SC1 to the state SPG1, the GPU core 33B transitions from the state SG1 to the state SPG3, and the CPU core 11B and the GPU core 33A which are the other components remain in the state SC2 and the state SG2 to which a power supply voltage is supplied.

On the basis of the kind and the amount of arithmetic operations of instructions written in the host program, the arithmetic device 100A selects the state SC1 or the state SPG1, and the state SC2 or the state SPG2, i.e., whether processing is performed using one or both of the CPU core 11A and the CPU core 11B. In the case where the kernel program is written in the host program, the state SG1 or the state SPG3, and the state SG2 or the state SPG4 is selected, i.e., whether processing is performed using one or both of the GPU core 33A and the GPU core 33B is selected on the basis of the kind and the amount of arithmetic operations of the kernel program. With this configuration, each core can be independently brought into a PG state; therefore, power consumption of the arithmetic device as a whole can be reduced.

Figure 5:
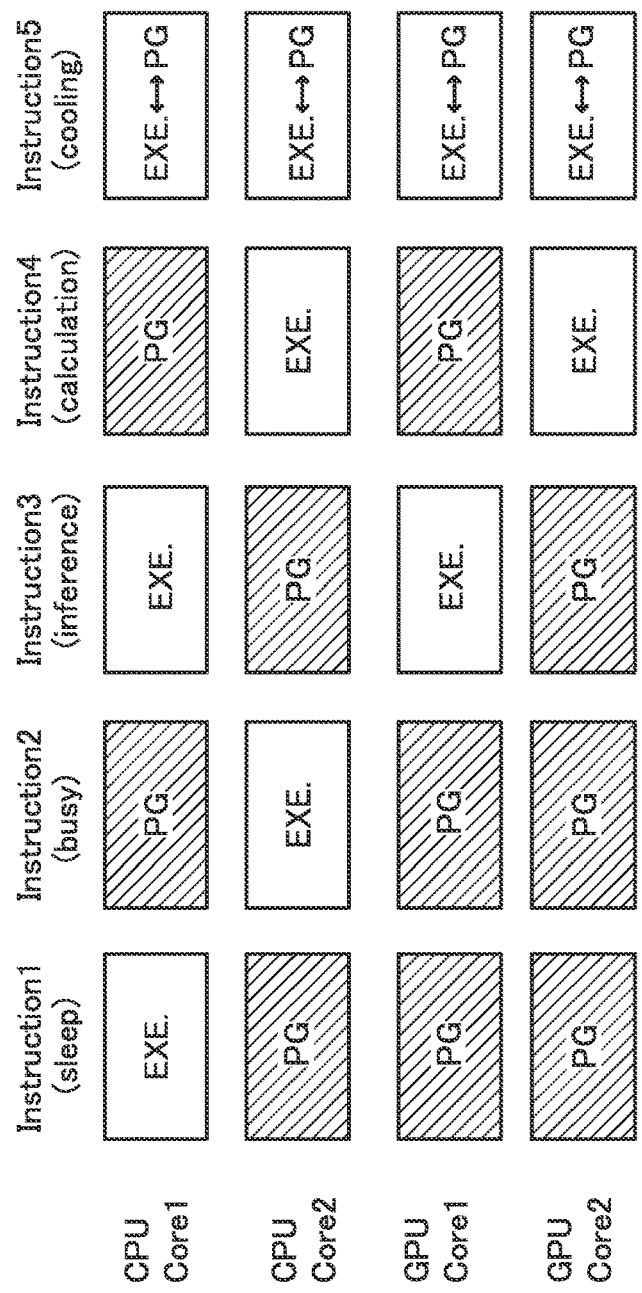
FIG. 5 A diagram illustrating a configuration of one embodiment of the present invention.

FIG. 5 illustrates an example of transitioning to each state illustrated in the state transition state described in FIG. 4. Specifically, the operation of each core with respect to five instructions (an instruction 1 to an instruction 5) is described. In FIG. 5, the core to which a power supply voltage is supplied and which is in a state capable of processing is expressed as "EXE.", and the core to which the supply of a power supply voltage is stopped and which is in a PG state is expressed as "PG".

Note that in the description of FIG. 5, the CPU core 1 (illustrated as CPU Core1 in the figure) is a core that has low arithmetic performance and low power consumption as compared with the CPU core 2 (illustrated as CPU Core2 in the figure). The CPU core 2 is a core that has high arithmetic performance and high power consumption as compared with the CPU core 1. In the GPU core 1 (illustrated as GPU Core1 in the figure), which is a GPU core that performs arithmetic processing using a digital value (multilevel data) obtained by quantization of an analog value, although processing speed and accuracy of an arithmetic operation are low, less heat is generated. In the GPU core 2 (illustrated as GPU Core2 in the figure), which is a GPU core that performs arithmetic processing using a digital value, although the processing speed and accuracy of the arithmetic operations are high, much heat is generated.

The instruction 1 (Instruction) in the figure is an instruction that does not execute processing in parallel, and that does not require high processing performance. For example, there is a case where an electronic device or a parallel calculator, on which the arithmetic device is mounted, is in a sleep mode (sleep in the figure). In such a case, only the CPU core 1 is operated and the other cores are brought into PG states. Since the CPU core 1 has low power consumption and the other cores are in PG states and thus do not consume power, the instruction 1 can be executed while power consumption and heat generation of the arithmetic device 100A are suppressed.

The instruction 2 (Instruction2 in the figure) is an instruction that cannot execute processing in parallel, and that requires a high-speed processing. For example, there is a case where an operating system is booted up or a plurality of normal programs are executed (busy in the figure). In such a case, only the CPU core 2 is operated and the other cores are brought into PG states. The CPU core 2 has high processing performance and the other cores are in PG states and thus do not consume power. Thus, the instruction 2 can be executed at high speed while the power consumption of the arithmetic device 100A is reduced.

The instruction 3 (Instruction3 in the figure) is an instruction that can execute processing in parallel, and that does not require high processing performance. For example, there is a case where inference processing on the basis of machine learning is performed (inference in the figure). In such a case, the CPU core 1 and the GPU core 1 are operated and the other cores are brought into PG states. The CPU core 1 can execute processing on the GPU core 1 by transferring input data to a memory on the GPU core 1 and calling the kernel program. When the processing is terminated, output data is transferred to a memory on the CPU core. The CPU core 1 and the GPU core 1 have low power consumption, and the other cores are in PG states and do not consume power. Thus, the instruction 3 can be executed while the power consumption and heat generation of the arithmetic device 100A are suppressed. Note that in the case where the operation of the CPU core 1 is unnecessary when the GPU core 1 performs processing, the CPU core 1 may be switched into a PG state during the period in which the processing is performed. Power consumption and heat generation can be suppressed by frequent switching into a PG state.

The instruction 4 (Instruction4 in the figure) is an instruction that can execute processing in parallel, and that requires a high-speed processing. For example, there is a case where a scientific computation is performed (calculation in the figure). In such a case, the CPU core 2 and the GPU core 2 are operated and the other cores are brought into PG states. The CPU core 2 can execute processing on the GPU core 2 by transferring input data to a memory on the GPU core 2 and calling the kernel program. When the processing is terminated, output data is transferred to a memory on the CPU core. Note that part of the processing may be executed in the CPU core 2. Since the CPU core 2 and the GPU core 2 have high processing performance and the other cores are in PG states and do not consume power, the instruction 4 can be executed at high speed while power consumption of the arithmetic device 100A is reduced. Note that in the case where the operation of the CPU core 2 is unnecessary when the GPU core 2 performs processing, the CPU core 2 may be switched into a PG state during the period in which the processing is performed. Power consumption and heat generation can be suppressed by frequent switching into a PG state.

The instruction 5 (Instruction5 in the figure) is an instruction the amount of arithmetic operations of which is larger and which requires a faster processing than the instruction 4. In this case, when processing is performed with only two of the CPU core 2 and the GPU core 2, heat might be generated in these cores and the temperature of a substrate might be raised, resulting in breakage of the arithmetic device. In such a case, it is effective to perform driving that can suppress a rise in the temperature of a substrate (cooling in the figure).

For example, it is possible to keep executing the instruction while heat generation is suppressed by frequently performing switching between a PG state and a state of supplying a power supply voltage on all cores (the CPU core 1, the CPU core 2, the GPU core 1, and the GPU core 2).

As described above, the instructions can be executed at high speed while power consumption is reduced by appropriately selecting the combination of cores to be used and bringing the non-selected cores into PG states on the basis of the kind and the amount of arithmetic operations of the instructions written in the host program and the kind and the amount of arithmetic operations of the kernel program.

Figure 6A:
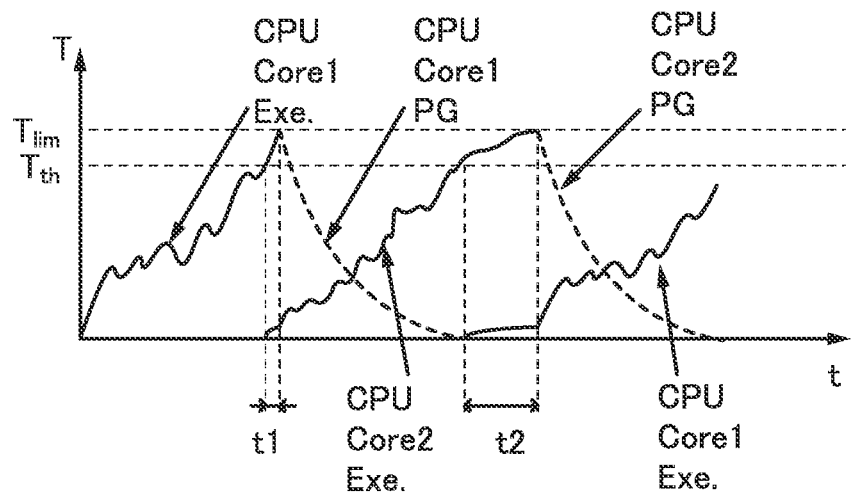
FIGS. 6A-6B Diagrams showing a configuration of one embodiment of the present invention.
Figure 6B:
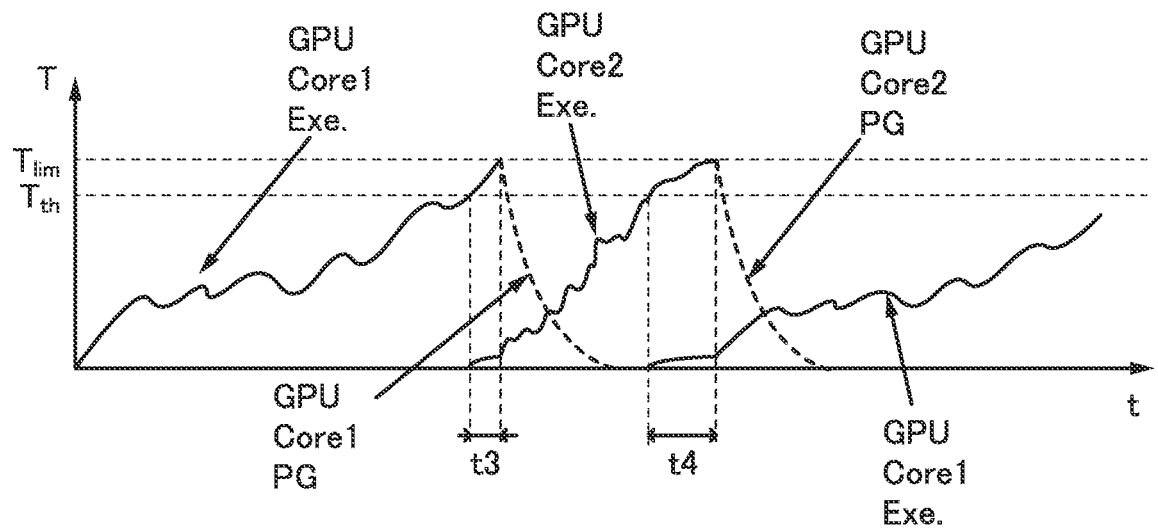

FIGS. 6(A) and 6(B) are diagrams illustrating an operation of switching between a state of performing an arithmetic operation and a PG state and switching between the PG state and a state of performing an arithmetic operation when a plurality of CPU cores or a plurality of GPU cores are used in response to the temperature of a substrate.

FIG. 6(A) shows an example of a state in which two CPU cores (the CPU Core1 and the CPU Core2) are each operated by switching between a state of performing an arithmetic operation and a PG state. First, the CPU Core1 is brought into a state capable of performing an arithmetic operation (CPU Core1 Exe.) by supply of a power supply voltage, and the CPU Core2 is brought into a PG state by stopping supply of a power supply voltage. Note that in the graph shown in FIG. 6(A), the horizontal axis represents the time and the vertical axis represents a surface temperature of regions where the CPU cores are placed.

Current flows through the CPU Core1 by the arithmetic operation; therefore, heat generation is centered around a region where the CPU Core1 is placed. The temperature of the region where the CPU Core1 is placed is raised by the heat generation. When the temperature of the region where the CPU Core1 is placed reaches a threshold temperature $T_{th}$, the CPU Core2 is switched from the PG state into a state of supplying a power supply voltage and switched into a standby state for performing an arithmetic operation (CPU Core2 Exe.).

Note that it is preferable to have a configuration in which the arithmetic operation capacity of the CPU Core1 is smaller than the arithmetic operation capacity of the CPU Core2. Specifically, a configuration is employed in which the arithmetic operation capacity of the CPU Core2 is improved more than that of the CPU Core1 by a DVFS technology. In the case where the CPU Core1 is actively used as compared with the CPU Core2, with this configuration, the heat generation of the region where the CPU Core1 is placed can be suppressed more than heat generation in a region where the CPU Core2 is placed, whereby power consumption can be reduced, heat generation can be suppressed, and the frequency of switching into a PG state can be reduced.

When the temperature of the region where the CPU Core1 is placed reaches a temperature limit $T_{lim}$ by the heat generation of the region where the CPU Core1 is placed, the CPU Core1 is brought into a PG state (CPU Core1 PG) by stopping the supply of the power supply voltage. Then, the arithmetic operation is started in the CPU Core2. Current flows through the CPU Core2 by the arithmetic operation; therefore, heat generation is centered around the region where the CPU Core2 is placed. Note that although the CPU Core2 is switched from the PG state into the state of supplying a power supply voltage in a period t1 shown in FIG. 6(A), a small amount of heat is generated because of a standby state.

The temperature of the region where the CPU Core2 is placed is raised by the heat generation. The region where the CPU Core1 is placed can be cooled by bringing the CPU Core1 into the PG state during the rise in the temperature of the region where the CPU Core2 is placed. Thus, the rise in the temperature of the CPU Core2 can be suppressed. As a result, a rise in the temperature of the arithmetic device as a whole can be suppressed, so that a cooling mechanism such as a fan can be eliminated. When the temperature of the region where the CPU Core2 is placed reaches the threshold temperature $T_{th}$, the CPU Core1 is switched from the PG state into a state of supplying a power supply voltage and switched into a standby state for performing an arithmetic operation (CPU Core1 Exe.).

When the temperature of the region where the CPU Core2 is placed reaches the temperature limit $T_{lim}$ by the heat generation of the region where the CPU Core2 is placed, the CPU Core2 is brought into a PG state (CPU Core2 PG) by stopping the supply of the power supply voltage. Then, the arithmetic operation is started in the CPU Core1. Current flows through the CPU Core1 by the arithmetic operation; therefore, heat generation is centered around the region where the CPU Core1 is placed. Note that although the CPU Core1 is switched from the PG state into the state of supplying a power supply voltage in a period t2 shown in FIG. 6(A), a small amount of heat is generated because of a standby state.

The temperature of the region where the CPU Core1 is placed is raised again by heat generation. The region where the CPU Core2 is placed can be cooled by bringing the CPU Core2 into the PG state during the rise in the temperature of the region where the CPU Core1 is placed. Thus, the rise in the temperature of the CPU Core1 can be suppressed. As a result, a rise in the temperature of the arithmetic device as a whole can be suppressed, so that a cooling mechanism such as a fan can be eliminated.

Similarly, FIG. 6(B) shows an example of a state in which two GPU cores (the GPU Core1 and the GPU Core2) are each operated by switching between a state of performing an arithmetic operation and a PG state. First, the GPU Core1 is brought into a state capable of performing an arithmetic operation (GPU Core1 Exe.) by supply of a power supply voltage, and the GPU Core2 is brought into a PG state by stopping supply of a power supply voltage. Note that in the graph shown in FIG. 6(B), the horizontal axis represents the time and the vertical axis represents a surface temperature of regions where the GPU cores are placed.

Current flows through the GPU Core1 by the arithmetic operation; therefore, heat generation is centered around a region where the GPU Core1 is placed. The temperature of the region where the GPU Core1 is placed is raised by the heat generation. When the temperature of the region where the GPU Core1 is placed reaches a threshold temperature $T_{th}$, the GPU Core2 is switched from the PG state into a state of supplying a power supply voltage and switched into a standby state for performing an arithmetic operation (GPU Core2 Exe.).

Note that the amount of arithmetic operations in the arithmetic operation using the GPU Core1 can be made smaller than that in the arithmetic operation using the GPU Core2. Therefore, when the GPU Core1 is actively used as compared with the GPU Core2, power consumption can be reduced, heat generation can be suppressed, and the frequency of switching into a PG state can be reduced.

When the temperature of the region where the GPU Core1 is placed reaches a temperature limit $T_{lim}$ by the heat generation of the region where the GPU Core1 is placed, the GPU Core1 is brought into a PG state (GPU Core1 PG) by stopping the supply of the power supply voltage. Then, the arithmetic operation is started in the GPU Core2. Current flows through the GPU Core2 by the arithmetic operation; therefore, heat generation is centered around the region where the GPU Core2 is placed. Note that although the GPU Core2 is switched from the PG state into the state of supplying a power supply voltage in a period t3 shown in FIG. 6(B), a small amount of heat is generated because of a standby state.

The temperature of the region where the GPU Core2 is placed is raised by the heat generation. The region where the GPU Core1 is placed can be cooled by bringing the GPU Core1 into the PG state during the rise in the temperature of the region where the GPU Core2 is placed. Thus, the rise in the temperature of the GPU Core2 can be suppressed. As a result, a rise in the temperature of the arithmetic device as a whole can be suppressed, so that a cooling mechanism such as a fan can be eliminated. When the temperature of the region where the GPU Core2 is placed reaches the threshold temperature $T_{th}$, the GPU Core1 is switched from the PG state into a state of supplying a power supply voltage and switched into a standby state for performing an arithmetic operation (GPU Core1 Exe.).

When the temperature of the region where the GPU Core2 is placed reaches the temperature limit $T_{lim}$ by the heat generation of the region where the GPU Core2 is placed, the GPU Core2 is brought into a PG state (GPU Core2 PG) by stopping the supply of the power supply voltage. Then, the arithmetic operation is started in the GPU Core1. Current flows through the GPU Core1 by the arithmetic operation; therefore, heat generation is centered around the region where the GPU Core1 is placed. Note that although the GPU Core1 is switched from the PG state into the state of supplying a power supply voltage in a period t4 shown in FIG. 6(B), a small amount of heat is generated because of a standby state.

The temperature of the region where the GPU Core1 is placed is raised again by heat generation. The region where the GPU Core2 is placed can be cooled by bringing the GPU Core2 into the PG state during the rise in the temperature of the region where the GPU Core1 is placed. Thus, the rise in the temperature of the GPU Core1 can be suppressed. As a result, a rise in the temperature of the arithmetic device as a whole can be suppressed, so that a cooling mechanism such as a fan can be eliminated.

Figure 7:
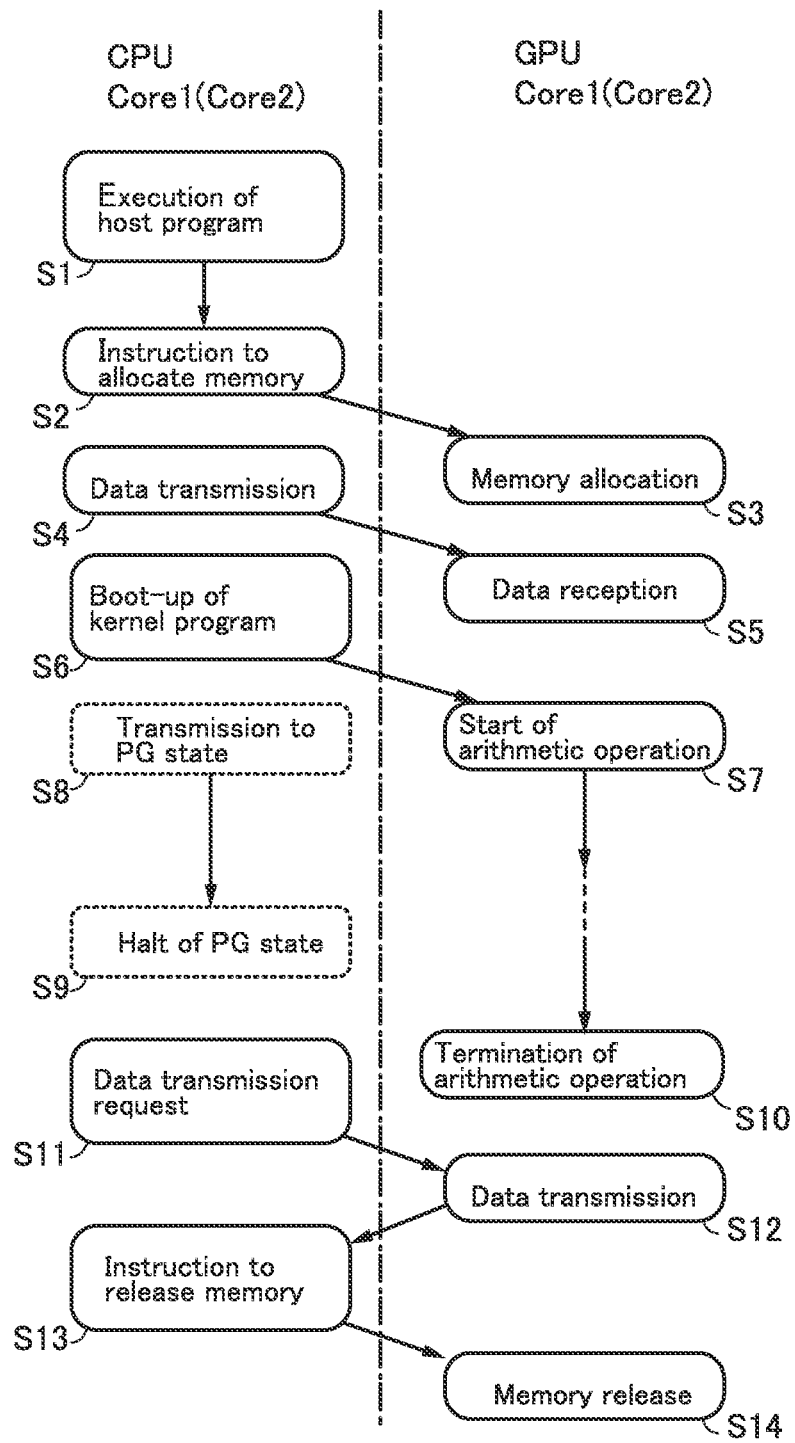
FIG. 7 A flowchart illustrating a configuration of one embodiment of the present invention.

FIG. 7 is a diagram showing an example of operations in the case where part of the arithmetic operation of a program executed by the CPU core 1 (or the CPU core 2; in the following description of FIG. 7, described as the CPU core 1) is executed by the GPU core 1 (or the GPU core 2; in the following description of FIG. 7, described as the GPU core 1).

The host program is executed by the CPU core 1 (CPU Core1) (Step S1). At this time, the GPU core 1 (GPU Core1) is in a PG state (a state where supply of a power supply voltage is stopped).

The CPU core 1, in the case where it confirms an instruction to allocate, in a device memory, a region for data needed in performing an arithmetic operation using the GPU (Step S2), allocates the region for the data on the device memory (Step S3).

Next, the CPU core 1 transmits input data from the main memory to the above-described device memory (Step S4). The above-described device memory receives the input data and stores the input data in the region allocated in Step S2 (Step S5).

In the case where the CPU core 1 confirms an instruction to boot up the kernel program (Step S6), the GPU core 1 is switched from the PG state to a state of performing an arithmetic operation (a state of being supplied with a power supply voltage) and starts execution of the kernel program (Step S7).

Immediately after the GPU core 1 starts the execution of the kernel program, the CPU core 1 may be switched from the state of performing an arithmetic operation to a PG state (Step S8). In that case, just before the GPU core terminates the execution of the kernel program, the CPU core 1 is switched from the PG state to a state of performing an arithmetic operation (Step S9). By bringing the CPU core 1 into a PG state during the period from Step S8 to Step S9, the power consumption and heat generation of the arithmetic device as a whole can be suppressed.

When the GPU core 1 terminates the execution of the kernel program, output data is stored in the above-described device memory (Step S10). After that, the GPU core 1 is switched from the state of performing an arithmetic operation to a PG state.

After the execution of the kernel program is terminated, in the case where the CPU core 1 confirms an instruction to transmit the output data stored in the device memory to the main memory (Step S11), the above-described output data is transmitted to the above-described main memory and stored in the above-described main memory (Step S12).

In the case where the CPU core 1 confirms an instruction to release the region for the data allocated on the device memory (Step S13), the region allocated on the above-described device memory is released (Step S14).

By repeating the operations from Step S1 to Step S14 described above, part of the arithmetic operation of the program executed by the CPU core 1 can be executed by the GPU core 1 while the power consumption and heat generation of the CPU core 1 and the GPU core 1 are suppressed.

Figure 8:
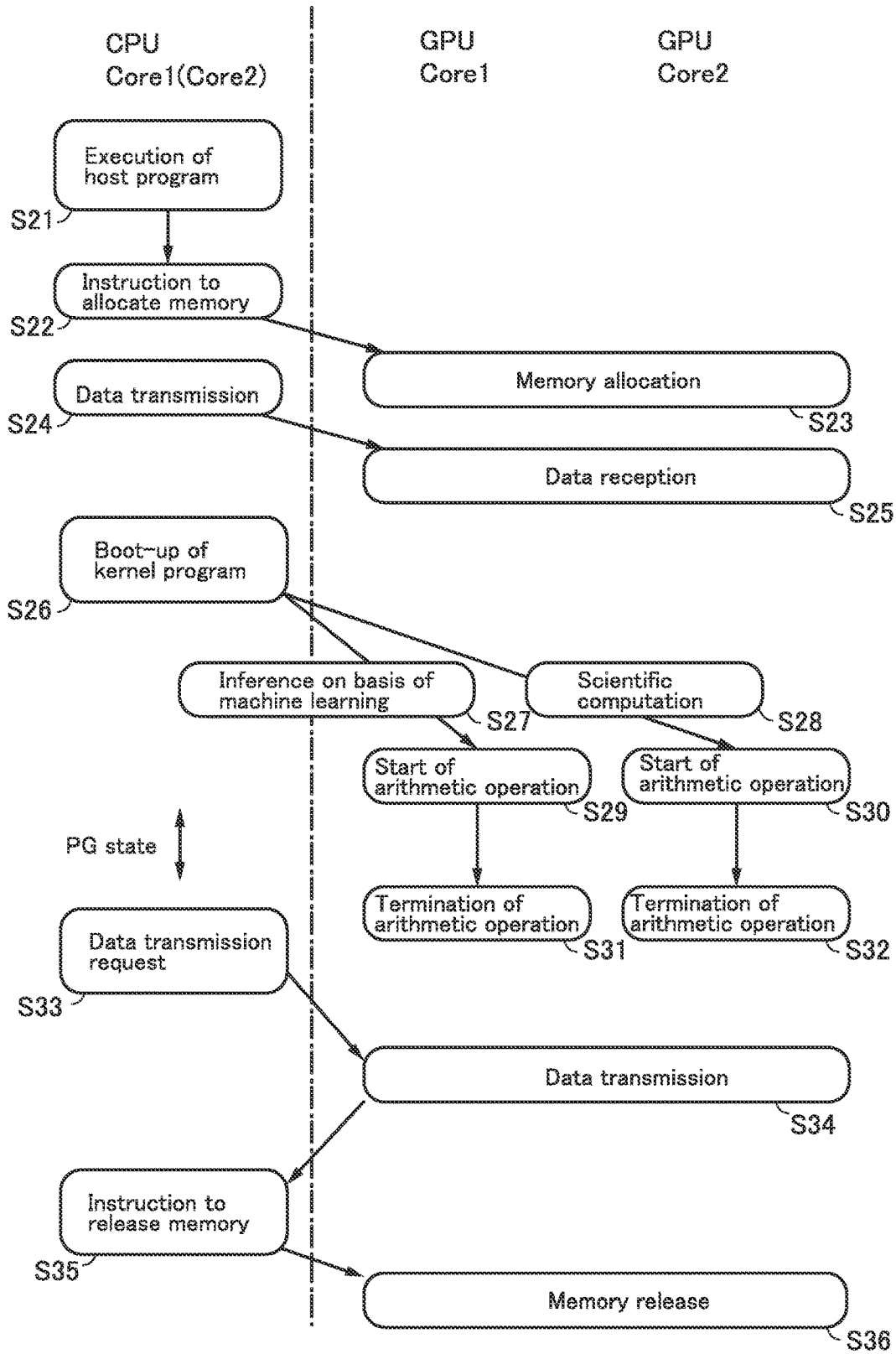
FIG. 8 A flowchart illustrating a configuration of one embodiment of the present invention.

In a case similar to FIG. 7, FIG. 8 is a diagram showing an example where part of the arithmetic operation of a program executed by the CPU core 1 (or the CPU core 2; in the following description of FIG. 8, described as the CPU core 1) is executed by the GPU cores, and GPU cores used for an arithmetic operation are switched in response to the kind of the arithmetic operation performed by the GPU cores. Here, one of the GPU cores (e.g., the GPU core 1) is a GPU core that can perform arithmetic processing of an analog value by quantization as digital data of two or more bits, and the other GPU core (e.g., the GPU core 2) is a GPU core that can perform arithmetic processing using a digital value.

For the operations from Step S21 to Step S25 illustrated in FIG. 8, description of the operations from Step S1 to Step S5 illustrated in FIG. 7 can be referred to.

In the case where the CPU core 1 (CPU Core1) confirms an instruction to boot up a kernel program (Step S26), the GPU core which is optimal for the execution of the arithmetic operation is selected in accordance with the kind of the kernel program. The selected GPU core is switched from the PG state to a state of performing an arithmetic operation and starts execution of the kernel program. After the execution of the kernel program is terminated, the GPU core is switched from the state of performing an arithmetic operation to a PG state. Note that the CPU core 1 may be brought into a PG state during a period in which the GPU core performs the arithmetic operation. With this configuration, the power consumption and heat generation of the arithmetic device as a whole can be suppressed.

For example, in the case where the kernel program is inference processing on the basis of machine learning (Step S27), the GPU core 1 (GPU Core1) is selected and starts execution of the kernel program (Step S29). When the execution of the kernel program is terminated, output data is stored on the device memory (Step S31). After that, the GPU core 1 is switched from the state of performing an arithmetic operation to a PG state.

In addition, for example, in the case where the kernel program is a scientific computation (Step S28), the GPU core 2 (GPU Core2) is selected and starts execution of the kernel program (Step S30). When the execution of the kernel program is terminated, output data is stored on the device memory (Step S32). After that, the GPU core 2 is switched from the state of performing an arithmetic operation to a PG state.

For the operations from Step S33 to Step S36 illustrated in FIG. 8, description of the operations from Step S11 to Step S14 illustrated in FIG. 7 can be referred to.

Through the above steps, part of the arithmetic operation of the program executed by the CPU core 1 can be executed by the GPU cores by switching of the GPU cores used for the arithmetic operation in response to the kind of the arithmetic operation performed by the GPU cores.

Figure 9:
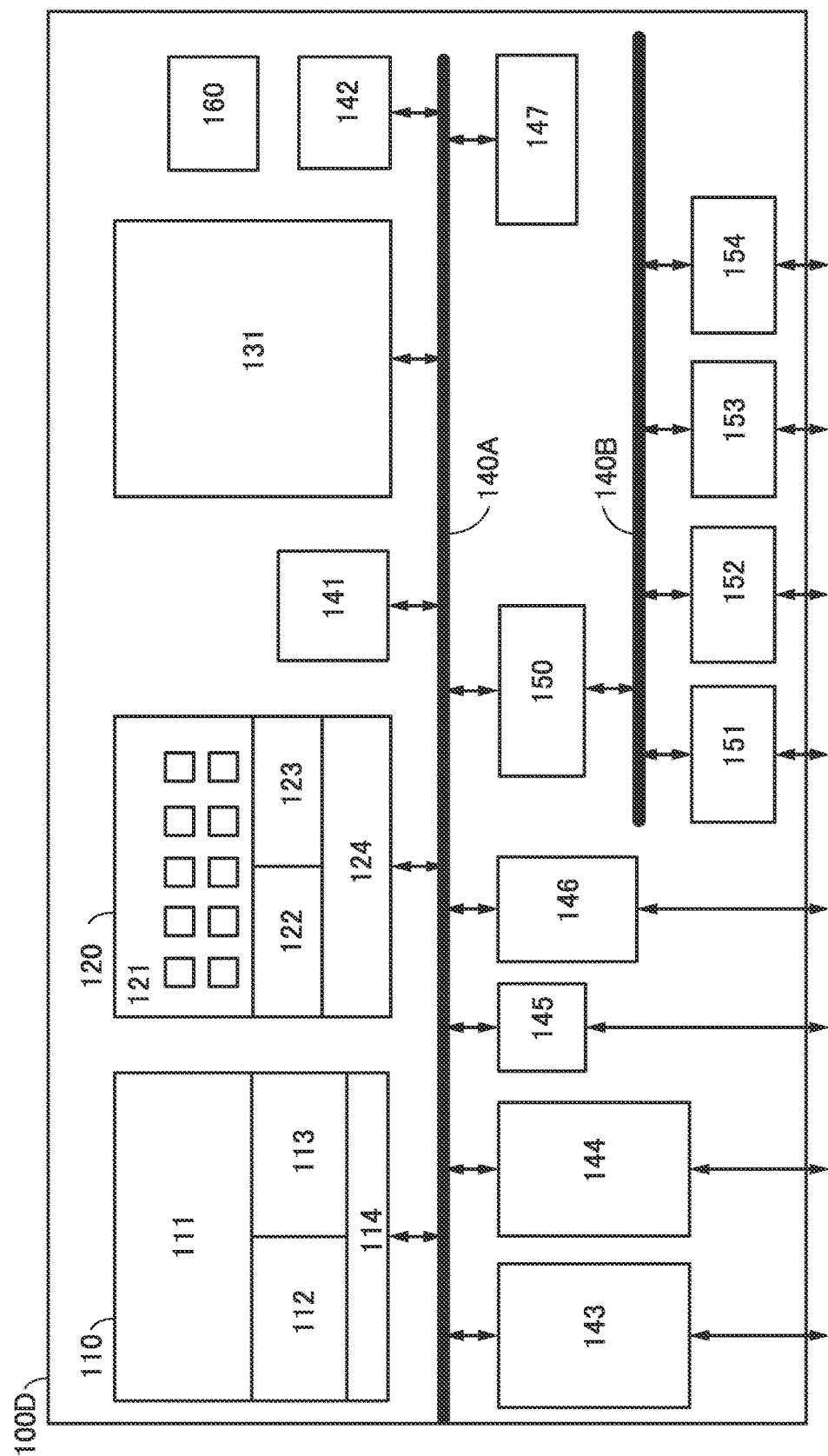
FIG. 9 A block diagram illustrating a configuration of one embodiment of the present invention.

FIG. 9 is an example of a block diagram illustrating a more specific configuration of an arithmetic device.

An arithmetic device 100D illustrated in FIG. 9 includes a CPU 110, a GPU 120, an on-chip memory 131, a DMAC (Direct Memory Access Controller) 141, a power supply circuit 160, a power management unit (PMU) 142, a security circuit 147, a memory controller 143, a DDR SDRAM (Double Data Rate Synchronous Dynamic Random Access Memory) controller 144, a USB (Universal Serial Bus) interface circuit 145, a display interface circuit 146, a bridge circuit 150, an interrupt control circuit 151, an interface circuit 152, a battery control circuit 153, and an ADC (Analog-to-digital converter)/DAC (Digital-to-analog converter) interface circuit 154.

The CPU 110 includes a CPU core 111, an instruction cache 112, a data cache 113, and a bus interface circuit 114. The GPU 120 includes a GPU core 121, an on-site memory 122, an ADC/DAC 123, and a control circuit 124.

The CPU core 111 includes a plurality of CPU cores. For example, a configuration including the CPU core 11A and the CPU core 11B can be employed as described with reference to FIG. 1. The instruction cache 112 can have a circuit configuration in which the instructions executed by the CPU core 11A and the CPU core 11B are temporarily stored. The data cache 113 can have a circuit configuration in which data processed by the CPU core 11A and the CPU core 11B or data obtained by the processing are temporarily stored. The bus interface circuit 114 can have a circuit configuration that can transmit and receive signals such as data and an address to and from a bus for connecting the CPU 110 and another circuit in the arithmetic device.

The GPU core 121 includes a plurality of GPU cores. For example, a configuration including the GPU core 33A and the GPU core 33B can be employed as described with reference to FIG. 1. The on-site memory 122 can have a circuit configuration in which data processed by the GPU core 33A and the GPU core 33B and the program executed by the GPU 30 are temporarily stored. The ADC/DAC 123 can have a circuit configuration for performing conversion between an analog value and a digital value on data to be processed. The control circuit 124 can have a circuit configuration for controlling the circuits in the GPU 120.

A high-speed bus 140A is a bus for transmitting and receiving at high speed various signals between the CPU 110, the GPU 120, the on-chip memory 131, the DMAC 141, the power management unit 142, the security circuit 147, the memory controller 143, the DDR SDRAM controller 144, the USB interface circuit 145, and the display interface circuit 146. As an example, an AMBA (Advanced Microcontroller Bus Architecture)-AHB (Advanced High-performance Bus) can be used as a bus.

The on-chip memory 131 has a circuit configuration for storing data or a program that is input/output into/from the circuit included in the arithmetic device 100D, for example, the CPU 110 or the GPU 120.

The DMAC 141 is a direct memory access controller. With the DMAC 141, a peripheral device other than the CPU 110 can access the on-chip memory 131 without through the CPU 110.

The power management unit 142 has a circuit configuration for controlling power gating of circuits such as the GPU cores or the CPU cores included in the arithmetic device 100D.

The security circuit 147 has a circuit configuration for improving confidentiality of signals in such a manner that signals are transmitted and received between the arithmetic device 100D and an external circuit after being encrypted.

The memory controller 143 has a circuit configuration for writing or reading out a program to be executed by the CPU 110 or the GPU 120 from a program memory outside the arithmetic device 100D.

The DDR SDRAM controller 144 has a circuit configuration for writing or reading out data into or from a main memory, such as a DRAM, outside the arithmetic device 100D.

The USB interface circuit 145 has a circuit configuration for transmitting and receiving data to and from a circuit provided outside the arithmetic device 100D through a USB port.

The display interface circuit 146 has a circuit configuration for transmitting and receiving data to and from a display device outside the arithmetic device 100D.

The power supply circuit 160 is a circuit for generating a voltage used in the arithmetic device 100D. For example, it is a circuit that generates a negative voltage supplied to a back gate of an os transistor for stabilizing electrical characteristics.

A low-speed bus 140B is a bus for transmitting and receiving at low speed various signals between the interrupt control circuit 151, the interface circuit 152, the battery control circuit 153, and the ADC/DAC interface circuit 154. As an example, an AMBA-APB (Advanced Peripheral Bus) can be used as the bus. Transmission and reception of various signals between the high-speed bus 140A and the low-speed bus 140B through the bridge circuit 150.

The interrupt control circuit 151 has a circuit configuration for performing interrupt processing in response to a request received from a peripheral device.

The interface circuit 152 has a circuit configuration for operating an interface such as a UART (Universal Asynchronous Receiver/Transmitter), an I2C (Inter-Integrated Circuit), or an SPI (Serial Peripheral Interface).

The battery control circuit 153 has a circuit configuration for transmitting and receiving data related to charging and discharging of a battery outside the arithmetic device 100D.

The ADC/DAC interface circuit 154 has a circuit configuration for transmitting and receiving data to and from a device outside the arithmetic device 100D that outputs an analog signal, such as a MEMS (Micro Electro Mechanical Systems) device.

Figure 10A:
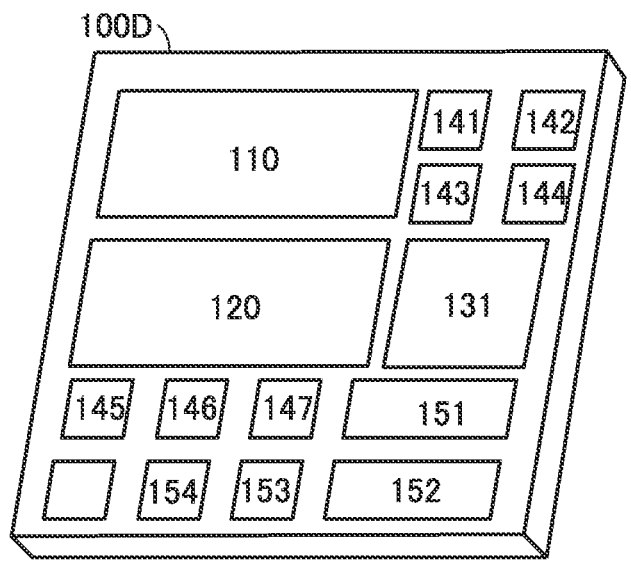
FIGS. 10A-10B Block diagrams illustrating configurations of one embodiment of the present invention.
Figure 10B:
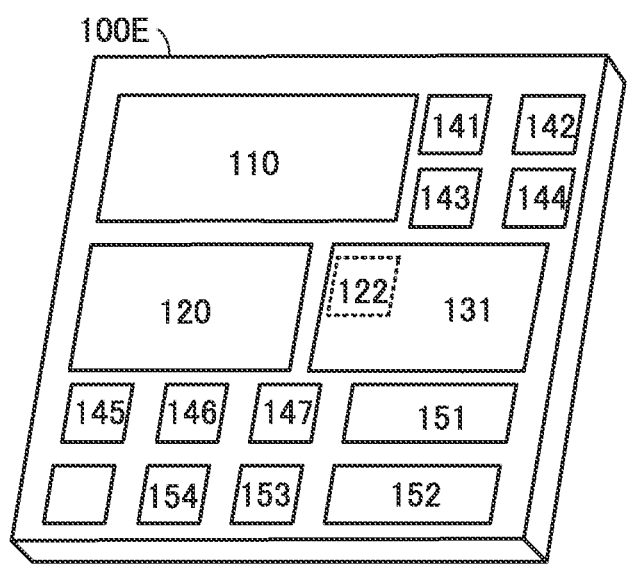

FIGS. 10(A) and 10(B) are diagrams each illustrating an arrangement example of the circuit blocks when they are made into an SoC. As in the arithmetic device 100D illustrated in FIG. 10(A), the components illustrated in the block diagram of FIG. 9 can be arranged on a chip by being divided into regions.

Note that the on-chip memory 131 and the on-site memory 122 included in the GPU 120, which are described in FIG. 9, can be configured with an os memory, for example, a NOSRAM. That is, the on-chip memory 131 and the on-site memory 122 have the same circuit configurations. Therefore, when the SoC is made, the on-chip memory 131 and the on-site memory 122 can be arranged in the same region by being integrated as in the arithmetic device 100E illustrated in FIG. 10(B).

According to one embodiment of the present invention described above, a novel arithmetic device and electronic device can be provided. Alternatively, according to one embodiment of the present invention, an arithmetic device and an electronic device having small power consumption can be provided. Alternatively, according to one embodiment of the present invention, an arithmetic device and an electronic device capable of high-speed operation can be provided. Alternatively, according to one embodiment of the present invention, an arithmetic device and an electronic device capable of suppressing heat generation can be provided.

Embodiment 2

In this embodiment, an example of a CPU including a CPU core capable of power gating will be described.

<<CPU 190>>

Figure 11:
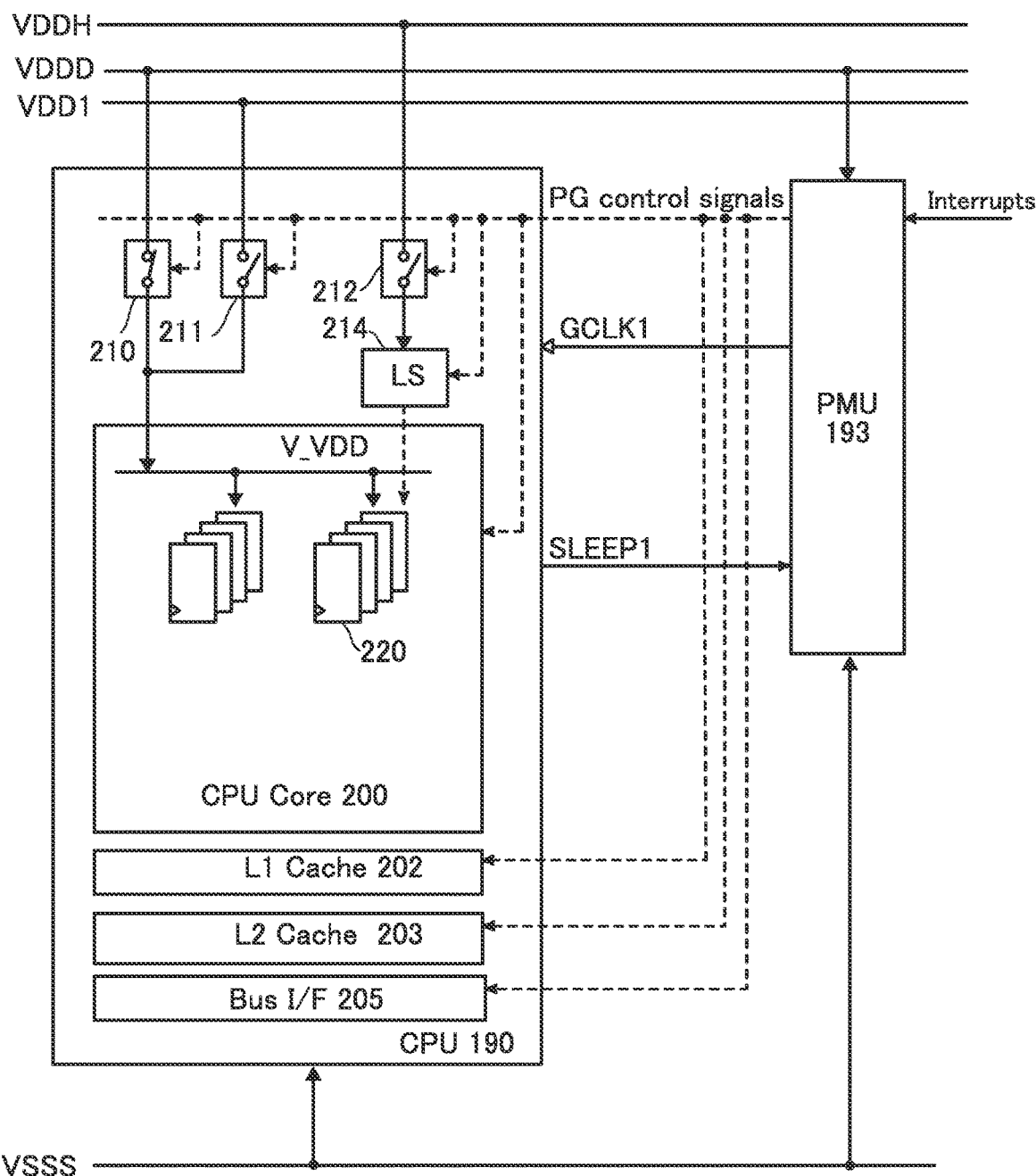
FIG. 11 A block diagram showing an example of a power gating mechanism of a CPU.

FIG. 11 illustrates a configuration example of a CPU 190. The CPU 190 includes a CPU core (CPU Core) 200, an L1 (level 1) cache memory device (L1 Cache) 202, an L2 cache memory device (L2 Cache) 203, a bus interface portion (Bus I/F) 205, power switches 210 to 212, and a level shifter (LS) 214. The CPU core 200 includes a flip-flop 220.

Through the bus interface portion 205, the CPU core 200, the L1 cache memory device 202, and the L2 cache memory device 203 are mutually electrically connected to one another.

A PMU 193 generates a clock signal GCLK1 and various PG (power gating) control signals in response to signals such as an interrupt signal (Interrupts) input from the outside and a signal SLEEP1 issued from the CPU 190. The clock signal GCLK1 and the PG control signal are input to the CPU 190. The PG control signal controls the power switches 210 to 212 and the flip-flop 220.

The power switch 210 and the power switch 211 control application of a voltage VDDD and a voltage VDD1 to a virtual power supply line V_VDD (hereinafter referred to as a V_VDD line), respectively. The power switch 212 controls application of a voltage VDDH to a virtual power supply line V_VDH (hereinafter referred to as a V_VDH line). A voltage VSSS is input to the CPU 190 and the PMU 193 without through the power switches. The voltage VDDD is input to the PMU 193 without through the power switches.

The voltages VDDD and VDD1 are drive voltages for a CMOS circuit. The voltage VDD1 is lower than the voltage VDDD and is a drive voltage in a sleep state. The voltage VDDH is a drive voltage for an os transistor and is higher than the voltage VDDD.

The L1 cache memory device 202, the L2 cache memory device 203, and the bus interface portion 205 each include at least a power domain capable of power gating. The power domain capable of power gating is provided with one or a plurality of power switches. These power switches are controlled by the PG control signal.

The flip-flop 220 is used for a register. The flip-flop 220 is provided with a backup circuit. The backup circuit is configured with an os memory. The flip-flop 220 is described below.

<Flip-Flop 220>

Figure 12A:
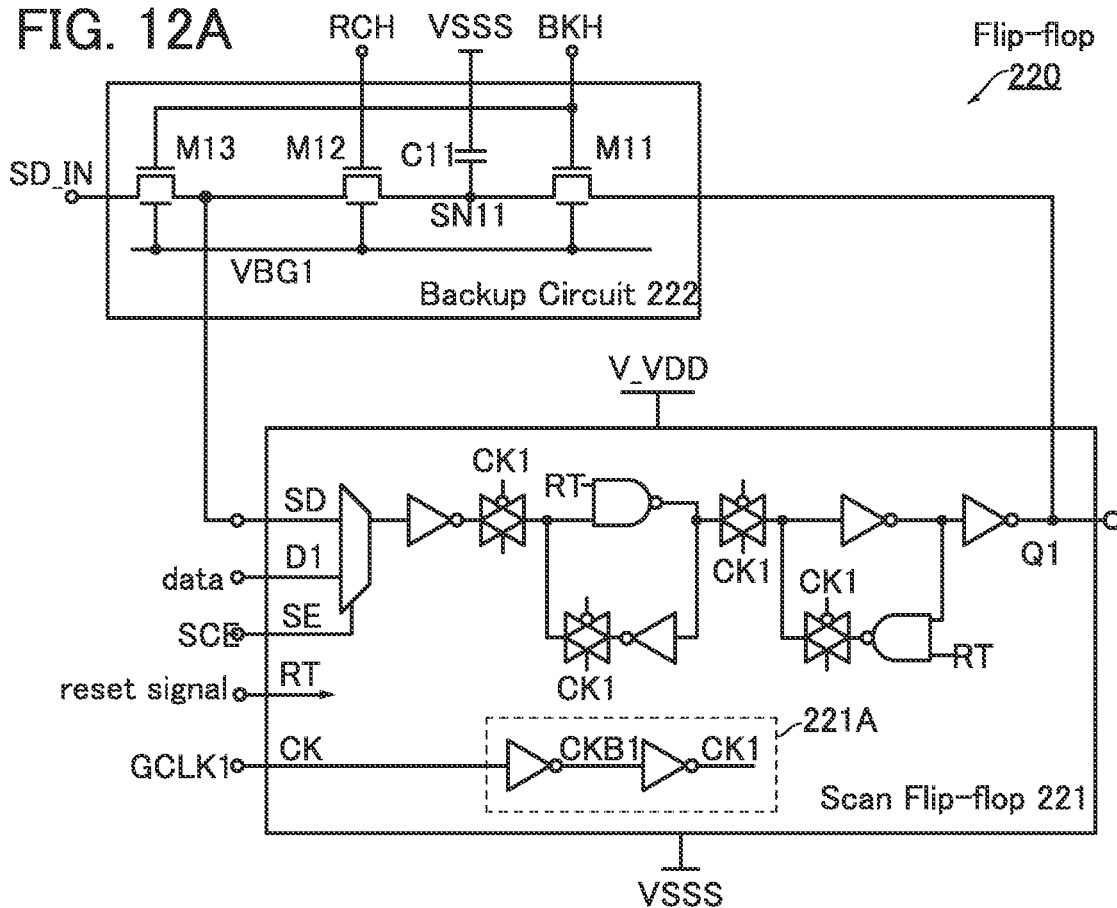
FIGS. 12A-12B A: A circuit diagram illustrating a configuration example of a flip-flop. B: A diagram showing an example of a stacked-layer structure of a flip-flop.

FIG. 12 shows a circuit configuration example of the flip-flop 220. The flip-flop 220 includes a scan flip-flop 221 and a backup circuit 222.

(Scan Flip-Flop 221)

The scan flip-flop 221 includes nodes D1, Q1, SD, SE, RT, and CK and a clock buffer circuit 221A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 221A. Respective analog switches in the scan flip-flop 221 are electrically connected to nodes CK1 and CKB1 of the clock buffer circuit 221A. The node RT is a reset signal input node.

The signal SCE is a scan enable signal, which is generated in the PMU 193. The PMU 193 generates signals BK and RC. The level shifter 214 level-shifts the signals BK and RC to generate signals BKH and RCH. The signals BK and RC are a backup signal and a recovery signal.

The circuit configuration of the scan flip-flop 221 is not limited to that in FIG. 12. A scan flip-flop prepared in a standard circuit library can be applied.

(Backup Circuit 222)

The backup circuit 222 includes nodes SD_IN and SN11, transistors M11 to M13, and a capacitor C11.

The node SD_IN is a scan test data input node and is electrically connected to the node Q1 of the scan flip-flop 221. The node SN11 is a retention node of the backup circuit 222. The capacitor C11 is a storage capacitor for retaining the voltage of the node SN11.

The transistor M11 controls continuity between the node Q1 and the node SN11. The transistor M12 controls continuity between the node SN11 and the node SD. The transistor M13 controls continuity between the node SD_IN and the node SD. The on/off of the transistors M11 and M13 is controlled by the signal BKH, and the on/off of the transistor M12 is controlled by the signal RCH.

The transistors M11 to M13 are os transistors each having a back gate like the transistor M1 described later. The back gates of the transistors M11 to M13 are electrically connected to a power supply line for supplying a voltage VBG1.

At least the transistors M11 and M12 are preferably os transistors. Because of an extremely small off-state current, which is a feature of the os transistor, a decrease in the voltage of the node SN11 can be suppressed and almost no power is consumed to retain data; therefore, the backup circuit 222 has a nonvolatile characteristic. Data is rewritten by charging and discharging of the capacitor C11; hence, there is theoretically no limitation on rewrite cycles of the backup circuit 222, and data can be written and read out with low energy.

Figure 12B:
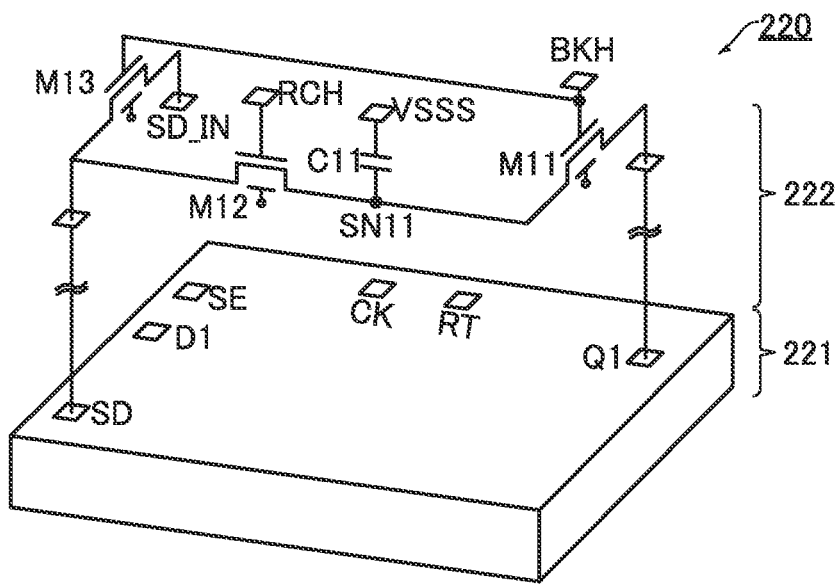

All of the transistors in the backup circuit 222 are extremely preferably os transistors. As illustrated in FIG. 12(B), the backup circuit 222 can be stacked on the scan flip-flop 221 configured with a silicon CMOS circuit.

The number of elements in the backup circuit 222 is much smaller than the number of elements in the scan flip-flop 221; thus, there is no need to change the circuit configuration and layout of the scan flip-flop 221 in order to stack the backup circuit 222. That is, the backup circuit 222 is a backup circuit that has very broad utility. In addition, the backup circuit 222 can be provided in a region where the scan flip-flop 221 is formed; thus, even when the backup circuit 222 is incorporated, the area overhead of the flip-flop 220 can be zero. Thus, the backup circuit 222 is provided in the flip-flop 220, whereby power gating of the CPU core 200 is enabled. The power gating of the CPU core 200 is enabled with high efficiency owing to little energy necessary for the power gating.

When the backup circuit 222 is provided, parasitic capacitance due to the transistor M11 is added to the node Q1; however, the parasitic capacitance is lower than parasitic capacitance due to a logic circuit connected to the node Q1; thus, there is no influence of the parasitic capacitance on the operation of the scan flip-flop 221. That is, even when the backup circuit 222 is provided, the performance of the flip-flop 220 does not substantially decrease.

<Low Power Consumption State>

The CPU core 200 can be set to a clock gating state, a power gating state, or a resting state as a low power consumption state. The PMU 193 selects the low power consumption mode of the CPU core 200 on the basis of the interrupt signal, the signal SLEEP1, and the like. For example, in the case of transition from a normal operation state to a clock gating state, the PMU 193 stops generation of the clock signal GCLK1.

For example, in the case of transition from a normal operation state to a resting state, the PMU 193 performs voltage and/or frequency scaling. For example, when the voltage scaling is performed, the PMU 193 turns off the power switch 210 and turns on the power switch 211 to input the voltage VDD1 to the CPU core 200. The voltage VDD1 is a voltage at which data in the scan flip-flop 221 is not lost. When the frequency scaling is performed, the PMU 193 reduces the frequency of the clock signal GCLK1.

In the case where the CPU core 200 transitions from a normal operation state to a power gating state, data in the scan flip-flop 221 is backed up to the backup circuit 222. When the CPU core 200 is returned from the power gating state to the normal operation state, recovery operation of writing back data in the backup circuit 222 to the scan flip-flop 221 is performed.

Figure 13:
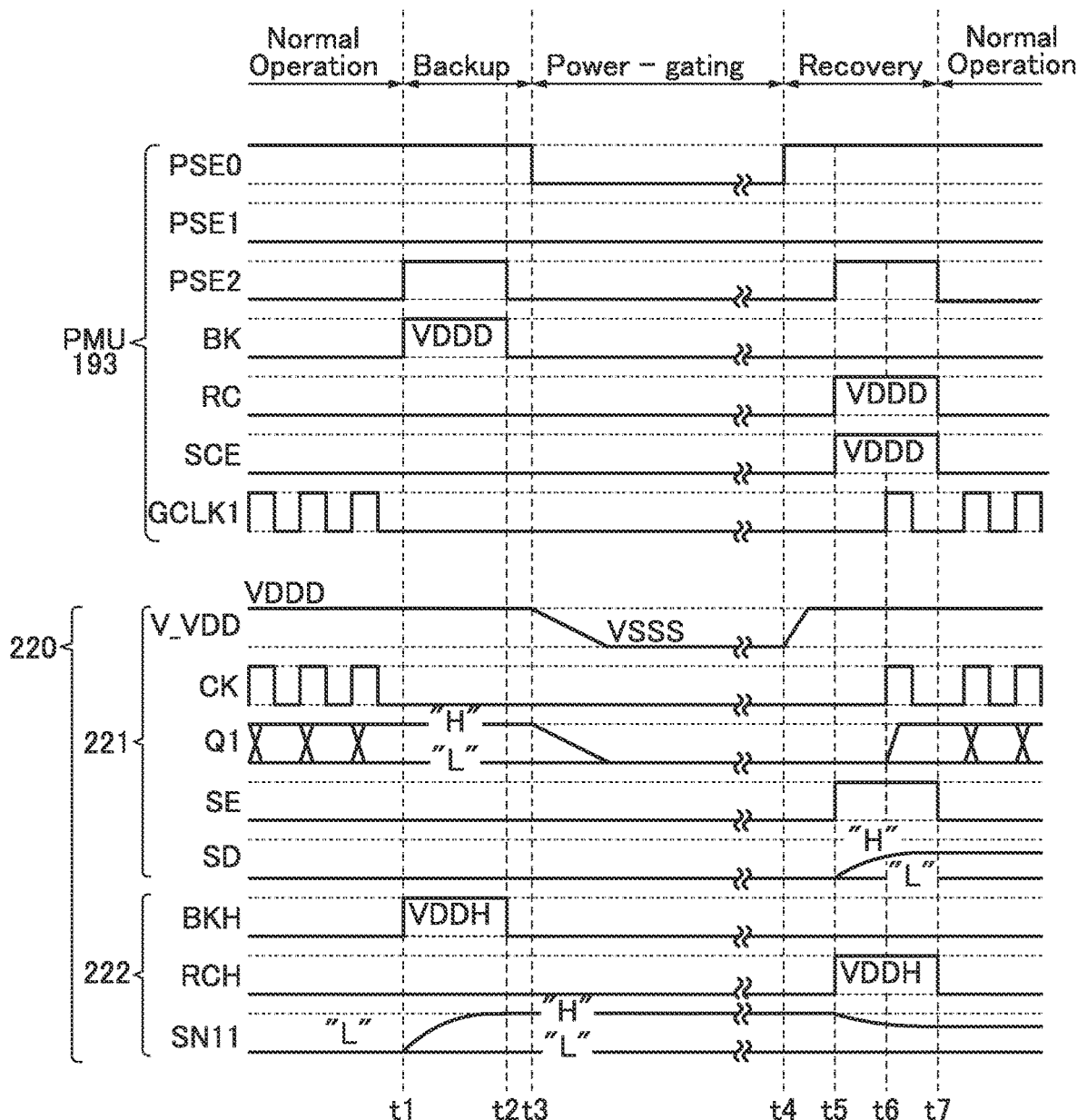
FIG. 13 A timing chart showing an operation example of a flip-flop.

FIG. 13 illustrates an example of the power gating sequence of the CPU core 200. Note that in FIG. 13, t1 to t7 represent the time. Signals PSE0 to PSE2 are control signals of the power switches 210 to 212, which are generated in the PMU 193. When the signal PSE0 is at "H"/"L", the power switch 210 is on/off. The same applies also to the signals PSE1 and PSE2.

(Normal Operation)

Until time t1, normal operation is performed. The power switch 210 is on, and the voltage VDDD is input to the CPU core 200. The scan flip-flop 221 performs normal operation. At this time, the level shifter 214 does not need to be operated; thus, the power switch 212 is off and the signals SCE, BK, and RC are each at "L". The node SE is at "L"; thus, the scan flip-flop 221 stores data in the node Dl. Note that in the example of FIG. 13, the node SN11 of the backup circuit 222 is at "L" at time t1.

(Backup)

At time t1, the PMU 193 stops the clock signal GCLK1 and sets the signals PSE2 and BK to "H". The level shifter 214 becomes active and outputs the signal BKH at "H" to the backup circuit 222.

The transistor M11 in the backup circuit 222 is turned on, and data in the node Q1 of the scan flip-flop 221 is written to the node SN11 of the backup circuit 222. When the node Q1 of the scan flip-flop 221 is at "L", the node SN11 remains at "L", whereas when the node Q1 is at "H", the node SN11 becomes "H".

The PMU 193 sets the signals PSE2 and BK to "L" at time t2 and sets the signal PSE0 to "L" at time t3. The state of the CPU core 200 transitions to a power gating state at time t3. Note that at the timing when the signal BK falls, the signal PSE0 may fall.

(Power Gating)

When the signal PSE0 is set to "L, data in the node Q1 is lost because the voltage of the V_VDD line decreases. The node SN11 retains data that is stored in the node Q1 at time t3

(Recovery)

When the PMU 193 sets the signal PSE0 to "H" at time t4, the power gating state transitions to a recovery state. Charging of the V_VDD line starts, and the PMU 193 sets the signals PSE2, RC and SCE to "H" in a state where the voltage of the V_VDD line becomes VDDD (at time t5).

The transistor M12 is turned on, and electric charge in the capacitor C11 is distributed to the node SN11 and the node SD. When the node SN11 is at "H", the voltage of the node SD increases. The node SE is at "H", and thus, data in the node SD is written to a latch circuit on the input side of the scan flip-flop 221. When the clock signal GCLK1 is input to the node CK at time t6, data in the latch circuit on the input side is written to the node Q1. That is, data in the node SN11 is written to the node Ql.

When the PMU 193 sets the signals PSE2, SCE and RC to "L" at time t7, the recovery operation is terminated.

The backup circuit 222 using an os transistor is extremely suitable for normally-off computing because both dynamic and static power consumption are low. Even when the flip-flop 220 is mounted, a decrease in the performance and an increase in the dynamic power of the CPU core 200 can be made hardly to occur.

Note that the CPU core 200 may include a plurality of power domains capable of power gating. In the plurality of power domains, one or a plurality of power switches for controlling voltage input are provided. In addition, the CPU core 200 may include one or a plurality of power domains where power gating is not performed. For example, the power domain where power gating is not performed may be provided with a power gating control circuit for controlling the flip-flop 220 and the power switches 210 to 212.

Note that the application of the flip-flop 220 is not limited to the CPU 190. In the arithmetic device, the flip-flop 220 can be used as the register provided in a power domain capable of power gating.

Embodiment 3

In this embodiment, a specific configuration example of an integrated circuit (hereinafter referred to as an osAI chip) which is SoC of the arithmetic device described in the above embodiments will be described. An osAI chip (an analog osAI chip) that retains an analog value in a data retention circuit and performs arithmetic processing (also referred to as analog arithmetic operation) is described below. Note that the analog osAI chip can be combined with an osAI chip (a programmable osAI chip) that retains a digital value in a data retention circuit and performs arithmetic processing (also referred to as digital arithmetic operation), which will be described in detail in Embodiment 4, to obtain one SoC osAI chip.

<<Analog osAI Chip>>

Here, an osAI chip 400 capable of super parallel computing utilizing an analog arithmetic operation is described. The osAI chip 400 is extremely advantageous in a full connected neural network (FCNN). In order to facilitate understanding of a configuration example and an operation method example of the osAI chip 400, it is assumed that the FCNN is configured with circuits. The FCNN includes one hidden layer. The unit numbers of an input layer, the hidden layer, and an output layer are 1024, 128, and 32, respectively. As the activation function, ReLU (Rectified Linear Unit) is used. The FCNN of the osAI chip 400 is used for recognition of handwritten characters and general-purpose AI, for example.

Figure 14:
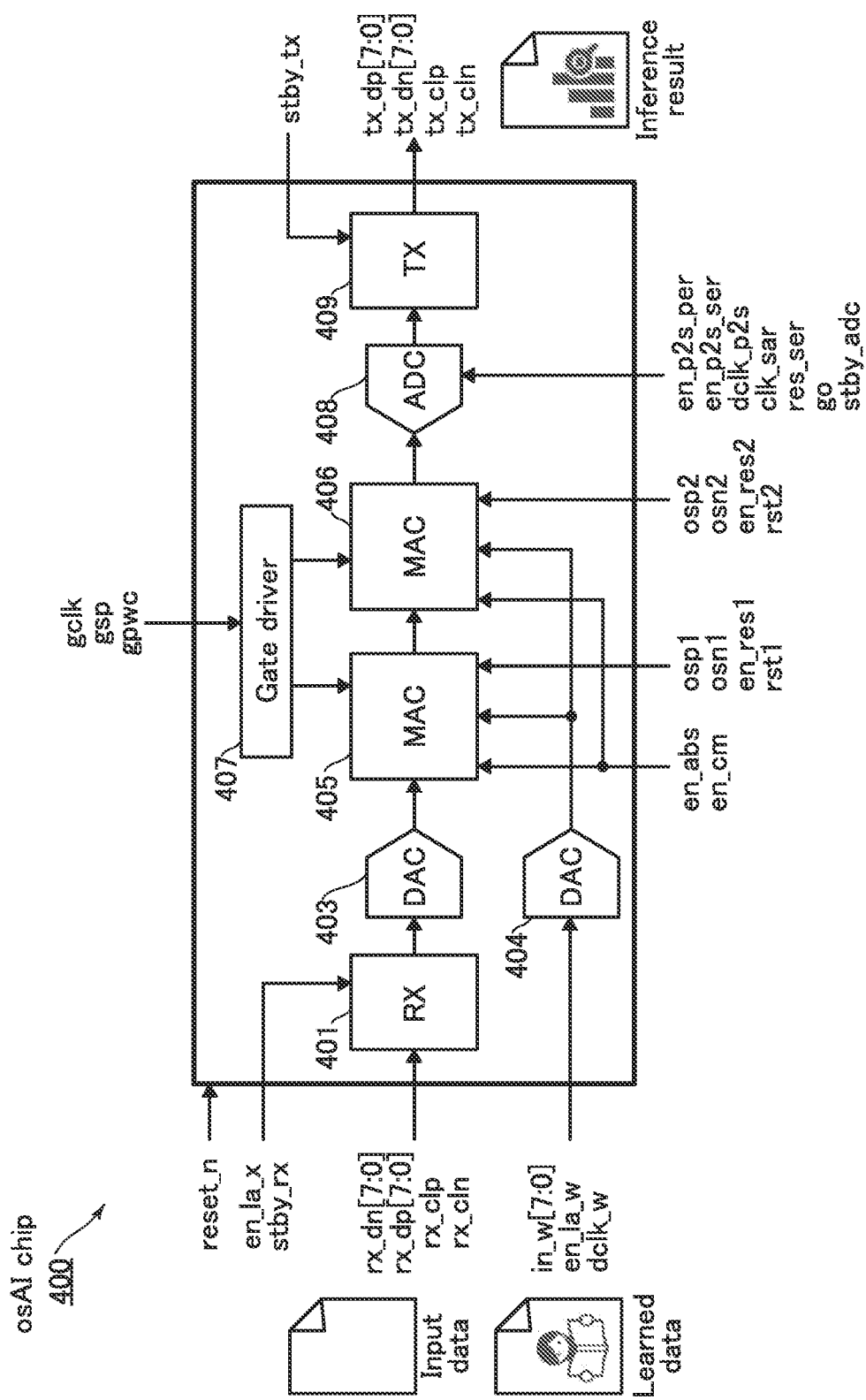
FIG. 14 A functional block diagram showing a configuration example of an osAI chip.

FIG. 14 is a functional block diagram showing a configuration example of the osAI chip 400. The osAI chip 400 illustrated in FIG. 14 includes a receiver (RX) 401, digital-to-analog converters (DAC) 403 and 404, product-sum operation circuit (MAC) arrays (illustrated as MAC) 405 and 406, a gate driver 407, an analog-to-digital converter (ADC) 408, and a transmitter (TX) 409.

A method for transmitting data of the osAI chip 400 is a differential transmission method. For example, an LVDS (Low Voltage Differential Signaling) receiver is used as the receiver 401, and an LVDS transmitter is used as the transmitter 409.

A reset signal reset_n resets the osAI chip 400.

Data in_w[7:0] is learned data (Learned data). For example, it is an 8-bit digital signal representing a weight coefficient. The DAC 404 converts the data in_w[7:0] into analog data in response to an enable signal en_la_w and a clock signal dclk_w. The gate driver 407 controls writing of the analog data into the MAC arrays 405 and 406. A clock signal gclk, a pulse width control signal gpwc, and a start pulse signal gsp are input to the gate driver 407.

Data processed by the osAI chip 400 is 8-bit digital data and is input by a differential transmission method. For example, the LVDS receiver is used as the receiver 401. The receiver 401 converts input data rx_dp[7:0] and rx_dn[7:0] into single-ended 8-bit data in response to differential clock signals rx_clp and rx_cln. The DAC 403 converts the 8-bit data into analog data. The analog data output from the DAC 403 is successively written into the MAC array 405.

<MAC Arrays 405 and 406>

Figure 15:
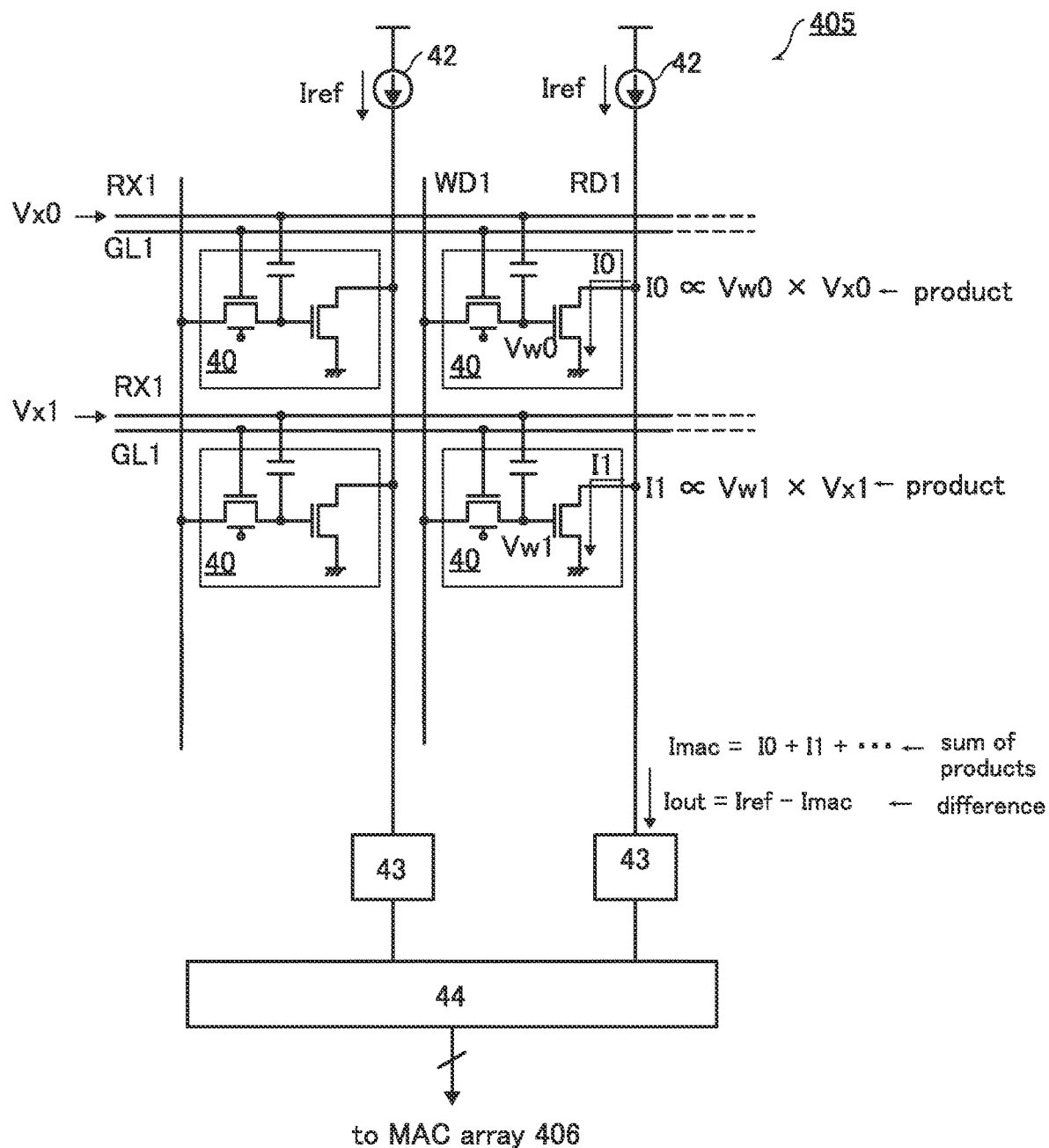
FIG. 15 A circuit diagram showing a configuration example of an MAC array.

A circuit configuration example of the MAC array 405 is described with reference to FIG. 15. The MAC array 405 is provided with multiplier circuits 40 in 1024 rows and 144 columns. The multiplier circuit 40 has the same circuit configuration as an os memory 382 in FIG. 27(B). That is, the multiplier circuit 40 has both functions of an arithmetic circuit and a nonvolatile local memory circuit that stores a weight coefficient. Accordingly, the osAI chip 400 can achieve a super parallel arithmetic operation with an extremely small number of transistors as compared with the GPU. A reduction in the number of transistors results in a reduction in size of the osAI chip 400 and power consumption.

The MAC array 405 is provided with a gate line GL1 and data lines RX1, WD1, and RD1 in response to the arrangement of the multiplier circuits 40. The data line WD1 is a wiring for inputting weight coefficient data to the multiplier circuit 40. Analog data is input to the data line WD1 from the DAC 404. The gate line GL1 is a signal line for selecting the multiplier circuit 40 to which the weight coefficient is input, and the gate line GL1 is driven by the gate driver 407.

When a weight coefficient data w0 is written to the multiplier circuit 40, the voltage of a retention node of the multiplier circuit 40 (a gate of a readout transistor) becomes a voltage Vw0 corresponding to the weight coefficient data.

The data line RX1 is a wiring for inputting data processed by CFNN. Analog data is input to the data line RX1 from the DAC 403. The arithmetic operation result of the multiplier circuit 40 is read out to the data line RD1. A current supply 42 and an offset circuit 43 are electrically connected to the data line RD1.

Current I0 flowing through the multiplier circuit 40 is proportional to the product of the voltage Vw0 of the retention node and a voltage Vx0 of the data line RX1. That is, the current I0 represents the product of the weight coefficient and the input data. Similarly, the current I1 is proportional to the product of a voltage Vw1 and a voltage Vx1 of the retention node. That is, the multiplier circuit 40 can calculate the product of the weight coefficient data and input data.

To one data line RD1, 1024 multiplier circuits 40 are electrically connected. The current supply 42 generates a reference current Iref. A current Iout input to the offset circuit 43 is a difference between the reference current Iref and a current Imac. The current Imac is a total amount of current flowing through the 1024 multiplier circuits 40 and represents a value of the sum of products of the weight coefficient and the input data. By obtaining the difference between the reference current Iref and the Imac, the noise components of the current Iout can be reduced.

The offset circuit 43 converts the current Iout into a voltage Vout and obtains a difference between the reference voltage Vref and the voltage Vout. Accordingly, the noise components of the voltage Vout are reduced. By the offset circuit 43, a differential voltage between the Vref and the Vout is amplified and output to the activation function circuit 44. The activation function circuit 44 outputs the processed data to the MAC array 406.

Note that 16 columns of the 144 columns in the MAC array 405 do not contribute to generation of the current Iout and retain reference data used for a product-sum operation.

The MAC array 406 has a configuration similar to that of the MAC array 405. The multiplier circuits 40 are arranged in 36 rows and 128 columns. In the MAC array 406, 4 rows of the 36 rows do not contribute to the generation of the current Iout and are used for retaining reference data.

An enable signal en_cm illustrated in FIG. 14 is an enable signal for the current supplies 42 of the MAC arrays 405 and 406. An enable signal en_abs is an enable signal for the offset circuits 43 of the MAC arrays 405 and 406; signals osp1, osn1, and en_res1 are control signals for the offset circuit 43 of the MAC array 405; and signals osp2, osn2, and en_res2 are control signals for the offset circuit 43 of the MAC array 406.

<ADC 408 and Transmitter 409>

To the ADC 408, 32 pieces of analog data are input in parallel from the MAC array 406. The ADC 408 is provided with a register in an output stage to perform a serial-parallel conversion. The ADC 408 outputs 8-bit digital data of one channel.

A signal clk_sar, a signal res_ser, a signal go, and a signal stby_adc are a clock signal, a reset signal, an enable signal, and a standby signal for the ADC 408, respectively. A signal dclk_p2s, a signal en_p2s_per, and a signal en_p2s_ser are a clock signal, a latch signal, and an output enable signal for the register, respectively. The ADC 408, to which 32 pieces of analog data are input, outputs the 8-bit digital data to the transmitter 409. A signal stby_tx is a standby signal for the transmitter 409.

In response to the signal dclk_p2s, the transmitter 409 converts the 8-bit digital data into data tx_dp[7:0] and tx_dn[7:0] each in a differential format to be output and converts the signal dclk_p2s into clock signals tx_clp and tx_cln each in a differential format to be output. The differential data tx_dp[7:0] and tx_dn[7:0] are 32 kinds of inference data obtained by FCNN.

Since the input and output data of the MAC arrays 405 and 406 are analog data, the numbers of wirings of the MAC arrays 405 and 406 can be significantly reduced as compared with the case where the input/output data are digital data. The multiplier circuit 40 does not read data at the time of an arithmetic operation because of including a multiplier function and a function of retaining the weight coefficient data. That is, the arithmetic circuit 40 substantially does not have time penalty and power penalty in data communication.

A GPU is known as a processor having parallel processing architecture. In a GPU, as well as in a CPU, data communication between an arithmetic portion and a memory portion is a bottleneck for arithmetic efficiency. In contrast, the osAI chip 400 does not have such a problem.

The multiplier circuit 40 has the same circuit configuration as a 2T gain cell, and can perform multiplication of analog data with a small number of transistors. Therefore, the osAI chip 400 capable of super parallel arithmetic processing with low power consumption can be provided with the product-sum operation portion configured with a number of multiplier circuits 40. For example, in the case where the number of multiplier circuits 40 is approximately $10^6$ to $10^8$ and the operation frequency is 3 MHz or 30 MHz, the arithmetic performance of the osAI chip 400 is approximately 3 TOPS (Tera Operations Per Second) to 3 POPS (Peta OPS).

Embodiment 4

<<Programmable osAI Chip>>

An osAI chip 450 shown here can configure a programmable neural network. The format of data calculated by the osAI chip 450 is digital. The arithmetic circuit of the osAI chip 450 includes a dedicated nonvolatile local memory circuit, and the nonvolatile local memory is configured with an os memory. The neural network configured on the osAI chip 450 can be used as various kinds of image processing (e.g., noise removal and an increase in resolution), object recognition, and general-purpose AI.

Figure 16:
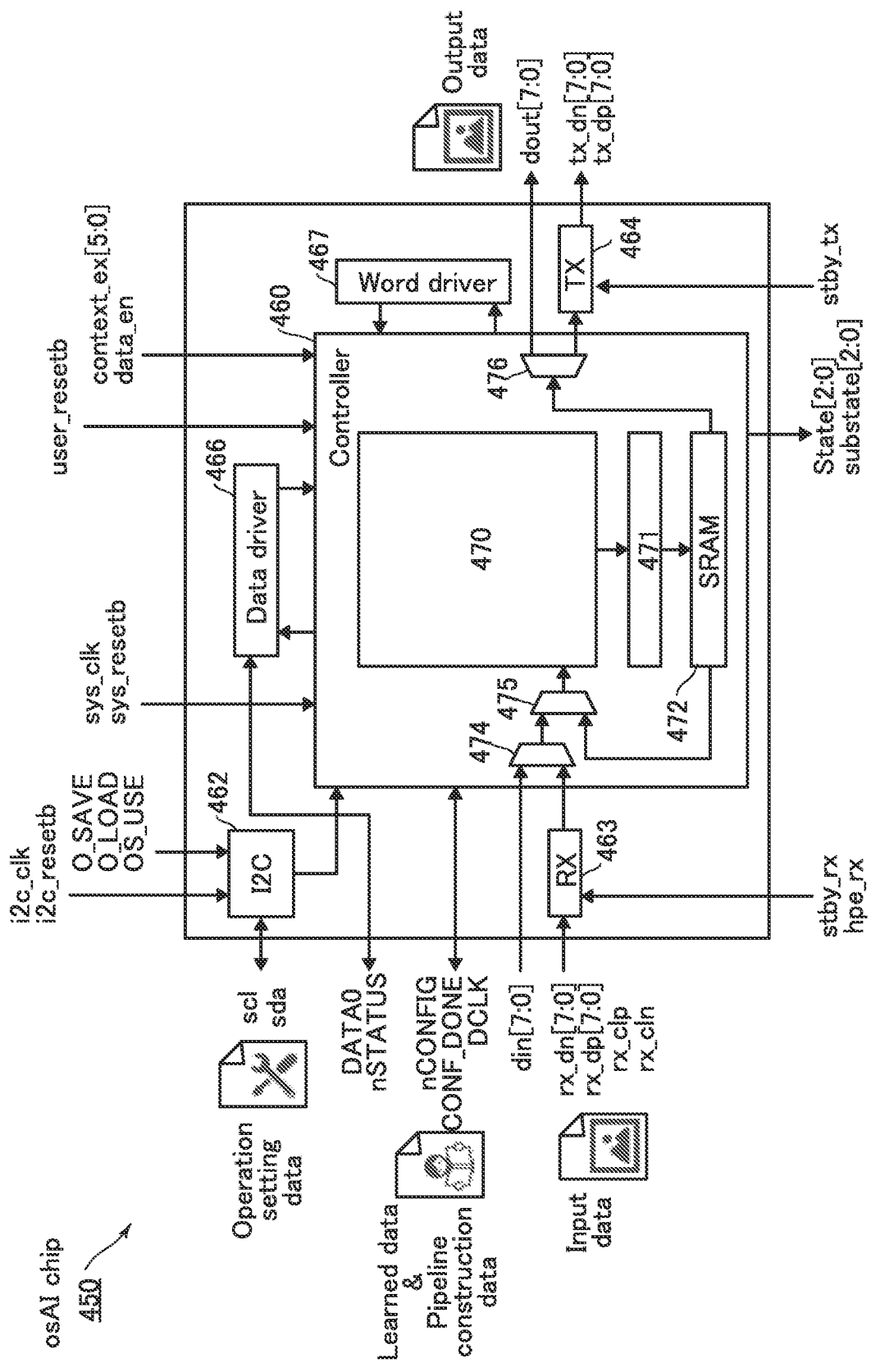
FIG. 16 A functional block diagram showing a configuration example of an osAI chip.

FIG. 16 is a functional block diagram showing a configuration example of the osAI chip 450. The osAI chip 450 includes a controller 460, an I2C module (I2C) 462, a receiver (RX) 463, a transmitter (TX) 464, a data driver 466, and a word driver 467. The controller 460 includes an arithmetic circuit array 470, an arithmetic portion 471, an SRAM 472, selectors 474 and 475, and a demultiplexer 476.

Examples of data input to the osAI chip 450 include operation setting data, learned data, pipeline construction data, and data processed by the arithmetic circuit array 470 (Input data). The learned data and the pipeline construction data are input to the osAI chip 450 as the configuration data of the controller 460.

Data sda is serial operation setting data, which is written into the I2C module 462. The I2C module 462 outputs the written operation setting data to the controller 460. A signal i2c_clk, a signal i2c_resetb, and a signal scl are an I2C controller clock signal, an I2C reset signal, and an I2C clock signal, respectively. Signals O_SAVE, O_LOAD, and OS_USE are used to control backup of the operation setting data.

Data DATA0 is input to the data driver 466. The data DATA0 is configuration data. A signal nSTATUS is output from the data driver 466. The signal nSTATUS is a signal which represents a configuration state.

As a method for transmitting data to the osAI chip 450, a single-ended method and an LVDS method can be employed. Data din[7:0] is single-ended input data, which is input to the selector 474. The receiver 463 has a configuration similar to that of the receiver of the osAI chip 400, and converts differential input data rx_dp[7:0] and rx_dn[7:0] into single-ended data rx_ds[7:0], which is output to the selector 474, in response to differential clock signals rx_clp and rx_cln. Signals stby_rx and hpe_rx are standby signals of the receiver 463.

Signals nCONFIG and DCLK are input to the controller 460, and the controller 460 outputs a signal CONF_DONE. The signal nCONFIG and the signal DCLK are a configuration start signal and a configuration clock signal, respectively. The signal CONF_DONE is a signal representing completion of the configuration.

A signal sys_clk, a signal sys_resetb, a signal user_resetb, and a signal context_ex[5:0] are a system clock signal, a system reset signal, a user reset signal, and an external context signal, respectively. A signal data_en is a signal for setting a period during which transmission of input data to the controller 460 is executed. These signals are input to the controller 460. The controller 460 outputs signals State[2:0] and substate[2:0]. The signal State[2:0] and the signal substate[2:0] represent an internal state and a sub-state of the controller 460, respectively.

Output data of the selector 475 is input to the arithmetic circuit array 470. The arithmetic circuit array 470 outputs the processed data to the arithmetic portion 471. Output data of the arithmetic portion 471 is temporarily stored in the SRAM 472. The data read out from the SRAM 472 is output to the selector 475 and the demultiplexer 476. The selector 475 outputs either one of the output data of the selector 474 and the output data of the SRAM 472 to the arithmetic circuit array 470.

The demultiplexer 476 has a function of selecting the output format of data. One of the output data of the demultiplexer 476 is output to the outside of the osAI chip 450 as single-ended data dout[7:0]. The other output data, which is processed by the transmitter 464, is converted into differential data tx_dp[7:0] and tx_dn[7:0], which are output to the outside of the osAI chip 450.

<Arithmetic Circuit Array 470>

Figure 17:
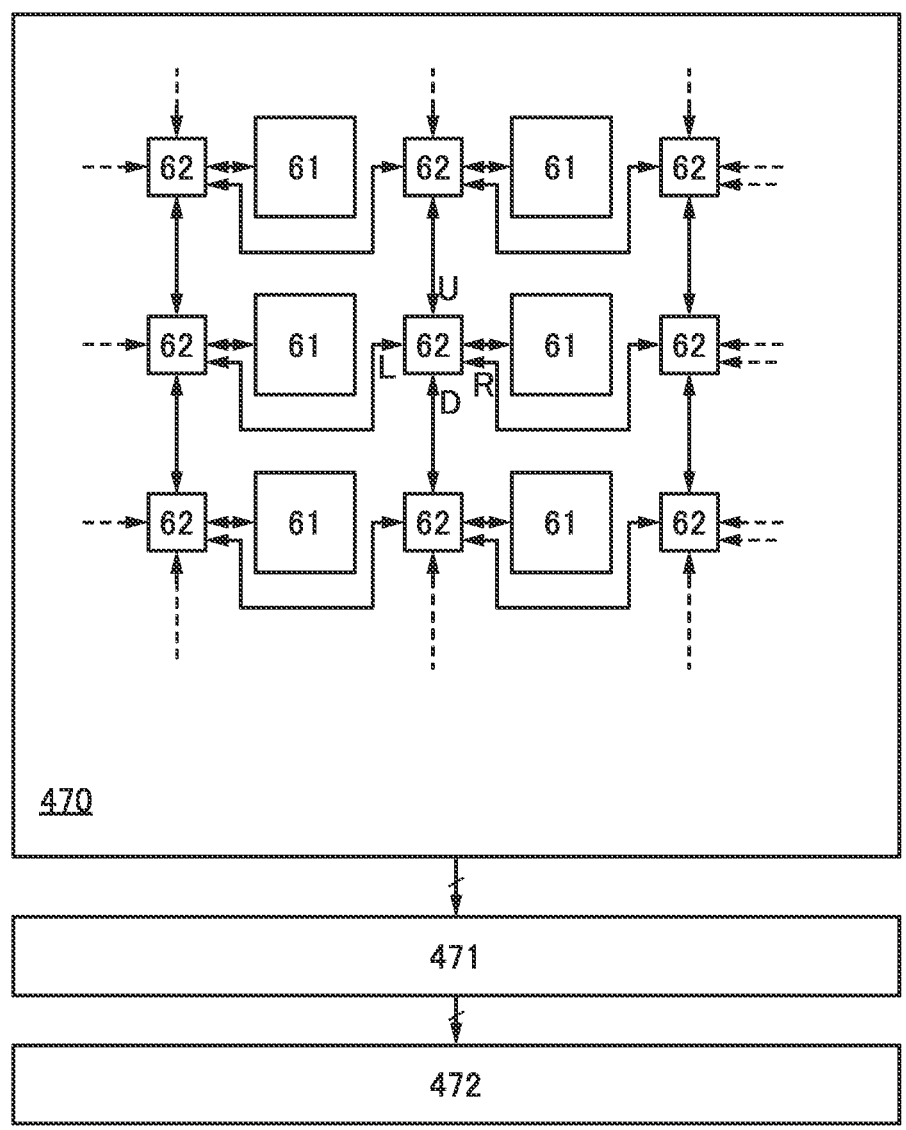
FIG. 17 A block diagram showing a configuration example of an arithmetic array.

The arithmetic circuit array 470 is described with reference to FIG. 17 to FIG. 21. As illustrated in FIG. 17, the arithmetic circuit array 470 is provided with a plurality of arithmetic circuits 61 and a plurality of switch circuits 62 arranged in a matrix. The arithmetic circuits 61 and the switch circuits 62 are programmable circuits. The arithmetic circuit 61 is configured in accordance with processing content of the arithmetic circuit array 470. The connection relation of the arithmetic circuits 61 is changed by changing the circuit configuration of the switch circuit 62 in accordance with the processing content of the arithmetic circuit array 470.

Note that in FIG. 17, "U", "D", "L", and "R" are wiring names of the switch circuit 62 and represent the connection direction (top, bottom, left, and right).

FIG. 18 illustrates a configuration example of the arithmetic circuit 61. The arithmetic circuit 61 includes an input register 51, a memory circuit 52, a multiplier circuit 53, an adder circuit 54, output registers 55A and 55B, selectors 56A to 56D, and memory circuits 57A to 57C. The memory circuits 52 and 57A to 57C are each a nonvolatile local memory circuit of the arithmetic circuit 61, for which an os memory is used.

Data sin is input to the input register 51. The input register 51 retains the data sin by control by a latch signal slat. The input register 51 outputs the retained data to the selector 56A as data sout. In response to an output signal from the memory circuit 57A, the selector 56A selects either one of the data sin and the data sout and outputs the selected data to the multiplier circuit 53 as data sdata. The data sout is output to the outside of the arithmetic circuit 61. With the input register 51, the data sin is temporarily retained in the input register 51, whereby the data sout which is obtained by shifting the data sin can be output.

A context signal context_W[1:0] is input to the memory circuit 52. The context signal context_W[1:0] is an internal signal generated by decoding the signal context_ex[5:0]. The memory circuit 52 stores a plurality of weight coefficient data. The weight coefficient data are written into the memory circuit 52 as configuration data. The configuration data are transmitted from the data driver 466.

Figure 19A:
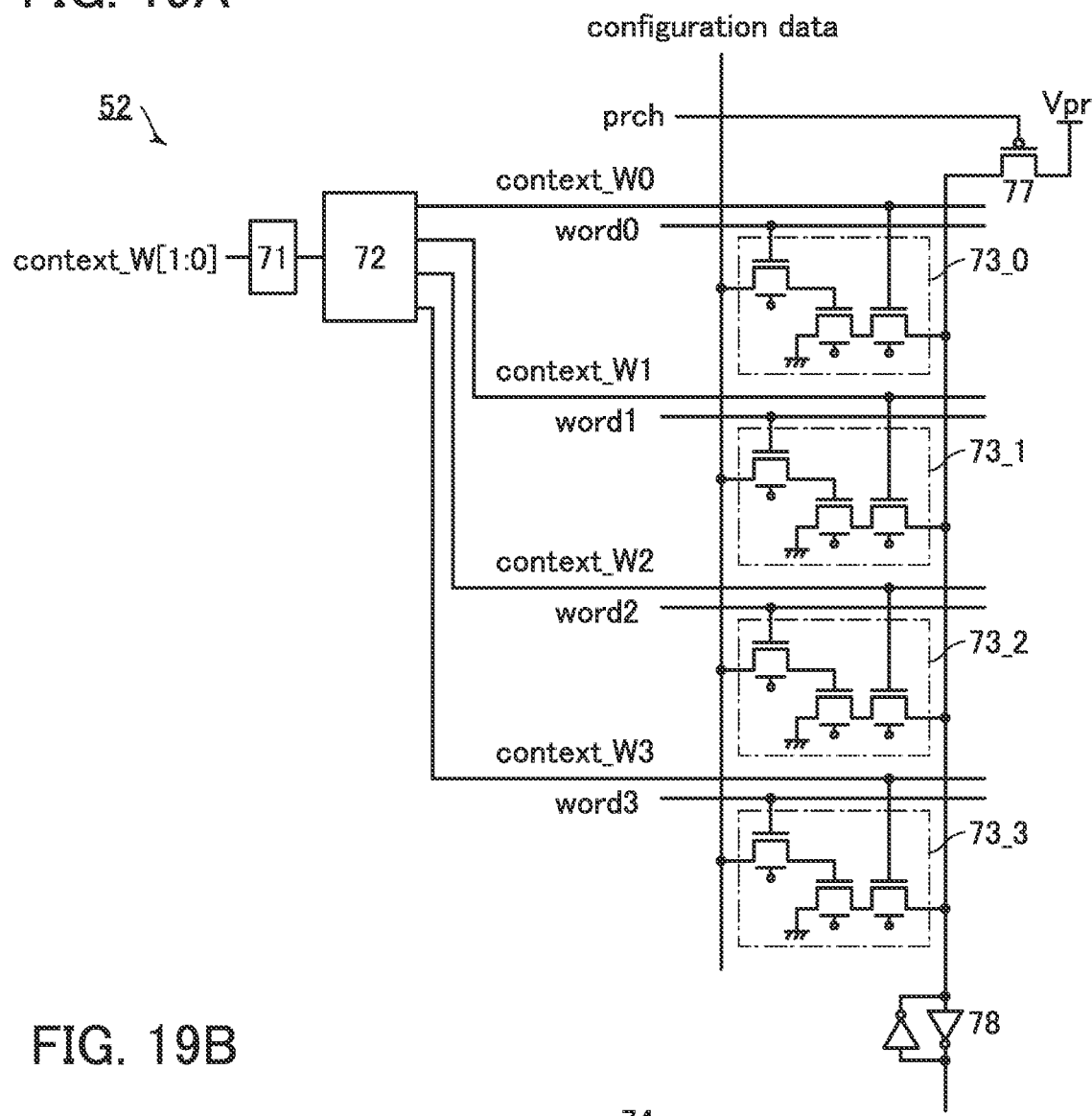
FIGS. 19A-19B A: A circuit diagram showing a configuration example of a memory circuit. B: A circuit diagram showing a configuration example of a memory cell.

As illustrated in FIG. 19(A), the memory circuit 52 includes a flip-flop 71, a decoder 72, memory cells 73_0 to 73_3, a transistor 77, and a latch circuit 78. The memory cells 73_0 to 73_3 have the same circuit configurations as an os memory 383 (see FIG. 27(C)), which are gain cells each having three os transistors.

Signals word0 to word3 are generated by the word driver 467. One memory cell is selected by the signals word0 to word3, and the configuration data is written into the selected memory cell.

The flip-flop 71 retains a context signal context_W[1:0]. The decoder 72 decodes the context signal context_W[1:0] and generates switching signals context_W0 to context_W3 to be output. The switching signals context_W0 to context_W3 each have a function of selecting a memory cell that outputs the weight coefficient data. The weight data read from the selected memory cell is output to the multiplier circuit 53 as data cmout. The transistor 77 has a function of precharging a wiring to which the data cmout is read out to a voltage Vpr. The wiring is precharged by the transistor 77 in response to a signal prch.

Figure 19B:
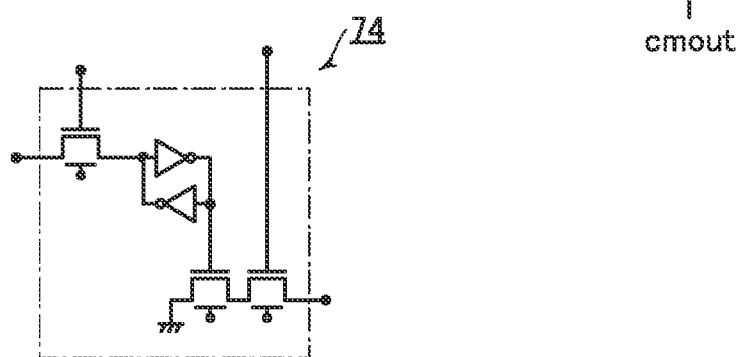

FIG. 19(B) shows another configuration example of the memory cell. A memory cell 74 illustrated in FIG. 19(B) is a modification example of the memory cell 73_0, in which the gate of the readout transistor is provided with a latch circuit including two inverter circuits. For example, these inverter circuits are CMOS circuits each including an n-channel Si transistor and a p-channel Si transistor.

Figure 20:
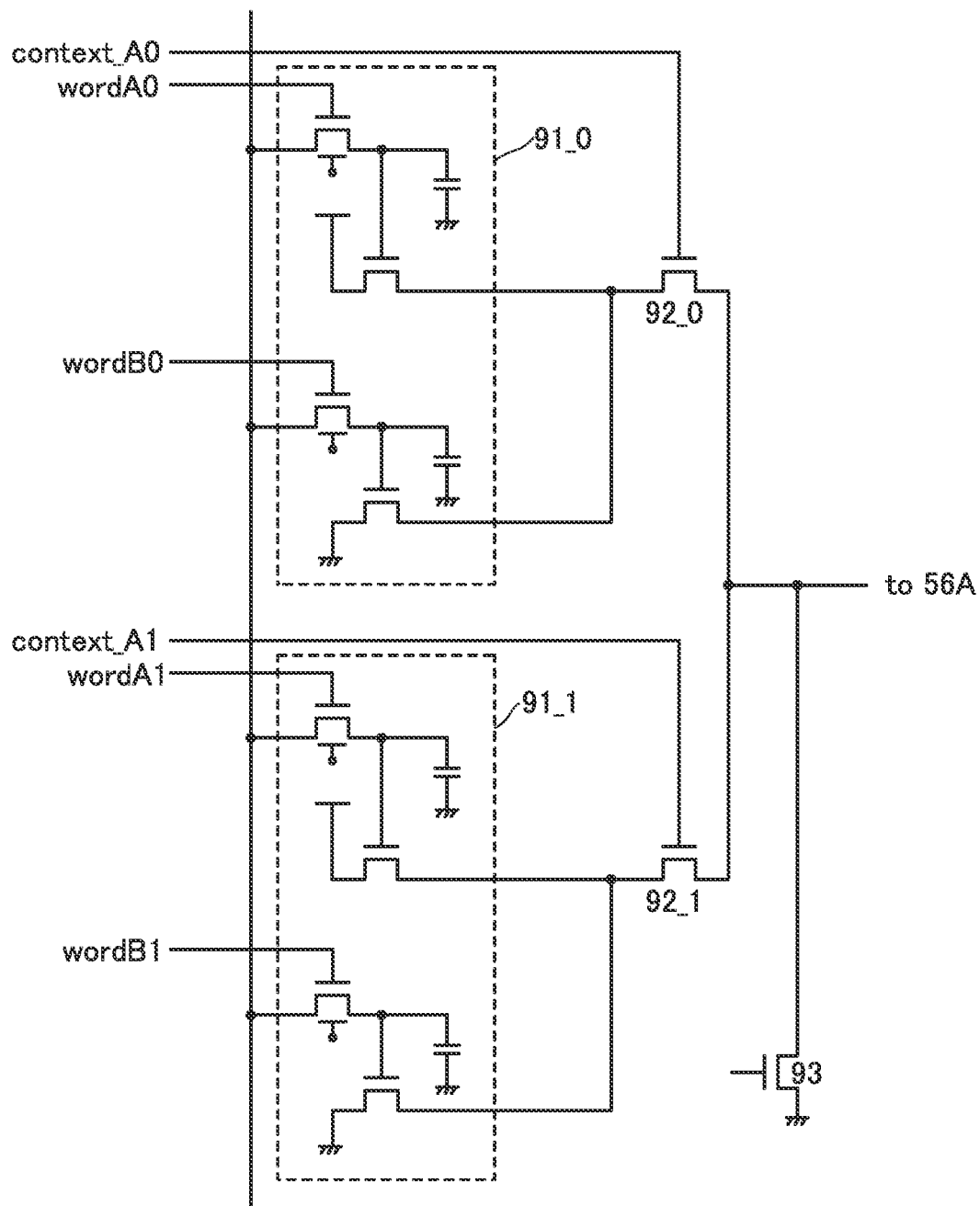
FIG. 20 A circuit diagram showing a configuration example of a memory circuit.

FIG. 20 shows a configuration example of the memory circuit 57A. The memory circuit 57A includes memory cells 91_0 and 91_1 and transistors 92_0, 92_1, and 93. Configuration data, switching signals context_A0 and context_A1, and signals wordA0, wordB0, wordA1, and wordB1 are input to the memory circuit 57A.

Figure 27A:
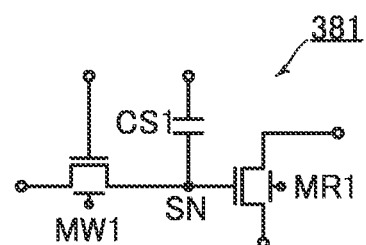
FIGS. 27A-27D A-D: Circuit diagrams each showing a circuit configuration example of an os memory.
Figure 27B:
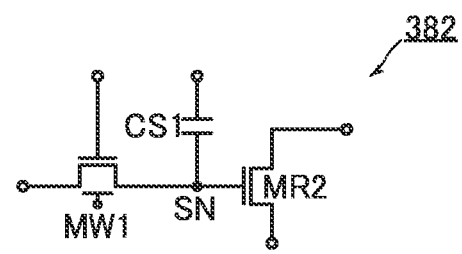

The memory cells 91_0 and 91_1 each consist of two os memories 382 (see FIG. 27(B)). To write configuration data "1" to the memory cell 91_0, the signal wordA0 is set to "H", and the signals wordB0, wordA1, and wordB1 are set to "L". To write configuration data "0" to the memory cell 91_0, the signal wordB0 is set to "H", and the signals wordA0, wordA1, and wordB1 are set to "L".

The transistor 93 is off while a control signal is output to the selector 56A. One of the transistors 92_0 and 92_1 is turned on by switching signals context_A0 and context_A1. For example, when the transistor 92_0 is turned on, a control signal whose logic corresponds to data retained in the memory cell 91_0 is output to the selector 56A.

The memory circuits 57B and 57C have the same circuit configuration as the memory circuit 57A.

The multiplier circuit 53 calculates the product of the data sdata and the data cmout and generates data mout representing the calculation result. The data mout is output to the adder circuit 54 and the selector 56B.

Data ain is the output data of another arithmetic circuit 61 or the output data of the selector 475. The adder circuit 54 calculates the sum of the data ain and the data mout and generates data aout representing the calculation result. The data aout is output to the selectors 56B and 56C.

The output register 55A retains the output data of the selector 56B, and the output register 55B retains the output data of the selector 56C. The provision of the output registers 55A and 55B can prevent an arithmetic error due to signal delay. A signal res_rg is a reset signal of the output registers 55A and 55B.

The output register 55A outputs the retention data to the selector 56D. The output data of the selector 56D or the output register 55B is output from the arithmetic circuit 61 as data acout.

Since the arithmetic circuits 61 are arranged in a matrix in the arithmetic circuit array 470, the arithmetic circuit array can function as a product-sum operation device.

The output data of the arithmetic circuit array 470 is input to the arithmetic portion 471. The arithmetic portion 471 has a functions of an activation function and/or a function of a pooling layer, for example.

<Configuration of Switch Circuit 62>

Figure 21A:
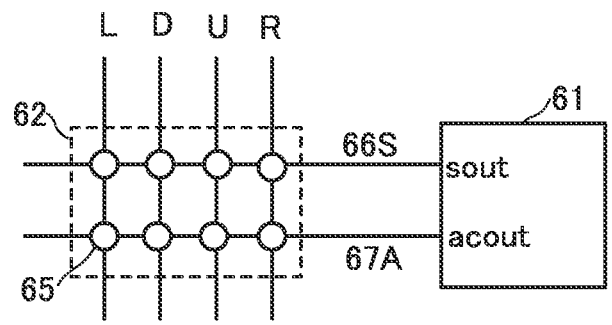
FIGS. 21A-21B A, B: Circuit diagrams each showing a configuration example of a switch circuit.

The switch circuit 62 is described with reference to FIG. 21(A) and FIG. 21(B). As illustrated in FIG. 21(A), eight switch circuits 65 are provided for the switch circuit 62. A wiring 66S for outputting the data sout is electrically connected to any one of the wirings U, D, L, and R. The same applies also to a wiring 67A for outputting the data acout.

Figure 21B:
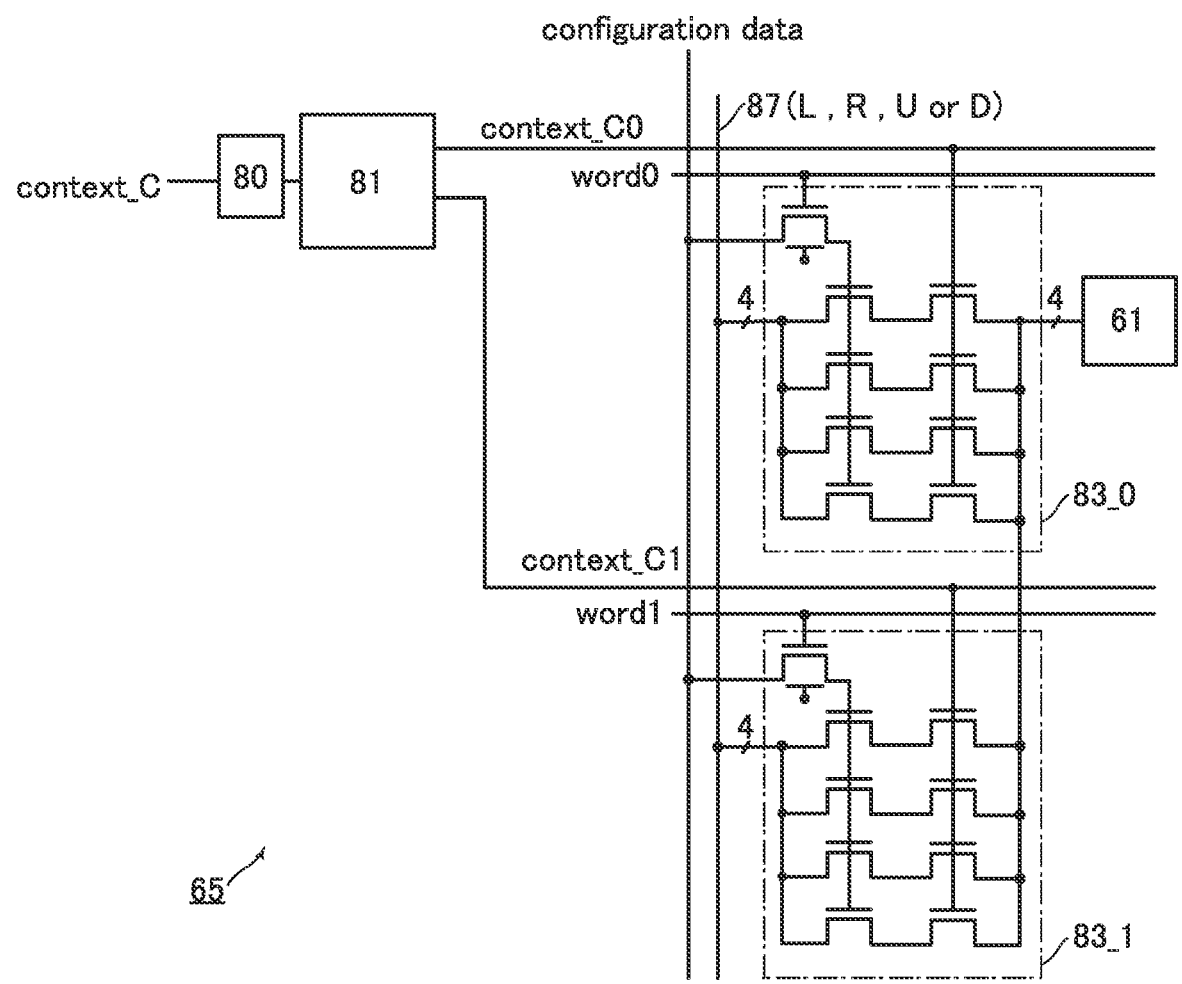

As illustrated in FIG. 21(B), the switch circuit 65 includes a flip-flop 80, a decoder 81, memory cells 83_0 and 83_1, and a wiring 87. The wiring 87 is any of the wirings L, R, U, and D. FIG. 21(B) illustrates the switch circuit 65 for transmitting 4-bit data.

The flip-flop 80 retains a context signal context_C. The decoder 81 decodes the context signal context_C and generates switching signals context_C0 and context_C1. The signals context_C0 and word0 are input to the memory cell 83_0, and the signal context_C1 and a signal word1 are input to the memory cell 83_1.

A write transistor in the memory cell 83_0 is an os transistor having a back gate. In the memory cell 83_0, the transistors other than the write transistor are n-channel Si transistors without a back gate. Note that all the transistors in the memory cell 83_0 may be os transistors. The same applies also to the memory cell 83_1.

When the write transistor is turned on by the signal word0, the configuration data is written into the memory cell 83_0. In the case where the memory cell 83_0 is selected by the switching signal context_C0, the connection state between the wiring 87 and the arithmetic circuit 61 is determined in response to the configuration data retained in the memory cell 83_0.

Since the arithmetic circuit 61 and the switch circuit 62 each include a nonvolatile local memory circuit, the arithmetic circuit 61 and the switch circuit 62 do not need to access an external memory device of the osAI chip 450 during an arithmetic operation. Accordingly, in the osAI chip 450, as well as in the osAI chip 400, data communication between the arithmetic portion and the memory portion is not a bottleneck for arithmetic efficiency. Data communication and arithmetic processing are successively performed between the arithmetic circuits 61; therefore, the arithmetic operations are performed with high efficiency.

Since the arithmetic circuits 61 and the switch circuits 62 are multi-context programmable circuits, super parallel arithmetic processing can be executed efficiently with a few hardware resources. A variety of neural networks can be achieved by the hardware of the osAI chip 450.

Embodiment 5

The L1 cache memory device 202 and the L2 cache memory device 203 are each configured with an os memory. The os memory refers to a memory in which an os transistor is used in a memory cell. For example, the L1 cache memory device 202 and the L2 cache memory device 203 are each configured with a NOSRAM (registered trademark) or an OSSRAM. The OSSRAM is an SRAM provided with a backup circuit configured with an os transistor. Configuration examples of the NOSRAM and the OSSRAM are shown below.

<NOSRAM>

Figure 22A:
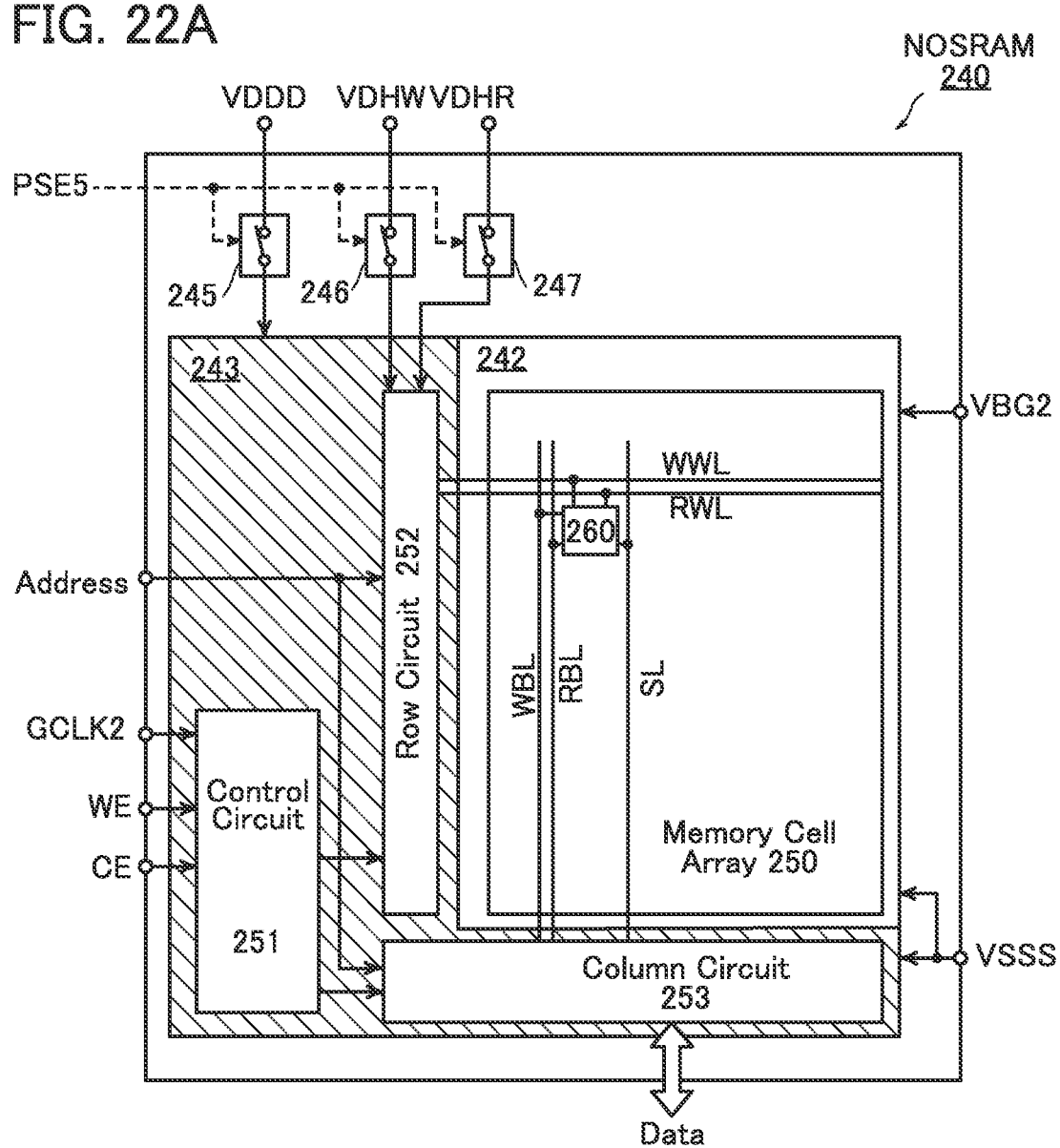
FIGS. 22A-22B A functional block diagram showing a configuration example of a NOSRAM. B: A circuit diagram showing a configuration example of a memory cell.

FIG. 22(A) is a block diagram showing a configuration example of the NOSRAM. A NOSRAM 240 is provided with power domains 242 and 243 and power switches 245 to 247. The power domain 242 is provided with a memory cell array 250, and the power domain 243 is provided with peripheral circuits of the NOSRAM 240. The peripheral circuits include a control circuit 251, a row circuit 252, and a column circuit 253.

Voltages VDDD, VSSS, VDHW, VDHR, and VBG2, a clock signal GCLK2, an address signal Address, and signals CE, WE, and PSES are input to the NOSRAM 240 from the outside. The signal CE and the signal WE are a chip enable signal and a write enable signal, respectively. The signal PSES is generated in the PMU 193 and controls the on/off of the power switches 245 to 247. The power switch 245, the power switch 246, and the power switch 247 control the voltage VDDD, the voltage VDHW, and the voltage VDHR input to the power domain 243, respectively.

Note that the voltages, signals, and the like input to the NOSRAM 240 are appropriately selected in accordance with the circuit configuration and operation method of the NOSRAM 240. For example, the NOSRAM 240 may be provided with a power domain which is not power gated, and a power gating control circuit that generates the signal PSES may be provided.

The memory cell array 250 includes a memory cell 260, a write word line WWL, a readout word line RWL, a write bit line WBL, a readout bit line RBL, and a source line SL.

Figure 22B:
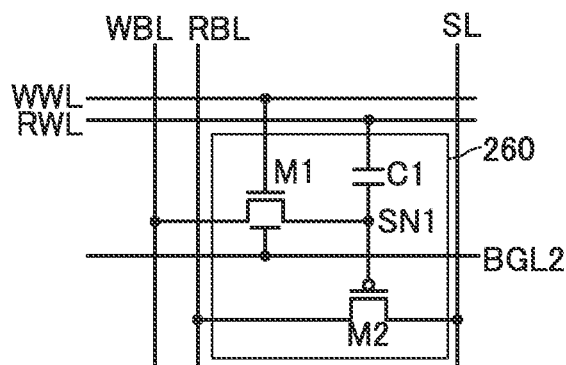

As illustrated in FIG. 22(B), the memory cell 260 is a 2T1C (two transistors and one capacitor) gain cell, which includes a node SN1, transistors M1 and M2, and a capacitor C1. The transistor M1 is a write transistor, which is an os transistor having a back gate. The back gate of the transistor M1 is electrically connected to a wiring BGL2 for supplying the voltage VBG2. The transistor M2 is a readout transistor, which is a p-channel Si transistor. The capacitor C1 is a storage capacitor for retaining the voltage of the node SN1.

The voltage VDDD and the voltage VSSS are voltages representing data "1" and data "0", respectively. Note that the high-level voltage of the write word line WWL and the high-level voltage of the readout word RWL are VDHW and VDHR, respectively.

Figure 23A:
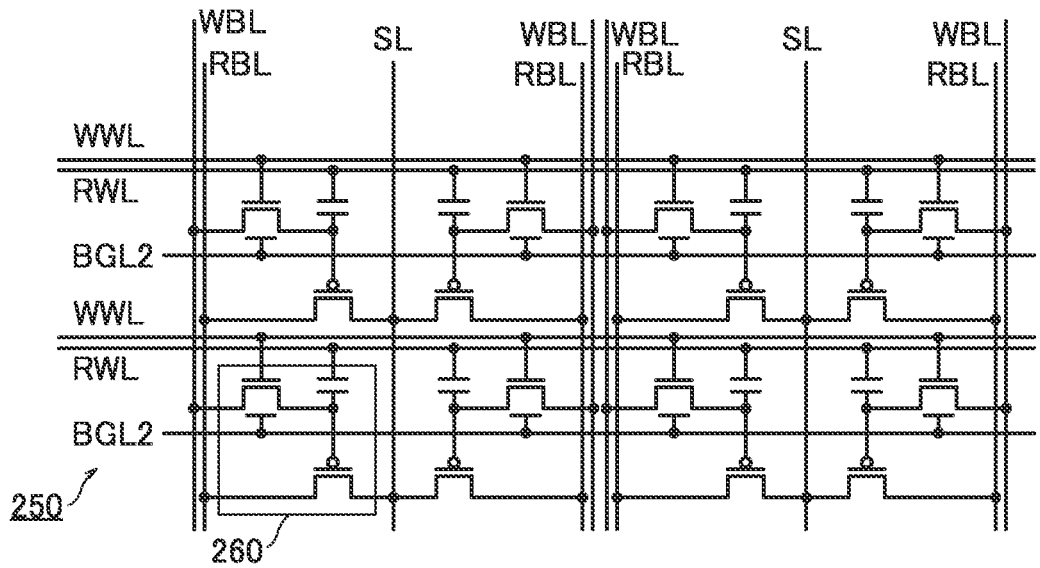
FIGS. 23A-23C A: A circuit diagram showing a configuration example of a memory cell array. B, C: Circuit diagrams each illustrating a configuration example of a memory cell.

FIG. 23(A) shows a configuration example of the memory cell array 250. In the memory cell array 250 illustrated in FIG. 23(A), one source line is supplied to two adjacent columns.

The memory cell 260 does not have a limit on the number of times of data rewriting in principle, can perform data rewriting with low energy, and does not consume power in retaining data. Since the transistor M1 is an os transistor with an extremely low off-state current, the memory cell 260 can retain data for a long time. Therefore, the L1 cache memory device 202 and the L2 cache memory device 203 can be nonvolatile memory devices with low power consumption by being configured with the NOSRAM 240.

Figure 23B:
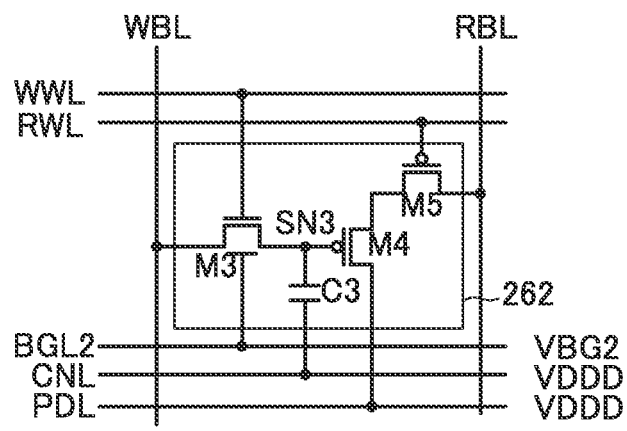
Figure 23C:
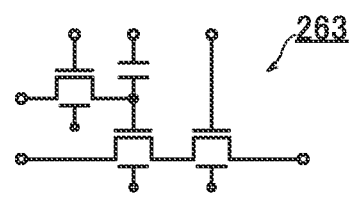

The circuit configuration of the memory cell 260 is not limited to the circuit configuration in FIG. 22(B). For example, the readout transistor M2 may be an os transistor having a back gate or an n-channel Si transistor. Alternatively, the memory cell 260 may be a 3T gain cell. FIG. 23(B) and FIG. 23(C) show examples of a 3T gain cell. A memory cell 262 illustrated in FIG. 23(B) includes transistors M3 to M5, a capacitor C3, and a node SN3. The transistor M3, the transistor M4, and the transistor M5 are a write transistor, a readout transistor, and a selection transistor, respectively. The transistor M3 is an os transistor having a back gate, and the transistors M4 and M5 are p-channel Si transistors. The transistors M4 and M5 may each be an n-channel Si transistor or an os transistor having a back gate. In a memory cell 263 illustrated in FIG. 23(C), three transistors are each an os transistor having a back gate.

The node SN3 is a retention node. The capacitor C3 is a storage capacitor for retaining the voltage of the node SN3. A gate capacitance of the transistor M4 or the like may be used as the storage capacitor without intentionally providing the capacitor C3. A wiring PDL is a wiring alternative to the source line SL and a fixed voltage (e.g., the voltage VDDD) is input to the wiring PDL.

The control circuit 251 has a function of controlling the entire operation of the NOSRAM 240. For example, the control circuit 251 performs a logical operation of the signals CE and WE to determine whether an access from the outside is write access or readout access.

The row circuit 252 has a function of selecting the write word line WWL and the readout word line RWL in the selected row specified by the address signal Address. The column circuit 253 has a function of writing data to the write bit line WBL in the column specified by the address signal and a function of reading out data from the readout bit line RBL in the column.

<Operation Example>

Figure 24:
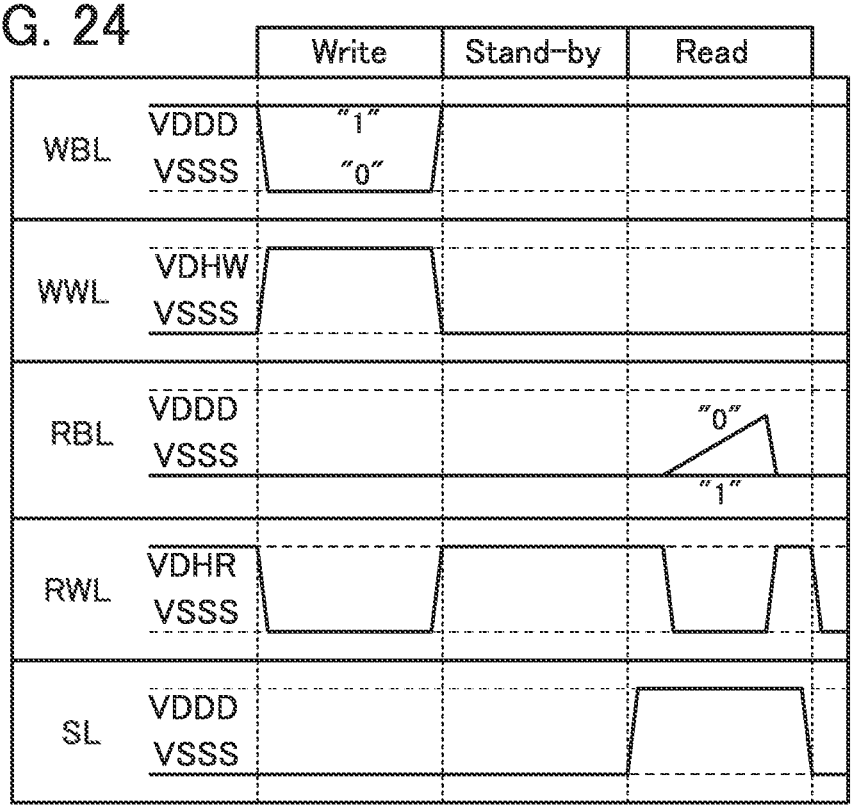
FIG. 24 A timing chart showing an operation example of a NOSRAM.

An operation example of the NOSRAM 240 is described with reference to FIG. 24. FIG. 24 is a timing chart showing an operation example of the NOSRAM 240. In a write operation state (Write), a readout operation state (Read), and a standby state (Stand-by), the power switches 245 to 247 are on, and the voltages VDDD, VDHW, and VDHR are input to the power domain 243.

<Writing>

When the signal CE at "H" and the signal WE at "H" are input, the NOSRAM 240 performs writing operation. The word line WWL and the word line RWL in a row selected by the row circuit 252 are at "H" and "L", respectively. A voltage based on data is input to the bit line WBL selected by the column circuit 253. The voltage of the node SN1 of the selected memory cell 260 becomes VDDD when data "1" is written, and becomes VSSS when data "0" is written.

<Readout>

When the signal CE at "H" and the signal WE at "L" are input, the NOSRAM 240 performs readout operation. The bit line RBL is precharged to the voltage VSSS by the column circuit 253, and then the source line SL is set to "H". Then, the word line RWL in a row selected by the row circuit 252 is set to "L". In the case where the memory cell 260 in the selected row retains data "0", the voltage VSSS is input to the gate of the transistor M2; accordingly, a large amount of current flows between a source and a drain of the transistor M2. Consequently, the bit line RBL is charged promptly and the potential of the bit line RBL is increased. In the case where the memory cell 260 in the selected row retains data "1", the potential VDDD is input to the gate of the transistor M2; accordingly, drain current hardly flows to the transistor M2. Consequently, the voltage of the bit line RBL is kept at a precharge voltage (VS S S).

<Standby>

The write word line WWL and the source line SL are each at "L", and the readout word line RWL is at "H". The transistor M1 in the memory cell 260 is in an off state.

For example, when the time when the NOSRAM 240 is in the standby state exceeds a certain time, the PMU 193 turns off the power switches 245 to 247 and stops input of the clock signal GCLK2. Accordingly, the power domain 243 is power gated and thus standby power of the NOSRAM 240 can be reduced.

<OSSRAM>

Next, the OSSRAM is described with reference to FIG. 25 and FIG. 26.

Figure 25:
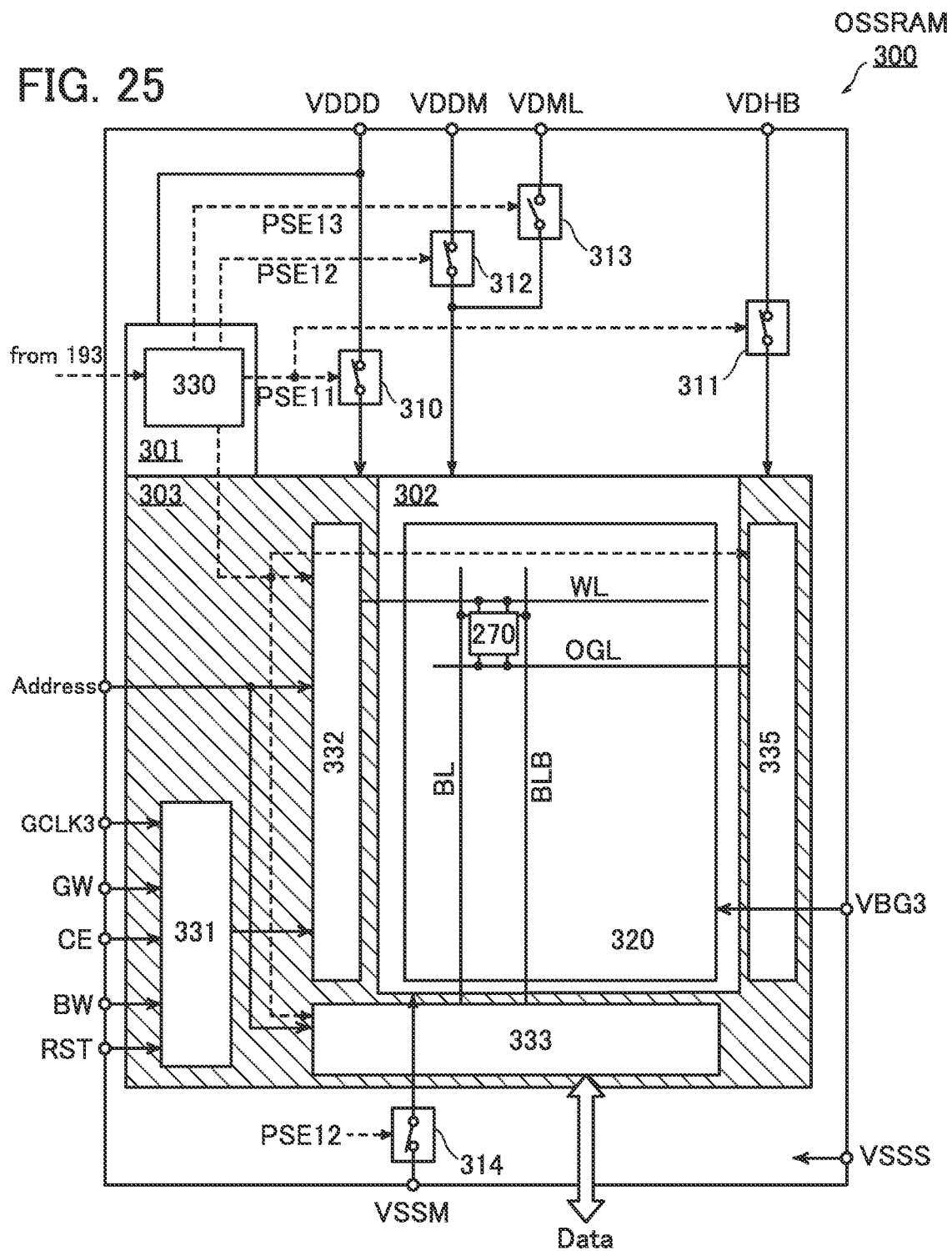
FIG. 25 A functional block diagram showing a configuration example of an OSSRAM.

As illustrated in FIG. 25, an OSSRAM 300 is provided with power domains 301 to 303 and power switches 310 to 314. The power domain 301 is a power domain which is not power gated and is provided with a power gating control circuit 330. The power domains 302 and 303 are power domains capable of power gating. The power domain 302 is provided with a memory cell array 320, and the power domain 303 is provided with a control circuit 331, a row circuit 332, a column circuit 333, and a backup and recovery driver 335.

The memory cell array 320 includes a cell 270, a word line WL, bit lines BL and BLB, and a gate line OGL. Note that the bit lines BL and BLB can also be referred to as local bit lines. A pair of wirings that is made up of the bit line BL and the bit line BLB arranged in the same column is referred to as a bit line pair (BL and BLB) in some cases.

To the OSSRAM 300, voltages VDDD, VSSS, VDDM, VDML, VSSM, VDHB, and VBG3, a clock signal GCLK3, an address signal Address, and signals RST, CE, GW, and BW are input.

The signal RST, the signal CE, the signal GW, and the signal BW are a reset signal, a chip enable signal, a global write enable signal, and a byte write enable signal, respectively. The control circuit 331 controls the OSSRAM 300 on the basis of these signals. The control circuit 331 may be provided with a register that temporarily stores an input signal.

The row circuit 332 has a function of selecting the word line WL in the selected row specified by the address signal Address. The column circuit 333 has a function of writing data to the bit line pair (BL and BLB) in the column specified by the address signal and a function of reading out data from the bit line pair (BL and BLB).

In the OSSRAM 300, each circuit, each signal, and each voltage can be appropriately selected as needed. Another circuit or another signal may be added. Structures of input and output signals to and from the OSSRAM 300 are determined on the basis of the operation mode of the OSSRAM 300, the configuration of the memory cell array 320, and the like.

The power gating control circuit 330 generates signals PSE11 to PSE13 and control signals of the row circuit 332, the column circuit 333, and the backup and recovery driver 335 on the basis of the PG control signal generated by the PMU 193. The signals PSE11 to PSE13 control the on/off of the power switches 310 to 314. The power switch 310 and the power switch 311 control input of the voltage VDDD and input of the voltage VDHB to the power domain 303, respectively. The power switch 312, the power switch 313, and the power switch 314 control input of the voltage VDDM, input of the voltage VDML, and input of the voltage VSSM to the power domain 302, respectively.

(Cell 270)

Figure 26A:
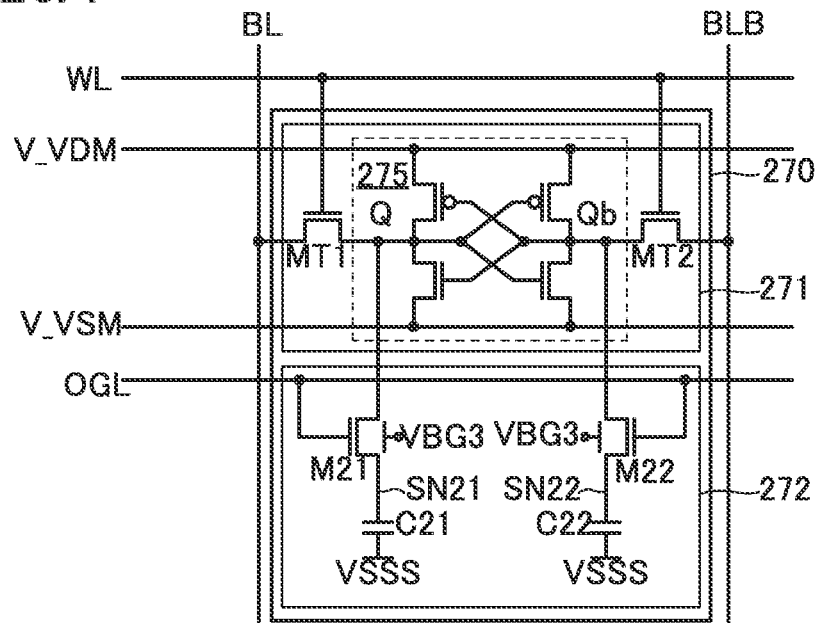
FIGS. 26A-26B A: A circuit diagram showing a configuration example of a memory cell. B: A timing chart showing an operation example of an OSSRAM.

FIG. 26(A) shows a circuit configuration example of the cell 270. The cell 270 includes a memory cell 271 and a backup circuit 272. The memory cell 271 has the same circuit configuration as a standard 6T (transistor) SRAM cell and includes a bistable circuit 275 and transistors MT1 and MT2. The bistable circuit 275 is electrically connected to the word line WL, the bit lines BL and BLB, and virtual power supply lines V_VDM (hereinafter referred to as a V_VDM line) and V_VSM (hereinafter referred to as a V_VSM line). Note that the V_VDM line is a virtual power supply line in which voltage input is controlled by the power switches 312 and 313, and the V_VSM line is a virtual power supply line in which voltage input is controlled by the power switch 314. The voltage VDHB is a high-level voltage of the gate line OGL, which is higher than the voltage VDDM.

In the example of FIG. 26(A), the bistable circuit 275 is a latch circuit composed of two CMOS inverter circuits. Nodes Q and Qb are connection portions of input ports and output ports of the two CMOS inverters and are retention nodes for complementary data. When the nodes Q/Qb are set to "H"/"L" or the nodes Q/Qb are set to "L"/"H", the bistable circuit 275 is stabilized. The transistors MT1 and MT2 are transfer transistors. The transistor MT1 controls continuity between the bit line BL and the node Q, and the transistor MT2 controls continuity between the bit line BLB and the node Qb.

The backup circuit 272 is a circuit for backing up data in the memory cell 271. Each of the cells 270 is provided with the backup circuit 272 to enable power gating of the power domain 302.

The backup circuit 272 includes transistors M21 and M22 and capacitors C21 and C22. That is, the backup circuit 272 includes two 1T1C memory cells, and retention nodes of these memory cells are nodes SN21 and SN22.

The transistors M21 and M22 are os transistors each having a back gate, and the voltage VBG3 is input to these back gates. Since the transistors M21 and M22 are os transistors, the backup circuit 272 can retain data for a long time. When the transistors M21 and M22 are each an os transistor, the backup circuit 272 can be stacked over the memory cell 271 including Si transistors; thus, the area overhead of the cell 270 due to provision of the backup circuit 272 can be reduced.

<Low Power Consumption State>

In the OSSRAM 300, there are four kinds of low power consumption states: (1) a bit-line floating state; (2) a resting state; (3) a cell array domain PG state; and (4) all domain PG state. The power gating control circuit 330 manages the operation of the OSSRAM 300 in a low power consumption state on the basis of a PG signal and the like of the PMU 193.

(Bit Line Floating State)

In the bit line floating state, the bit line pair (BL and BLB) is brought into a floating state. Data in the memory cell 271 is not lost.

(Sleep State)

In the sleep state, the voltage VDML lower than the voltage VDDM is applied to the power domain 302. The voltage VDML is a voltage at which data in the memory cell 271 is not lost. The bit line pair (BL and BLB) is brought into a floating state.

(Cell Array Domain PG State)

The power switches 312 to 314 are turned off so that the application of the voltages VDDM, VDML, and VSSM to the power domain 302 is stopped. The bit line pair (BL and BLB) is in a floating state. Data in the memory cell 271 is lost.

(All Domain PG State)

In the all domain PG state, all the domains capable of power gating is in a state of power gating. The power switches 310 to 314 are off.

The four kinds of low power consumption states have different break-even times (BET) taken for obtaining the effect of reducing power consumption. With the plurality of low power consumption states having different BETs, the power consumption of the OSSRAM 300 can be reduced efficiently.

<Power Gating Sequence>

Figure 26B:
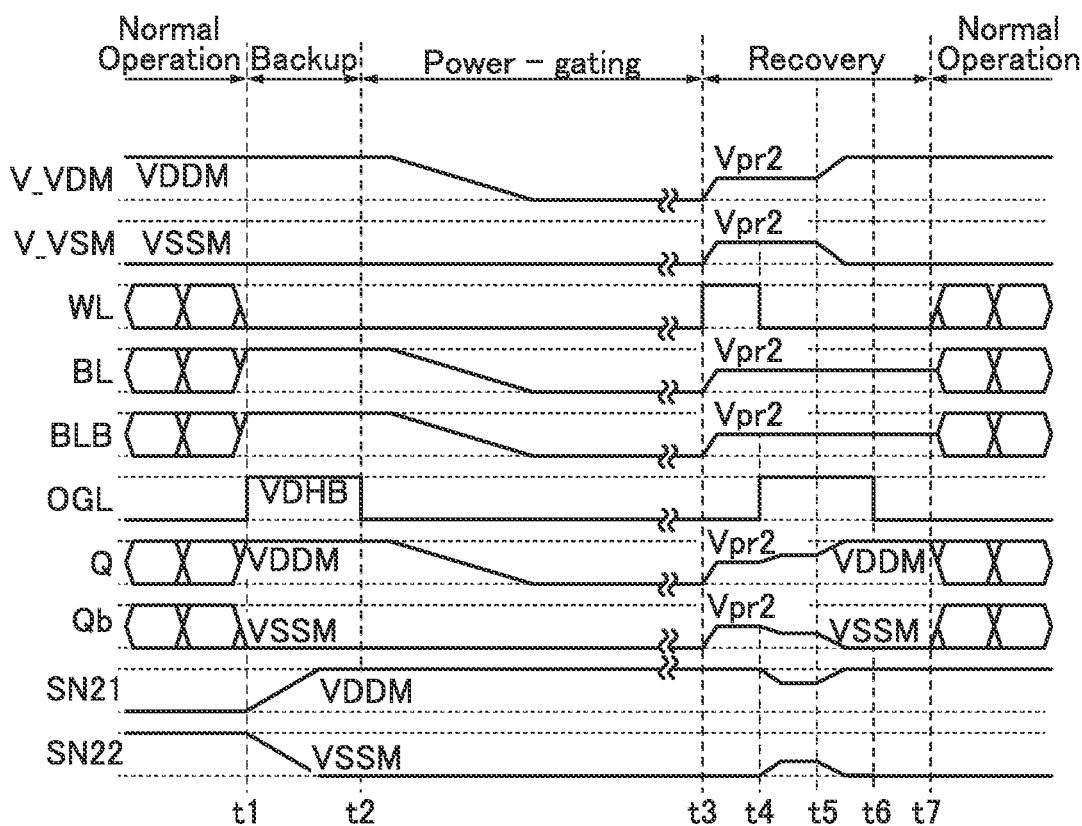

FIG. 26(B) shows an example of the power gating sequence of the power domain 302. Time is denoted by t1, t2, or the like in FIG. 26(B).

(Normal Operation)

Until time t1, the state of the OSSRAM 300 is a normal operation state (a write state or a readout state). The OSSRAM 300 performs normal operation similar to that of a single-port SRAM. The power switches 310 to 312 and 314 are on, and the power switch 313 is off.

(Backup)

Backup operation starts at time t1 on the basis of the control signal of the power gating control circuit 330. The backup and recovery driver 335 sets all of the wirings OGL to "H". Here, since the nodes Q/Qb are at "H"/"L" and the nodes SN21/SN22 are at "L"/"H" at time t1, when the transistors M21 and M22 are turned on, the voltage of the node SN21 rises from the VSSM to the VDDM and the voltage of the node SN22 decreases from the VDDM to the VS SM. The wiring OGL is set to "L" at time t2, whereby the backup operation is terminated. Data of the nodes Q/Qb at time t1 are written into the nodes SN21/SN22.

(Power Gating)

The power gating control circuit 330 sets the signal PSE12 to "L" at time t2 so that the power switches 312 and 314 are turned off, whereby power gating of the power domain 302 starts. A voltage difference between the V_VDM line and the V_VSM line decreases, whereby the memory cell 271 becomes inactive. Although data in the memory cell 271 is lost, the backup circuit 272 continues to retain data.

For example, while the power domain 302 is powered off, the bit line pair (BL and BLB) is brought into a floating state. The power gating control circuit 330 transmits a control signal for that to the column circuit 333.

(Recovery)

The row circuit 332, the column circuit 333, and the backup and recovery driver 335 perform recovery operation in response to the control signal of the power gating control circuit 330. In the recovery operation, the bistable circuit 275 functions as a sense amplifier for detecting data in the nodes Q/Qb. First, the reset operation of the nodes Q and Qb is performed. At the time t3, the column circuit 333 performs precharge operation of all of the bit line pairs (BL and BLB). All of the bit line pairs (BL and BLB) are precharged to a voltage Vpr2. The row circuit 332 brings all of the word lines WL into selected states. The V_VDM line and the V_VSM line are precharged to the voltage Vpr2, and the voltages of the nodes Q and Qb are fixed to Vpr2.

The backup and recovery driver 335 sets all of the wirings OGL to "H" at time t4. The transistors M21 and M22 are turned on. The electric charge in the capacitor C21 is distributed to the node Q and the node SN21, the electric charge in the capacitor C22 is distributed to the node Qb and the node SN22, and a voltage difference is generated between the node Q and the node Qb.

At time t5, the power switches 312 and 314 are turned on so that input of the voltages VDDM and VSSM to the power domain 302 is resumed. When the bistable circuit 275 becomes active, the voltage difference between the node Q and the node Qb is amplified. Finally, the voltages of the nodes Q and SN21 become VDDM, and the voltages of the nodes Qb and SN22 become VSSM. In other words, the states of the nodes Q/Qb are returned to the states at time t1 ("H"/"L"). At time t7, the recovery operation is terminated.

The L1 cache memory device 202 and the L2 cache memory device 203 may be different in a configuration. For example, an OSSRAM is used for the L1 cache memory device 202 and a NOSRAM is used for the L2 cache memory device 203. Alternatively, a NOSRAM including the memory cell 260 is used for the L1 cache memory device 202, and a NOSRAM including the memory cell 263 is used for the L2 cache memory device 203. In this case, the memory cell array can be stacked over a peripheral circuit in the L2 cache memory device 203, the area of the L2 cache memory device 203 can be reduced, which is advantageous in increasing the capacity. Since the readout transistor in the memory cell 260 is a Si transistor, the readout rate is high, which is suitable for the L1 cache memory device 202.

<osAI Chip 390>

An osAI chip 390 is an IC chip capable of arithmetic processing of AI in which an os transistor is provided. Examples of data used by the osAI chip 390 include weight coefficient data (data capable of learning), image data, and teacher data. The arithmetic operation result of the osAI chip 390 is output as inference data, for example.

The feature of the osAI chip 390 is that the memory circuit that stores data which is used for an arithmetic operation (typically, a weight coefficient data) is provided close to the arithmetic circuit. An os transistor is used for such a memory circuit. In this specification, a memory including an os transistor is referred to as an "os memory" in some cases. FIG. 27(A) to FIG. 27(D) show circuit configuration examples of an os memory.

An os memory 381 illustrated in FIG. 27(A) has the same circuit configuration as a 2T gain cell and includes a write transistor MW1, a readout transistor MR1, and a capacitor CS1. A gate of the readout transistor MR1 is a retention node SN. The write transistor MW1 and the readout transistor MR1 are each an os transistor.

The node SN of the os memory 381 is charged through the write transistor MW1. Since the os transistor has an extremely low off-state current, the write transistor MW1 hardly leak the electric charge of the node SN. Thus, the os memory 381 can function as a nonvolatile memory circuit and easily obtains multivalued data. Accordingly, the os memory 381 can be provided in the osAI chip 390 as a nonvolatile analog memory circuit.

Changing the back gate voltage of the write transistor MW1 can change the threshold voltage of the write transistor MW1. The write transistor MW1 may be an os transistor without a back gate. The same applies also to the readout transistor MR1.

Avalanche breakdown or the like is less likely to occur in some cases in an os transistor than in a general Si transistor because, for example, a metal oxide has a large energy gap and thus electrons are less likely to be excited, and the effective mass of a hole is large. Therefore, for example, it may be possible to inhibit hot-carrier degradation or the like that is caused by avalanche breakdown. Since hot-carrier degradation can be inhibited, an os transistor can be driven with a high drain voltage. Accordingly, when the write transistor MW1 is an os transistor, a high voltage can be applied to the node SN, whereby the os memory 381 easily obtains multivalued data.

The os memory 382 illustrated in FIG. 27(B) is a modification example of the os memory 381, in which a readout transistor MR2 is an n-channel Si transistor. The readout transistor MR2 may be a p-channel Si transistor.

Figure 27C:
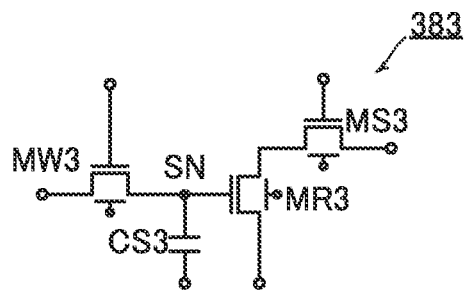

The os memory 383 illustrated in FIG. 27(C) is a 3-transistor gain cell, which includes a write transistor MW3, a readout transistor MR3, a selection transistor MS3, and a capacitor CS3. The write transistor MW3, the readout transistor MR3, and the selection transistor MS3 are each an os transistor having a back gate. Some or all of these transistors may each be an os transistor without a back gate.

Figure 27D:
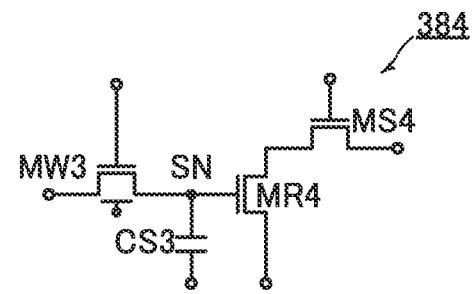

An os memory 384 illustrated in FIG. 27(D) is a modification example of the os memory 383. A readout transistor MR4 and a selection transistor MS4 are each an n-channel Si transistor. One or both of the readout transistor MR4 and the selection transistor MS4 may be p-channel Si transistors.

Data is rewritten by charging and discharging of the capacitor CS1; therefore, the os memory 381 does not have a limit on the number of rewriting operations in principle, can write and read out data with low energy, and does not consume power in retaining data. Thus, a low power consumption AI chip can be provided by incorporating the os memory 381 into the osAI chip 390. The os memories 382 to 384 also have features similar to that of the os memory 381.

Figure 28A:
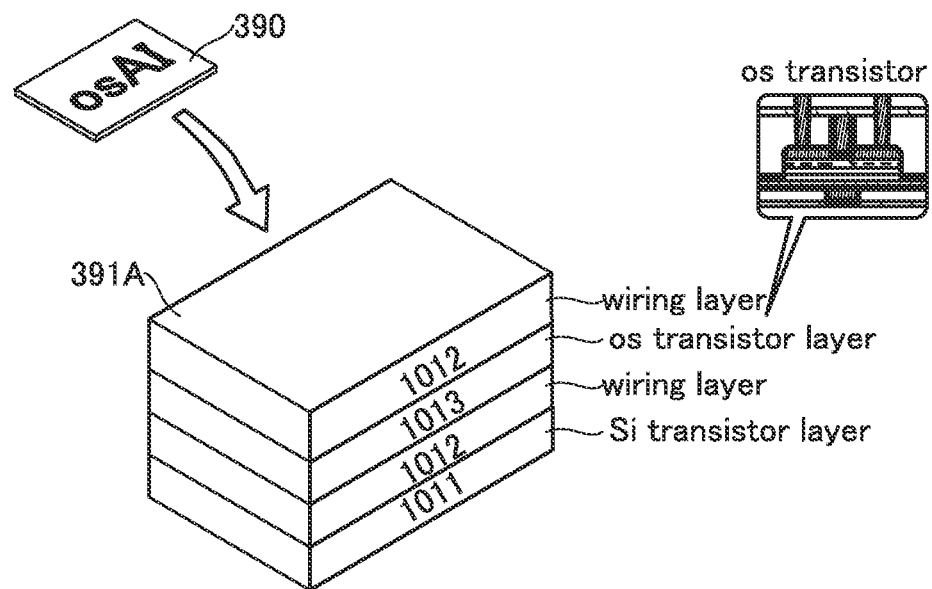
FIGS. 28A-28C Schematic diagrams illustrating configuration examples of a circuit portion of an OSAI chip.

FIG. 28(A) schematically illustrates a stacked-layer structure of a circuit portion 391A of the osAI chip 390. The circuit portion 391A has a stacked-layer structure, which is broadly divided into a Si transistor layer 1011, a wiring layer 1012, and an os transistor layer 1013. The os transistor layer 1013 can be stacked over the Si transistor layer 1011, so that the area of the osAI chip 390 can be reduced.

Figure 28B:
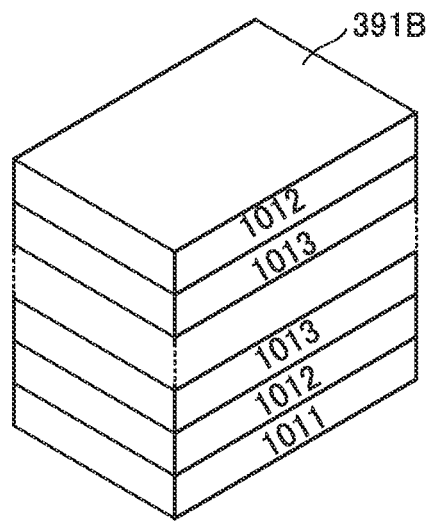
Figure 28C:
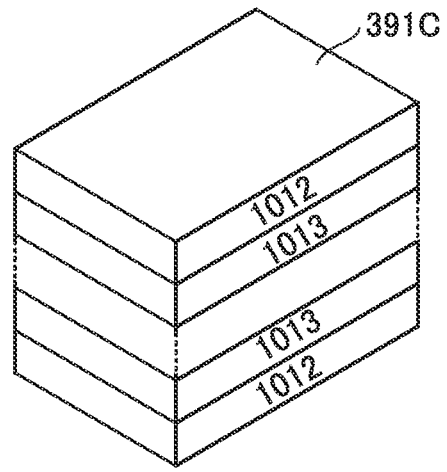

As in a circuit portion 391B (see FIG. 28(B)) and a circuit portion 391C (see FIG. 28(C)), a plurality of os transistor layers 1013 may be provided. Unlike the circuit portions 391A and 391B, the circuit portion 391C is not provided with the Si transistor layer 1011. The number of os transistor layers 1013 in the circuit portion 391C may be one in some cases.

The specific circuit configuration of the osAI chip 390 is described in Embodiment 3 and Embodiment 4. As described above, the arithmetic portion of the osAI chip 390 can be configured with a small numbers of elements and a small numbers of wirings, which is advantageous in integration. By integration of the arithmetic circuit, the number of parallel processing can be increased; therefore, the osAI chip 390 has a possibility of achieving arithmetic performance equivalent or higher than that of a commercially available GPU chip.

For example, in the case where the operation frequency is 3 GHz and the number of parallel processing of multiplication is $10^3$ in the commercially available GPU chip, the arithmetic performance of the GPU chip is $3\times10^{12}$ OPS=3 Tera OPS (TOPS). For example, approximately $10^6$ to $10^8$ arithmetic circuits can be provided in the osAI chip 390, and the number of parallel processing of multiplication can be set to $10^6$ to $10^8$. In this case, even when the operation frequency of the osAI is reduced to 3 MHz or 30 MHz, the arithmetic performance of the osAI chip 390 is equivalent to that of the GPU. A reduction in the operation frequency is extremely effective in reducing dynamic power consumption of the IC chip.

In addition, the GPU chip is driven with a high frequency to perform large-scale arithmetic processing such as arithmetic operation of AI. Therefore, a large amount of power is consumed and the temperature is increased. Since the osAI chip 390 can reduce the operation frequency, heat generation of the osAI chip 390 can be suppressed. Accordingly, in the arithmetic device, a heat dissipation mechanism of the osAI chip 390 can be made simpler than the heat dissipation mechanism of the GPU chip.

As described above, in the GPU chip, there is a trade-off relation between enhancement of arithmetic performance, and low power consumption and suppression of heat generation. In contrast, in the osAI chip 390, degradation of the arithmetic performance can be suppressed even when the operation frequency is reduced. Therefore, the osAI chip 390 can execute large-scale arithmetic processing with high efficiency in terms of time and power.

Embodiment 6

In this embodiment, an electronic device, a moving object, and an arithmetic system to which the arithmetic devices described in the above embodiments can be applied will be described with reference to FIG. 29 to FIG. 32.

Figure 29B:
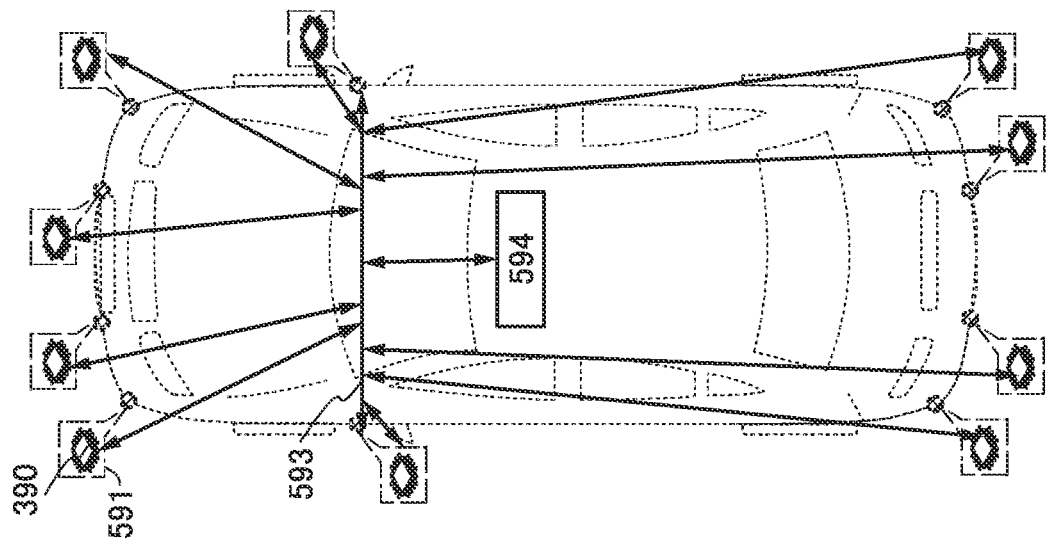
FIGS. 29A-29B Diagrams illustrating a configuration of one embodiment of the present invention.
Figure 29A:
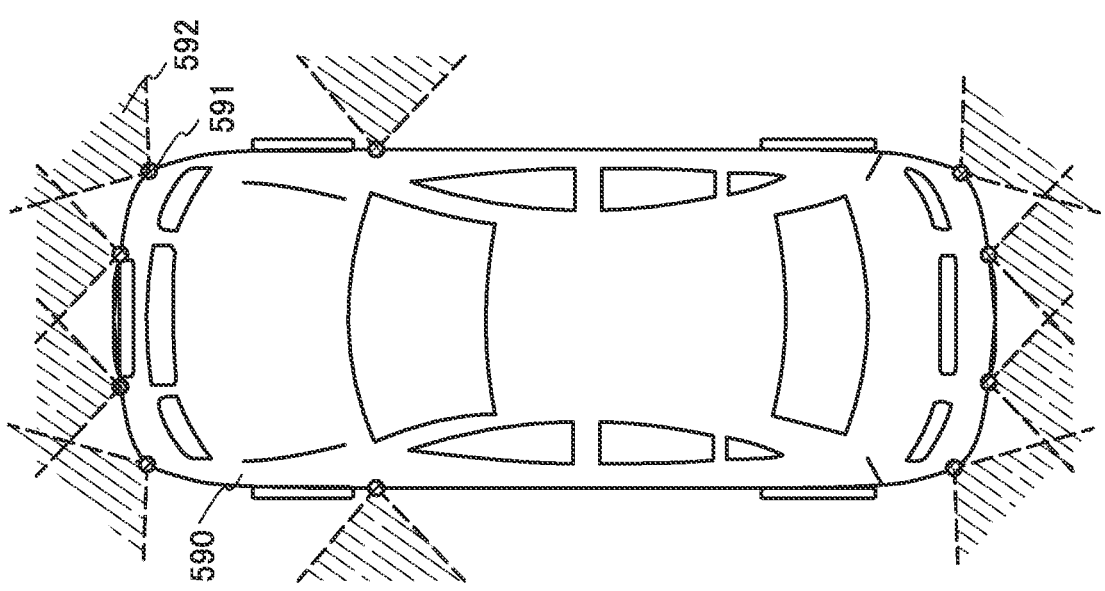

FIG. 29(A) shows an external diagram of an automobile as an example of a moving object. FIG. 29(B) is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described osAI chip 390 can be used for the camera 591 and the like. The automobile 590 can perform automatic driving by judging surrounding traffic information such as the presence of a guardrail or a pedestrian in such a manner that the camera 591 processes a plurality of images taken in a plurality of imaging directions 592 with the osAI chip 390 described in the above embodiment and the plurality of images are analyzed together with a host controller 594 and the like through a bus 593 and the like. The osAI chip 390 can be used for a system for navigation, risk prediction, or the like.

When arithmetic processing of a neural network or the like is performed on the obtained image data in the osAI chip 390, for example, processing for the following can be performed: an increase in image resolution, a reduction in image noise, face recognition (for security reasons or the like), object recognition (for automatic driving or the like), image compression, image compensation (a wide dynamic range), restoration of an image of a lensless image sensor, positioning, character recognition, and reduction of glare and reflection.

Note that although an automobile is described above as an example of a moving object, moving objects are not limited to an automobile. Examples of moving objects also include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

Figure 30A:
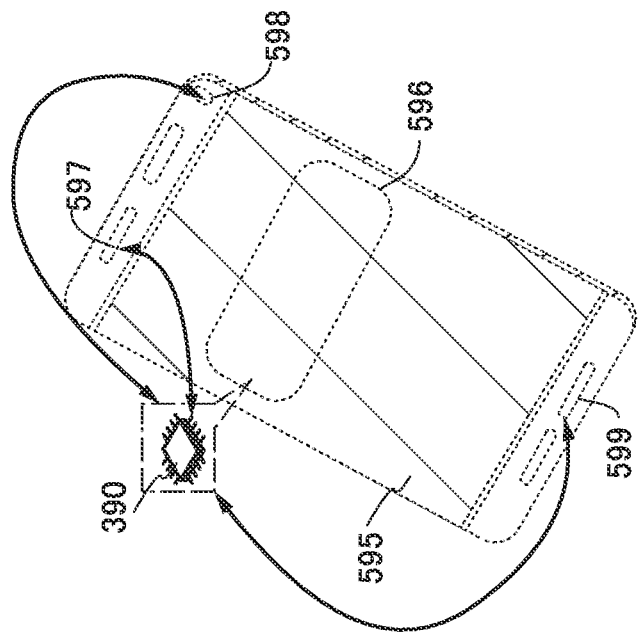
FIGS. 30A-30B Diagrams illustrating a configuration of one embodiment of the present invention.
Figure 30B:
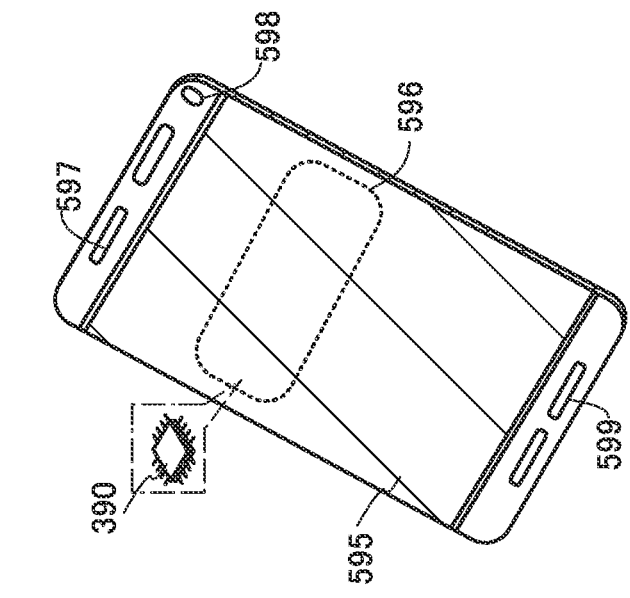

FIG. 30(A) is an external diagram showing an example of a portable electronic device. FIG. 30(B) is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described osAI chip 390. The portable electronic device 595 processes and analyzes a plurality of pieces of data obtained from the speaker 597, the camera 598, the microphone 599, and the like with the osAI chip 390 described in the above embodiment, whereby the user's convenience can be improved. The osAI chip 390 can be used for a system for voice guidance, image search, or the like.

When arithmetic processing of a neural network or the like is performed on the obtained image data in the osAI chip 390, for example, processing for the following can be performed: an increase in image resolution, a reduction in image noise, face recognition (for security reasons or the like), object recognition (for automatic driving or the like), image compression, image compensation (a wide dynamic range), restoration of an image of a lensless image sensor, positioning, character recognition, and reduction of glare and reflection.

Figure 31A:
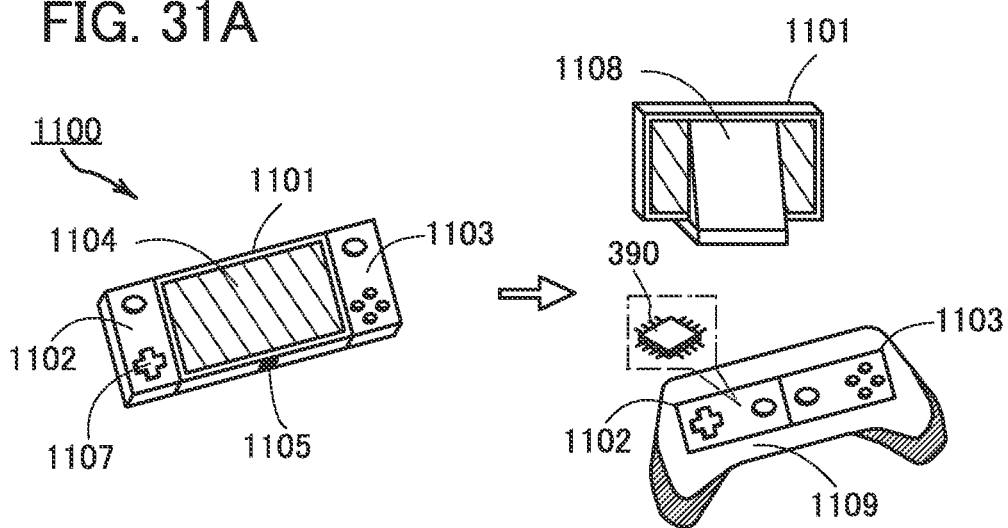
FIGS. 31A-31C Diagrams illustrating a configuration of one embodiment of the present invention.

A portable game machine 1100 illustrated in FIG. 31(A) includes a housing 1101, a housing 1102, a housing 1103, a display portion 1104, a connection portion 1105, operation keys 1107, and the like. The housing 1101, the housing 1102, and the housing 1103 can be detached. When the connection portion 1105 provided in the housing 1101 is attached to a housing 1108, an image to be output to the display portion 1104 can be output to another video device. Alternatively, the housing 1102 and the housing 1103 are attached to a housing 1109, whereby the housing 1102 and the housing 1103 are integrated and function as an operation portion. The osAI chip 390 described in the above embodiment can be incorporated into a chip provided on a substrate in the housing 1102 and the housing 1103, for example.

Figure 31B:
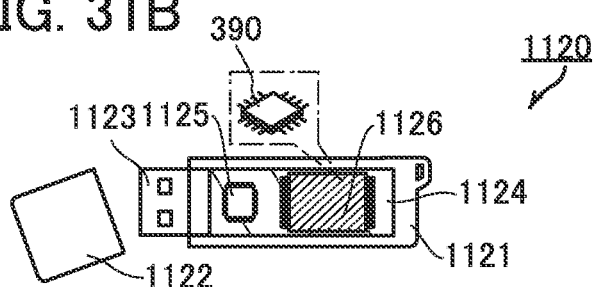

FIG. 31(B) is a USB connection stick type electronic device 1120. The electronic device 1120 includes a housing 1121, a cap 1122, a USB connector 1123, and a substrate 1124. The substrate 1124 is held in the housing 1121. For example, a memory chip 1125 and a controller chip 1126 are attached to the substrate 1124. The osAI chip 390 described in the above embodiment can be incorporated into the controller chip 1126 or the like of the substrate 1124, for example.

Figure 31C:
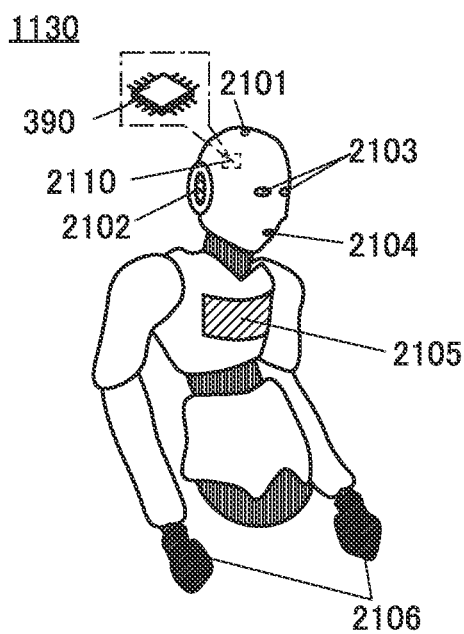

FIG. 31(C) is a humanoid robot 1130. The robot 1130 includes sensors 2101 to 2106 and a control circuit 2110. For example, the osAI chip 390 described in the above embodiment can be incorporated into the control circuit 2110.

Figure 32:
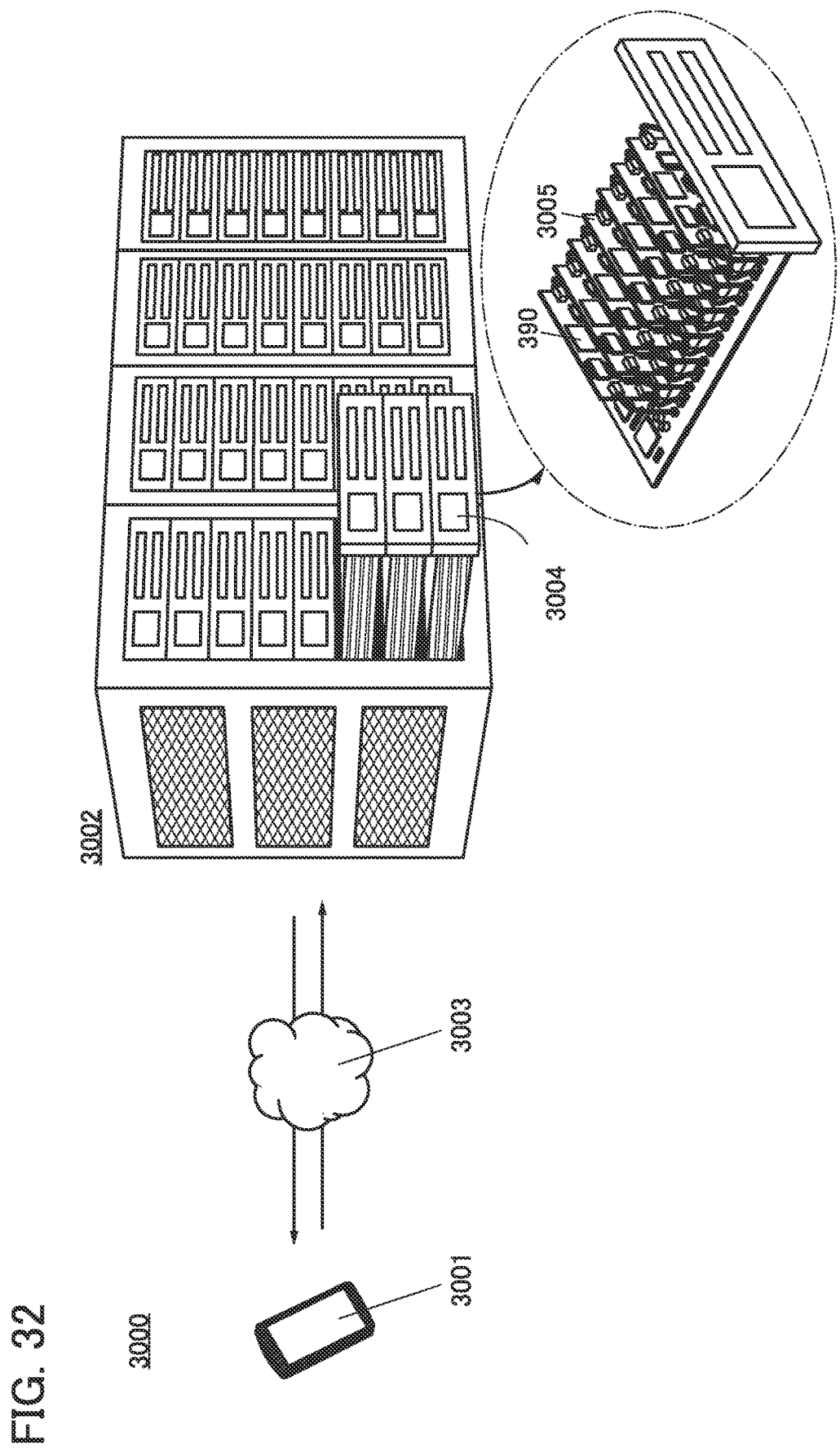
FIG. 32 A diagram illustrating a configuration of one embodiment of the present invention.

The osAI chip 390 described in the above embodiment can be used for a server that communicates with the electronic devices instead of being incorporated into the electronic devices. In that case, the arithmetic system is configured with the electronic devices and a server. FIG. 32 shows a configuration example of a system 3000.

The system 3000 includes an electronic device 3001 and a server 3002. Communication between the electronic device 3001 and the server 3002 can be performed through Internet connection 3003.

The server 3002 includes a plurality of racks 3004. The plurality of racks are provided with a plurality of substrates 3005, and the osAI chip 390 described in the above embodiment can be mounted on each of the substrates 3005. Thus, a neural network is configured in the server 3002. The server 3002 can perform an arithmetic operation of the neural network using data input from the electronic device 3001 through the Internet connection 3003. The result of the arithmetic operation executed by the server 3002 can be transmitted as needed to the electronic device 3001 through the Internet connection 3003. Accordingly, a burden of the arithmetic operation in the electronic device 3001 can be reduced.

This embodiment can be combined as appropriate with the description of the other embodiments.

REFERENCE NUMERALS

SC1: state, SC2: state, SG1: state, SG2: state, SPG1: state, SPG2: state, SPG3: state, SPG4: state, 10: host, 10A: CPU, 10B: CPU, 11A: CPU core, 11B: CPU core, 12: memory, 13: data retention circuit, 20: bus, 30: GPU, 30_1: GPU, 30_n: GPU, 30A: GPU, 30B: GPU, 31: device memory, 32A: shared memory, 32B: shared memory, 33A: GPU core, 33B: GPU core, 34A: arithmetic unit, 34B: arithmetic unit, 35A: data retention portion, 35B: data retention portion, 40: multiplier circuit, 42: current supply, 43: offset circuit, 44: activation function circuit, 51: input register, 52: memory circuit, 53: multiplier circuit, 54: adder circuit, 55A: output register, 55B: output register, 56A: selector, 56B: selector, 56C: selector, 56D: selector, 57A: memory circuit, 57B: memory circuit, 57C: memory circuit, 61: arithmetic circuit, 62: switch circuit, 65: switch circuit, 66S: wiring, 67A: wiring, 71: flip-flop, 72: decoder, 73_0: memory cell, 73_1: memory cell, 73_2: memory cell, 73_3: memory cell, 74: memory cell, 77: transistor, 78: latch circuit, 80: flip-flop, 81: decoder, 83_0: memory cell, 83_1: memory cell, 87: wiring, 91_0: memory cell, 91_1: memory cell, 92_0: transistor, 92_1: transistor, 93: transistor, 100A: arithmetic device, 100B: arithmetic device, 100C: arithmetic device, 100D: arithmetic device, 100E: arithmetic device, 110: CPU, 111: CPU core, 112: instruction cache, 113: data cache, 114: bus interface circuit, 120: GPU, 121: GPU core, 122: on-site memory, 123: ADC/DAC, 124: control circuit, 131: on-chip memory, 140A: high-speed bus, 140B: low-speed bus, 141: DMAC, 142: power management unit, 143: memory controller, 144: DDR SDRAM controller, 145: USB interface circuit, 146: display interface circuit, 147: security circuit, 150: bridge circuit, 151: interrupt control circuit, 152: interface circuit, 153: battery control circuit, 154: ADC/DAC interface circuit, 160: power supply circuit, 190: CPU, 193: PMU, 200: CPU core, 202: L1 cache memory device, 203: L2 cache memory device, 205: bus interface portion, 210: power switch, 211: power switch, 212: power switch, 214: level shifter, 220: flip-flop, 221: scan flip-flop, 221A: clock buffer circuit, 222: backup circuit, 240: NOSRAM, 242: power domain, 243: power domain, 245: power switch, 246: power switch, 247: power switch, 250: memory cell array, 251: control circuit, 252: row circuit, 253: column circuit, 260: memory cell, 262: memory cell, 263: memory cell, 270: cell, 271: memory cell, 272: backup circuit, 275: bistable circuit, 300: OSSRAM, 301: power domain, 302: power domain, 303: power domain, 310: power switch, 311: power switch, 312: power switch, 313: power switch, 314: power switch, 320: memory cell array, 330: power gating control circuit, 331: control circuit, 332: row circuit, 333: column circuit, 335: backup and recovery driver, 381: os memory, 382: os memory, 383: os memory, 384: os memory, 390: osAI chip, 391A: circuit portion, 391B: circuit portion, 391C: circuit portion, 400: osAI chip, 401: receiver, 403: DAC, 404: DAC, 405: MAC array, 406: MAC array, 407: gate driver, 408: ADC, 409: transmitter, 450: osAI chip, 460: controller, 462: I2C module, 463: receiver, 464: transmitter, 466: data driver, 467: word driver, 470: arithmetic circuit array, 471: arithmetic portion, 472: SRAM, 474: selector, 475: selector, 476: demultiplexer, 590: automobile, 591: camera, 592: imaging direction, 593: bus, 594: host controller, 595: portable electronic device, 596: printed wiring board, 597: speaker, 598: camera, 599: microphone, 1100: portable game machine, 1101: housing, 1102: housing, 1103: housing, 1104: display portion, 115: connection portion, 1107: operation key, 1108: housing, 1109: housing, 1120: electronic device, 1121: housing, 1122: cap, 1123: USB connector, 1124: substrate, 1125: memory chip, 1126: controller chip, 1130: robot, 2101: sensor, 2106: sensor, 2110: control circuit, 3000: system, 3001: electronic device, 3002: server, 3003: Internet connection, 3004: rack,

The invention claimed is:

1. A driving method of an arithmetic device comprising the steps of:
    selecting one of a first central processing unit (CPU) core and a second CPU core to enter a first state of executing arithmetic processing,
    wherein the non-selected one of the first CPU core or the second CPU core enters into a first power gating state;
    selecting one of a first graphics processing unit (GPU) core and a second GPU core to enter a second state of executing arithmetic processing,
    wherein the non-selected one of the first GPU core or the second GPU core enters into a second power gating state,
    wherein the first GPU core comprises a first data retention circuit capable of retaining an analog value and reading out the analog value as digital data of two or more bits, and
    wherein the second GPU core comprises a second data retention circuit capable of retaining a digital value and reading out the digital value as digital data of one bit.

2. The driving method of an arithmetic device according to claim 1,
    wherein switching the selected one of the first CPU core and the second CPU core from the first state of executing arithmetic processing to a third power gating state and switching the non-selected one of the first CPU core and the second CPU core from the first power gating state to a third state of executing arithmetic processing is performed in response to a temperature of a region in which the first CPU core and the second CPU core are provided.

3. The driving method of an arithmetic device according to claim 1,
    wherein switching the selected one of the first GPU core and the second GPU core from the second state of executing arithmetic processing to a fourth power gating state and switching the non-selected one of the first GPU core and the second GPU core from the second power gating state to a fourth state of executing arithmetic processing is performed, and the switching is controlled in response to whether arithmetic processing is based on scientific computation or inference using a neutral network.

4. The driving method of an arithmetic device according to claim 1,
wherein one of either the first CPU core and the second CPU core has lower processing performance and lower power consumption than the other.

5. A driving method of an arithmetic device comprising the steps of:
selecting one of a first central processing unit (CPU) core and a second CPU core to enter a first state of executing arithmetic processing,
wherein the non-selected one of the first CPU core or the second CPU core enters into a first power gating state;
one of a first graphics processing unit (GPU) core and a second GPU core to enter a second state of executing arithmetic processing,
wherein the non-selected one of the first GPU core or the second GPU core enters into a second power gating state,
wherein the first CPU core and the second CPU core each comprises a first data retention circuit,
wherein the first GPU core comprises a second data retention circuit capable of retaining an analog value and reading out the analog value as digital data of two or more bits,
wherein the second GPU core comprises a third data retention circuit capable of retaining a digital value and reading out the digital value as digital data of one bit,
wherein the first to third data retention circuits each comprises a first transistor and a capacitor,
wherein the first transistor is electrically connected to the capacitor, and
wherein a channel formation region of the first transistor comprises an oxide semiconductor.

6. The driving method of an arithmetic device according to claim 5,
wherein switching the selected one of the first CPU core and the second CPU core from the first state of executing arithmetic processing to a third power gating state and switching the non-selected one of the first CPU core and the second CPU core from the first power gating state to a third state of executing arithmetic processing is performed in response to a temperature of a region in which the first CPU core and the second CPU core are provided.

7. The driving method of an arithmetic device according to claim 5,
wherein switching the selected one of the first GPU core and the second GPU core from the second state of executing arithmetic processing to a fourth power gating state and switching the non-selected one of the first GPU core and the second GPU core from the second power gating to a fourth state of executing arithmetic processing is performed, and the switching is controlled in response to whether arithmetic processing is based on scientific computation or inference using a neutral network.

8. The driving method of an arithmetic device according to claim 5,
wherein one of either the first CPU core and the second CPU core has lower processing performance and lower power consumption than the other.

9. The driving method of an arithmetic device according to claim 5,
wherein each of the first to third data retention circuits further comprises a second transistor, and
wherein a potential corresponding to the analog value or the digital value is retained in a node at which one of a source and a drain of the first transistor, one electrode of the capacitor, and a gate of the second transistor are electrically connected to one another.

10. The driving method of an arithmetic device according to claim 5,
wherein the first retention circuit is electrically connected to a flip-flop.

* * * * *